US012787510B2

(12) United States Patent
Tan et al.

(10) Patent No.: US 12,787,510 B2
(45) Date of Patent: Nov. 3, 2026

(54) LED BRACKET, LIGHT-EMITTING UNIT, AND LIGHT-EMITTING ASSEMBLY

(71) Applicant: SHENZHEN JUFEI OPTOELECTRONICS CO., LTD, Shenzhen (CN)

(72) Inventors: Zhenliang Tan, Shenzhen (CN); Meizheng Xing, Shenzhen (CN); Huaping Shi, Shenzhen (CN); Pingru Sun, Shenzhen (CN); Shifei Liang, Shenzhen (CN); Limin Yang, Shenzhen (CN); Youpu Ke, Shenzhen (CN); Gang He, Shenzhen (CN); Mingquan Li, Shenzhen (CN); Hui Xu, Shenzhen (CN); Yunhua Li, Shenzhen (CN); Chuanhu Wang, Shenzhen (CN); Huiping Liu, Shenzhen (CN); Junnan Song, Shenzhen (CN); Wenqin Xu, Shenzhen (CN); Siqing Gao, Shenzhen (CN); Qingqing Tan, Shenzhen (CN); Dongdong Wang, Shenzhen (CN); Zhiqiang Zhang, Shenzhen (CN); Jinhu Li, Shenzhen (CN)

(73) Assignee: SHENZHEN JUFEI OPTOELECTRONICS CO., LTD, Shenzhen (CN)

( * ) Notice: Subject to any disclaimer, the term of this patent is extended or adjusted under 35 U.S.C. 154(b) by 656 days.

(21) Appl. No.: 18/266,298

(22) PCT Filed: Dec. 10, 2021

(86) PCT No.: PCT/CN2021/137073

§ 371 (c)(1),
(2) Date: Jun. 9, 2023

(87) PCT Pub. No.: WO2022/122013

PCT Pub. Date: Jun. 16, 2022

(65) Prior Publication Data

US 2024/0047623 A1 Feb. 8, 2024

(30) Foreign Application Priority Data

Dec. 11, 2020 (CN) ......................... 202023003674.7
Dec. 11, 2020 (CN) ......................... 202023005249.1
(Continued)

(51) Int. Cl.
*H10H 20/85* (2025.01)
*H10H 20/851* (2025.01)
*H10H 20/825* (2025.01)

(52) U.S. Cl.
CPC .... *H10H 20/8506* (2025.01); *H10H 20/8513* (2025.01); *H10H 20/825* (2025.01)

(58) Field of Classification Search
CPC ......................... H10H 20/8513; H10H 20/825
See application file for complete search history.

(56) References Cited

U.S. PATENT DOCUMENTS 9,362,462 B2 * 6/2016 Park ..................... H10H 20/851
2008/0180948 A1 7/2008 Yoon et al.
(Continued)

FOREIGN PATENT DOCUMENTS

CN 102456806 A 5/2012
CN 102468396 A 5/2012
(Continued)

OTHER PUBLICATIONS

International Search Report of PCT Patent Application No. PCT/CN2021/137073 issued on Mar. 4, 2022.
(Continued)

*Primary Examiner* — Christopher E Dunay

(57) ABSTRACT

The present application relates to an LED bracket, a light-emitting unit and a light-emitting assembly. A substrate of
(Continued)

the LED bracket comprises a substrate main body, and a supporting part extending from the substrate main body into a side wall of a bowl portion of the LED bracket, wherein the supporting part extends from one conductive area to the other conductive area in the side wall of the bowl portion of the LED bracket, and at least extends to a side wall area corresponding to an insulating area on the side wall that insulates and isolates the two conductive areas.

5 Claims, 21 Drawing Sheets

(30) Foreign Application Priority Data

| | | |
|---|---|---|
| Dec. 31, 2020 | (CN) | 202011639540.6 |
| Dec. 31, 2020 | (CN) | 202011641293.3 |
| Jan. 19, 2021 | (CN) | 202120148167.8 |
| Jan. 26, 2021 | (CN) | 202120216659.6 |
| Mar. 26, 2021 | (CN) | 202110323230.1 |
| Apr. 2, 2021 | (CN) | 202110365627.7 |
| Jun. 16, 2021 | (CN) | 202110665700.2 |
| Jul. 5, 2021 | (CN) | 202121528970.0 |

(56) References Cited

U.S. PATENT DOCUMENTS

| | | | | |
|---|---|---|---|---|
| 2013/0020929 | A1* | 1/2013 | van de Ven | H01J 1/63 313/498 |
| 2013/0187180 | A1 | 7/2013 | Chen | |
| 2019/0148605 | A1* | 5/2019 | Mu | H10H 20/851 257/98 |
| 2020/0409215 | A1* | 12/2020 | Chen | H10H 20/854 |
| 2021/0293620 | A1* | 9/2021 | Husnik | H10H 20/8513 |
| 2021/0317326 | A1* | 10/2021 | Doherty | F21V 9/30 |
| 2021/0367126 | A1* | 11/2021 | Hong | H10H 20/8583 |

FOREIGN PATENT DOCUMENTS

| | | | |
|---|---|---|---|
| CN | 107204394 | A | 9/2017 |
| JP | 2012015471 | A | 1/2012 |
| JP | 2014159565 | A | 9/2014 |
| JP | 2015156456 | A | 8/2015 |
| JP | 2018137321 | A | 8/2018 |
| KR | 20080063709 | A | 7/2008 |
| WO | 2013061943 | A1 | 5/2013 |

OTHER PUBLICATIONS

Extended European Search Report of European Patent Application No. 21902718.2 issued on Oct. 29, 2024.

* cited by examiner

LED BRACKET, LIGHT-EMITTING UNIT, AND LIGHT-EMITTING ASSEMBLY

TECHNICAL FIELD

The present application relates to the field of LEDs (light emitting diodes, LED chips), and in particular to an LED bracket, a light-emitting unit, and a light-emitting assembly.

BACKGROUND

The smd LED has wide application in the fields of illumination, decoration, backlight, display and the like. The smd LED comprises an LED bracket and an LED chip arranged on the LED bracket. An LED bracket of a conventional smd LED generally comprises a substrate and a package arranged on the substrate, wherein the package is provided with a bowl portion for accommodating an LED chip. However, the side walls of the bowl portion of the conventional LED bracket are not high in strength and are easily broken by an external force such as plate deformation.

Therefore, how to increase the strength of the LED bracket is a technical problem that needs to be solved urgently.

SUMMARY

Technical Problem

In view of the above defects of the prior art, an objective of the present application is to provide an LED bracket, a light-emitting unit and a light-emitting assembly, which aim to solve the problem that the LED bracket is not high in strength and is easily broken by an external force in the related art.

Technical Solution

Provided is an LED bracket, comprising a package and a substrate partially covered with the package, wherein the package is provided with a bowl portion, and a part of the substrate is located in the bowl portion and used as a bottom of the bowl portion; the substrate comprises two conductive areas located in the bowl portion, and an insulating area for insulating and isolating the two conductive areas is arranged between the two conductive areas;

the substrate comprises a substrate main body, and a supporting part extending from the substrate main body into a side wall of the bowl portion, wherein the supporting part extends from one of the conductive areas to the other conductive area in the side wall, and at least extends to a side wall area corresponding to the insulating area on the side wall.

Based on the same inventive concept, the present application further provides a light-emitting unit, which comprises an LED chip and the LED bracket described above, wherein the LED chip is arranged at the bottom of the bowl portion, and positive and negative electrodes of the LED chip are electrically connected to the two conductive areas, respectively;

the light-emitting unit further comprises a packaging layer arranged in the bowl portion.

Based on the same inventive concept, the present application further provides a light-emitting assembly, which comprises a circuit board and the light-emitting unit described above, wherein the light-emitting unit is arranged on the circuit board and electrically connected to the circuit board.

Beneficial Effects of the Present Invention

The present application provides an LED bracket, a light-emitting unit and a light-emitting assembly, wherein a substrate of the LED bracket comprises a substrate main body and a supporting part extending from the substrate main body into a side wall of a bowl portion of the LED bracket, and the strength of the side wall of the bowl portion is improved through the supporting part, so that the overall strength of the LED bracket is improved; in addition, the supporting part extends from one of conductive areas to the other conductive area in the side wall of the bowl portion of the LED bracket, and at least extends to a side wall area corresponding to an insulating area on the side wall that insulates and isolates the two conductive areas; namely the supporting part extends to an area between two areas of the two conductive areas projected to the side wall of the bowl portion, as the area of the part is an area where the LED bracket is weakest in strength, the supporting part extends to the area, so that the strength of the LED bracket can be further improved, particularly, the part of the LED bracket with the weakest strength can be powerfully reinforced, and the LED bracket can be prevented from being broken by an external force to the greatest extent. The light-emitting unit and the light-emitting assembly provided in the present application adopt an LED bracket with a better strength, so that the overall strength and the reliability of the light-emitting unit and the light-emitting assembly can be improved.

EMBODIMENTS

Figure 1:
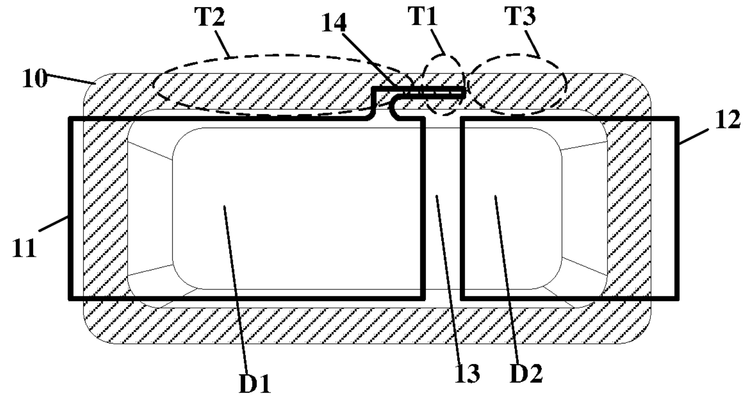
FIG. 1 is a top view I of an LED bracket according to Embodiment I of the present application.

For ease of understanding of the present application, the present application will be described more fully below with reference to the accompanying drawings. Preferred embodiments of the present application are given in the accompanying drawings. The present application can, however, be embodied in many different forms and should not be construed as limited to the embodiments set forth herein. Rather, these embodiments are provided such that the disclosure of the present application will be understood more thoroughly and completely.

Unless defined otherwise, all technical and scientific terms used herein have the same meaning as commonly understood by those skilled in the art to which the present application belongs. The terms used herein in the specification of the present application are for the purpose of describing specific embodiments only and are not intended to limit the present application.

It should be noted that the terms "first", "second", etc. in the specification and claims of the present application and the above drawings are used to distinguish similar objects, and do not have to be used to describe a specific order or sequence. It should be understood that the data so used may be interchanged under appropriate circumstances in order to facilitate the description of the embodiments of the present application herein. Moreover, the terms "comprise" and "have" and any variations thereof are intended to cover non-exclusive inclusion. For example, a process, method, system, product or device comprising a series of steps or units is not necessarily limited to the explicitly listed steps or units, but may comprise other steps or units that are not explicitly listed or are inherent in the process, method, product or device.

In the present application, the terms "upper", "lower", "inner", "middle", "outer", "front", "rear", etc. indicate orientations or positional relationships based on the orientations or positional relationships shown in the drawings. These terms are used primarily to better describe the present application and the embodiments thereof, and are not used to limit the indicated apparatuses, elements or components to a particular orientation or to be constructed and operated in a particular orientation. Moreover, some of the above terms may be used in other meanings besides orientation or positional relationship. For example, the term "upper" may also be used in some cases to indicate a certain attaching or connecting relationship. For those of ordinary skill in the art, the specific meanings of these terms in the present application can be interpreted according to specific conditions. Furthermore, the terms "arranged", "connected", and "fixed" are to be construed broadly. For example, "connected" may be "fixedly connected", "detachably connected", or "integrally connect"; "mechanically connected" or "electrically connected"; or "directly interconnected", "indirectly interconnected through an intermediate" or "the communication between two apparatuses, elements or components". For those of ordinary skill in the art, the specific meanings of the terms described above in the present application can be interpreted according to specific conditions.

It should be noted that in the present application, the embodiments and features of the embodiments may be combined with each other without conflict. The present application will be described in detail below with reference to the accompanying drawings in conjunction with embodiments.

Embodiment I

This embodiment provides an LED bracket with a simple structure, a low cost, a high yield and good overall strength, which can be used for, but not limited to, fields such as illumination, decoration, backlight, display. The LED bracket comprises a package and a substrate partially covered with the package, wherein the package is provided with a bowl portion, and a part of the substrate is located in the bowl portion and used as a bottom of the bowl portion; the substrate comprises two conductive areas located in the bowl portion, and an insulating area for insulating and isolating the two conductive areas is arranged between the two conductive areas; the substrate comprises a substrate main body and a supporting part extending from the substrate main body into a side wall of the bowl portion, and the strength of the side wall of the bowl portion is improved through the supporting part, so that the overall strength of the LED bracket is improved. In this embodiment, the supporting part extends from one of conductive areas to the other conductive area in the side wall, and at least extends to a side wall area corresponding to an insulating area on the side wall; however, as the side wall area of the part is usually an area where the LED bracket is weakest in strength, the supporting part extends to the area, so that the part of the LED bracket with the weakest strength can be powerfully reinforced, and the LED bracket can be prevented from being broken by an external force to the greatest extent.

In one example, the package may be fabricated on the substrate from, but not limited to, various resins and other materials by means of including, but not limited to, injection molding, casting, die pressing and the like. The bowl portion formed by the package is used for accommodating the LED chip. The cross section of the bowl portion in this example may be flexibly set, for example, but not limited to, regular shapes such as rectangle, circle, racetrack, ellipse, trapezoid, etc., and may also be set to irregular shapes as needed, which is not described in detail herein.

In one example, the substrate main body may be made of a material including, but not limited to, an insulating material, such as resin and ceramic, the substrate may include only one, and the two conductive areas in this example may be arranged on the same substrate main body; the substrate in this example may also include two sub-substrates, in which case the two conductive areas may be arranged on the substrate main bodies of the two sub-substrates, respectively; the conductive areas in this example may be formed by, but are not limited to, arranging corresponding conductive layers on the substrate main body, with the conductive layers being insulated and isolated from each other by an insulating area.

In another example, the substrate main body may be made of a conductive material, such as a conductive metal, the substrate may include two sub-substrates, in which case the two sub-substrates are insulated and isolated by an insulating area, and areas of the two sub-substrates located in the bowl portion form two conductive areas, respectively. In other application scenarios, the substrate may include two sub-substrates, and one of the sub-substrates is made of a conductive material, and the other sub-substrate is made of an insulating material.

In this example, the insulating area may include, but is not limited to, a gap formed between the two conductive areas to insulate and isolate the two conductive areas, and may also include an insulating material disposed between the two conductive areas, such as, but not limited to, various insulating glues or insulating resins. In addition, the side of the insulating area in this example close to the bowl portion opening may be higher than the side of at least one conductive area close to the bowl portion opening, or be lower than the side of at least one conductive area close to the bowl portion opening, or be flush with the side of at least one conductive area close to the bowl portion opening, which may be specifically set according to various demands in a flexible way to promote its commonality.

In this example, the supporting part and the substrate main body may be of an integrally formed structure, so as to simplify the structure of the LED bracket and improve the integration level and strength thereof. The supporting part and the substrate main body may also be of a non-integrally formed structure. In addition, the number and specific positions of the supporting parts may be flexibly set according to application requirements, and for ease of understanding, this embodiment will be described below with an example that the substrate includes two sub-substrates insulated and isolated by an insulating area, and two conductive areas are respectively formed in areas of the two sub-substrates located in the bowl portion.

In this example, the supporting part may include a supporting part extending from a substrate main body of one of the sub-substrates into a side wall of the bowl portion, or two supporting parts extending from two opposite sides of a substrate main body of one of the sub-substrates to two opposite side walls of the bowl portion, respectively, or two supporting parts extending from two opposite sides of the substrate main body of the two sub-substrates into two opposite side walls of the bowl portion, respectively, or the like. In this example, the two sub-substrates are referred to as a first sub-substrate and a second sub-substrate, respectively, and the two conductive areas are referred to as a first conductive area and a second conductive area, respectively.

Figure 2:
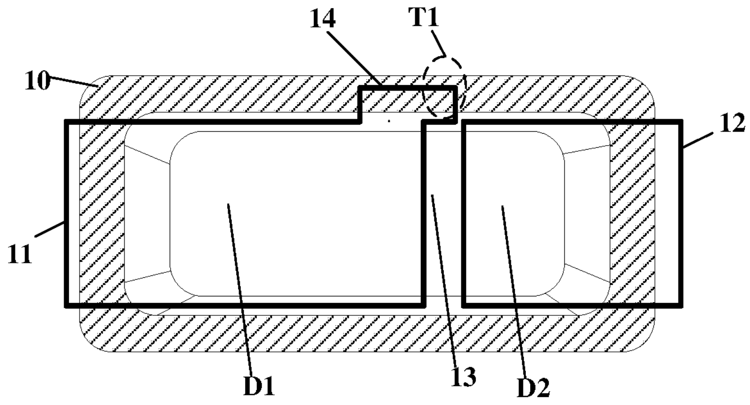
FIG. 2 is a top view II of an LED bracket according to Embodiment I of the present application.
Figure 3:
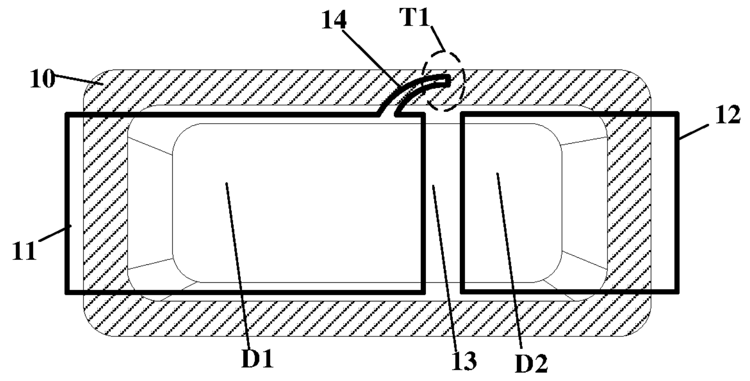
FIG. 3 is a top view III of an LED bracket according to Embodiment I of the present application.
Figure 4:
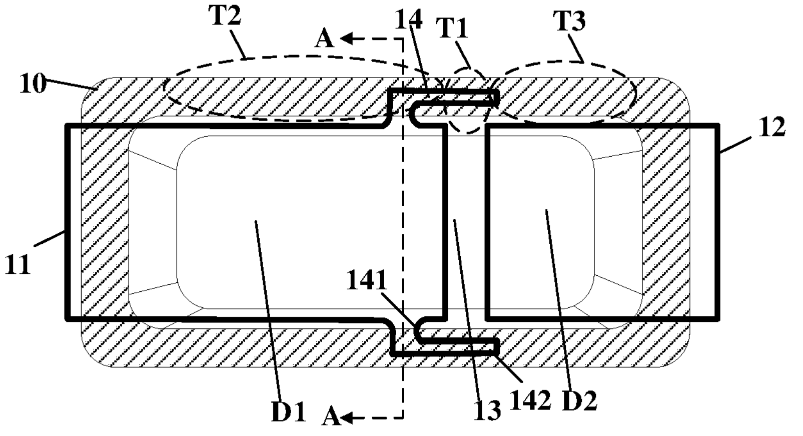
FIG. 4 is a top view IV of an LED bracket according to Embodiment I of the present application.

A top view of an LED bracket shown in FIG. 1 can be referred to as an application example. It should be noted that, in order to better embody the structure of the LED bracket in the present invention, the package is subjected to perspective processing in the drawing, and a shaded part in the drawing from a top view is a top part of a side wall, wherein, the area of the first sub-substrate 11 is larger, the area of the second sub-substrate 12 is smaller, the first sub-substrate 11 and the second sub-substrate 12 are isolated from each other by an insulating area 13, and both of the first sub-substrate 11 and the second sub-substrate 12 are partially covered with the package 10. In the bowl portion formed by the package, parts of the first sub-substrate 11 and the second sub-substrate 12 are exposed to serve as a first conductive area D1 and a second conductive area D2, respectively. The LED chip may be arranged on the first conductive area D1, and may also traverse the first conductive area D1 and the second conductive area D2. In this embodiment, the first sub-substrate 11 comprises a supporting part 14 extending from a substrate main body thereof, wherein the supporting part 14 extends from the substrate main body of the first sub-substrate 11 into the side wall of the bowl portion, and extends from a second area T2 of the side wall corresponding to the first conductive area D1 to a third area T3 of the side wall corresponding to the second conductive area D2, and at least extends to a side wall area corresponding to the insulating area 13 on the side wall, that is a first area T1 in FIG. 1. Therefore, the part of the LED bracket with the weakest strength is powerfully reinforced, and the LED bracket is prevented from being broken by an external force to the maximum extent. In this example, the supporting part 14 may penetrate through the first area T1 and extend into the second area T2, for example, as shown in FIG. 4, or the supporting part 14 may not extend into the second area T2, for example, the supporting part 14 as shown in FIGS. 1 to 3. In addition, it should be understood that the supporting part 14 in this example may be entirely covered with the package 10; namely, the supporting part may extend entirely into the side wall, or may be only partially covered with the package 10 (for example, as shown in FIG. 2).

In this example, the side of the supporting part 14 close to the bowl portion opening may be flush with the side of the substrate main body close to the bowl portion opening; namely, both may be on the same plane. The side of the supporting part 14 close to the bowl portion opening and the side of the substrate main body close to the bowl portion opening may also be not on the same plane. For example, the side of the supporting part 14 close to the bowl portion opening may be set to be higher than the side of the substrate main body close to the bowl portion opening; namely, the supporting part 14 protrudes from the height direction of the substrate main body (i.e., the direction close to the bowl portion opening). In other words, the supporting part 14 extends towards the rim of the bowl portion in the side wall, such that the overall strength of the side wall is further improved, and especially, the possibility of the breakage of the side wall can be further reduced when the LED bracket is subjected to an external force, for example, from bottom to top caused by plate deformation. It should be noted that the first area T1 corresponding to the insulating area 13 on the side wall in this example refers to an area corresponding to an area part on the side wall where the insulating area 13 and the side wall are in contact. In other words, from a top view, the extension direction of the insulating area 13 and the supporting part 14 have an intersecting portion, and the supporting part 14 of the portion and the substrate main body are not on the same plane, so that a three-dimensional reinforcing structure is formed to ensure the strength of the side wall. In some application scenarios, as the plate of the insulating area 13 is more deformable, the supporting part 14 enters the first area T1, so that the part of the LED bracket with the weaker strength on the side wall is better reinforced. In some specific application scenarios, the supporting part 14 may also include a part extending towards a direction far away from the second conductive area D2 so as to reinforce the side wall of other parts.

In this example, the supporting part 14 may directly extend upward from the side of the substrate main body, or may extend upward after horizontally extending for a certain distance from the side of the substrate main body. The supporting part 14, when extending upward, may include a vertical upward projection, and also an obliquely upward projection. For example, referring to an example shown in FIG. 2, a supporting part 14 having a rectangular cross section directly extends from a position close to the top of the side of the substrate main body, a thickness of the supporting part 14 may be set to be smaller than that of the substrate main body, and the supporting part 14 extends along the substrate main body of the first sub-substrate 11 toward the second sub-substrate 12 and enters the first area T1. The shape of the supporting part 14 in this example may be set as needed, including but not limited to, for example, a half C shape (as shown in FIG. 3), an inverted L shape, or the like, or other shapes or combinations thereof, such as the combination of a half racetrack shape and a rectangle shape as shown in FIG. 1.

In the examples shown in FIGS. 1 to 3, the supporting part extends from one side of the substrate main body of one of the sub-substrates. It should be understood that, in this embodiment, the LED bracket may also include two supporting parts respectively extending from two opposite sides of the substrate main body of one of the sub-substrates into two opposite side walls of the bowl portion, or three supporting parts respectively extending from two opposite sides of the substrate main body and from other areas of the substrate main body covered with the package into the side walls of the bowl portion, so as to further improve the overall strength of the bracket. For example, referring to FIGS. 4 and 5, an example of an LED bracket is shown, which is compared with the example of FIGS. 1-3, wherein two supporting parts 14 extending into two opposite side walls of the bowl portion are arranged on two opposite sides of the substrate main body of the first sub-substrate 11. Therefore, the strength of the insulating area 3 corresponding to the first area T1 on the side wall in the length direction in the LED bracket is improved; that is, the overall strength of the LED bracket can be multiplied compared with the LED bracket shown in FIGS. 1-3.

Figure 6:
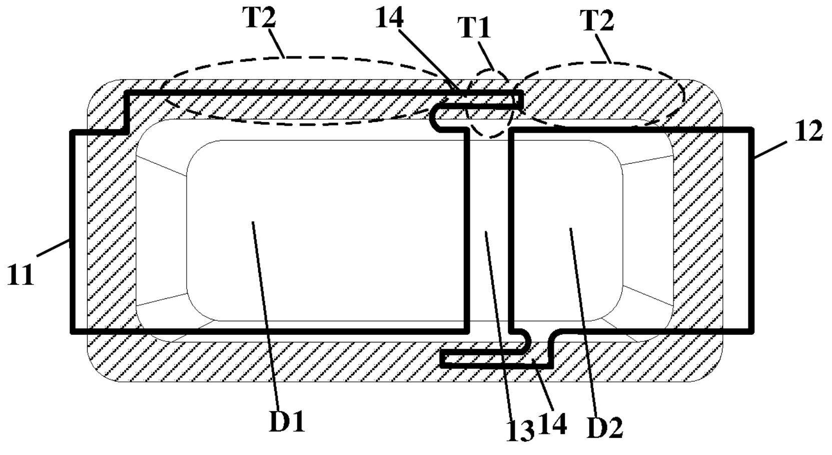
FIG. 6 is a top view V of an LED bracket according to Embodiment I of the present application.

In this embodiment, the LED bracket may also include two supporting parts respectively extending from one sides of the substrate main bodies of the two sub-substrates into the side walls of the bowl portion. For example, referring to FIG. 6, an LED bracket is shown, which is compared with the examples of FIGS. 1-3, wherein a supporting part 14 extending into one side wall of the bowl portion is arranged on one side of the first sub-substrate 11, and a supporting part 14 extending into another side wall of the bowl portion is arranged on one side of the substrate main body of the second sub-substrate 12, the two supporting parts 14 being located on two opposite side surfaces of the bowl portion. The overall strength of the LED bracket can also be multiplied compared with the LED bracket shown in FIGS. 1-3. According to the above examples, the number and positions of the supporting parts 14 in this embodiment can be flexibly and variably set, and the structure is simple, so as to meet the requirements of various application scenarios.

In some examples of this embodiment, referring to FIG. 4, the supporting part 14 may be set to include a first supporting body 141 connected to the substrate main body and a second supporting body 142 extending from the first supporting body 141, and the second supporting body 142, after extending from the first supporting body 141, extends to the second sub-substrate for a certain distance and enters the first area T1 corresponding to the insulating area. In some application examples, the first supporting body 141 and the second supporting body 142 may be integrally formed. The first supporting body 141 may extend only in a horizontal direction in a direction perpendicular or not perpendicular to the side of the substrate main body, and the second supporting body 142 extends from the first supporting body 141, protrudes in a height direction, to the second sub-substrate; or the first supporting body 141 may protrude to a certain height, and the second supporting body 142 extends from the first supporting body 141 and then horizontally extends to the second sub-substrate; or both of the first supporting body 141 and the second supporting body 142 protrude in the height direction as long as at least a part of the second supporting body 142 entering the first area T1 is higher than the substrate main body. By means of the supporting body structure of two sections of the first supporting body 141 and the second supporting body 142, while the strength of the side walls is reinforced, the bonding force between the bracket and the package is ensured. In an application example, the prominent slope of the first supporting body 141 may be set to be gentler than that of the second supporting body 142, the bonding force between the bracket and the package increases through the gentler first supporting body 141, such that the bonding between the bracket and the package is firmer, and the two is difficult to separate from each other due to an external force.

Figure 5:
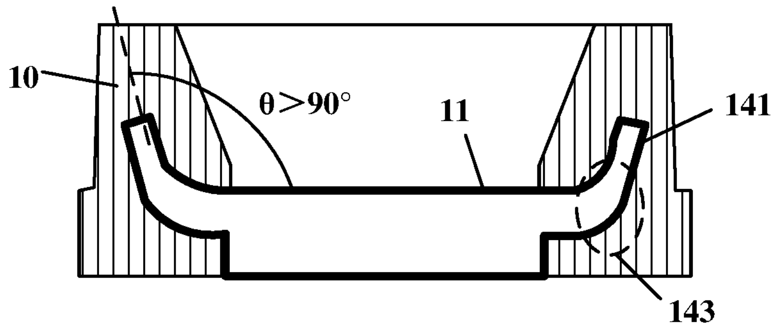
FIG. 5 is a cross-sectional view A-A of the LED bracket of FIG. 4.

It can be understood that the part of the side wall into which the supporting part 14 extends can add some strength to the side wall to some extent. In some embodiments, referring to FIG. 5, FIG. 5 is a schematic cross sectional view of the LED bracket of FIG. 4 along line A-A thereof. The first supporting body 141 of the supporting part 14 further includes an arc-shaped connection area; namely, a part of the supporting body 14 close to the substrate main body may be an arc-shaped portion 143; the arc-shaped portion 143 of this example refers to an arc-shaped corner formed by the supporting part 14 protruding in the height direction, and the arc-shaped portion 143 makes smooth transition between the supporting part 14 and the substrate main body, and can further increase the contact surface with the package, which is beneficial to improving air tightness and guiding the entering water vapor to spread toward the supporting part, so that the risk of wetting the interior of the LED bracket is reduced.

In some examples, referring to FIG. 5, in a cross section perpendicular to a side where the supporting part 14 is arranged, the supporting part 14 extends in a direction far away from the substrate main body in a horizontal direction, and an included angle θ between an extending direction of an end of the supporting part 14 and the substrate main body is greater than or equal to 90° and less than 180°; namely, an included angle θ between an extending direction of a top end of the supporting part 14 in the wall and the substrate main body is greater than or equal to 90° and less than 180°, so that the difficulty in forming the LED bracket is reduced. It can be understood that, in order to increase the strength of the side walls, the supporting part 14 should be wrapped in the side walls of the package regardless of the included angle between the supporting part 14 and the substrate main body. If the LED bracket comprises two or more supporting parts 14, an included angle between the extending directions of the top ends of the two supporting parts 14 and the substrate main body may be set to be the same, such that the strength of the two sides of the LED bracket is more consistent.

In this embodiment, the supporting part 14 may be made of a material with a higher hardness than the package, and in one example, the package may be made of a material such as plastic, and the supporting part has a higher hardness than the used plastic. The supporting part 14 may be made of a metal material, a ceramic material, a high-strength resin material, or other materials. In some embodiments, the first sub-substrate 11 is a conductive substrate, and the substrate main body thereof and the supporting part 14 are made of a conductive metal material. For example, the first sub-substrate may be a substrate including, but not limited to, a copper substrate, an aluminum substrate, an iron substrate, a silver substrate, and the like, the supporting part is made of the same material as the substrate main body, for example, a metal material, and the first sub-substrate is integrally formed to ensure the structural integrity. In the process of forming the supporting part 14, the supporting part 14 may be an extended area on the first sub-substrate, with a desired shape thereof formed by a process such as stamping, etching or the like. After the supporting part 14 is formed, a package structure such as side walls is formed by packaging with a material such as plastic.

In the LED bracket provided by the above examples of this embodiment, at least one of the first sub-substrate 11 and the second sub-substrate 12 is provided with at least one supporting part 14 extending into the side wall of the bowl portion, the supporting part 14 extends from the substrate main body to protrude from the same in the height direction, and the supporting part 14 extends into the first area T1 corresponding to the insulating area 3 in the direction approaching the second sub-substrate 12. The strength of the side wall of the LED bracket of this embodiment is increased through the above supporting part 14, and especially, the strength of the first area T1 corresponding to the insulating area 3 is significantly increased, so that the condition that the side wall is broken due to an external force such as plate deformation is reduced, and the quality of the LED bracket and the LED light-emitting devices manufactured by using the same is ensured. It is foreseeable that the overall strength and the reliability of the light-emitting unit fabricated by adopting the LED bracket provided in this embodiment and the light-emitting assembly fabricated by adopting the light-emitting unit will be higher.

Embodiment II

In the existing LED device package, an LED chip is arranged in a conductive area of a substrate of an LED bracket, and the LED chip is packaged and protected by a packaging adhesive to obtain a light-emitting unit that is the LED device. The LED device may work in high-temperature, high-humidity and salt-fog environments, and the packaging adhesive and the substrate are easy to loosen and even fall off, so that the LED device cannot be protected.

In order to solve the above problems, this embodiment provides a substrate and a packaging adhesive, which have a larger contact area and stronger bonding strength, so that the occurrence of easy loosening and even separating between the packaging adhesive and the substrate is avoided as much as possible.

Figure 7:
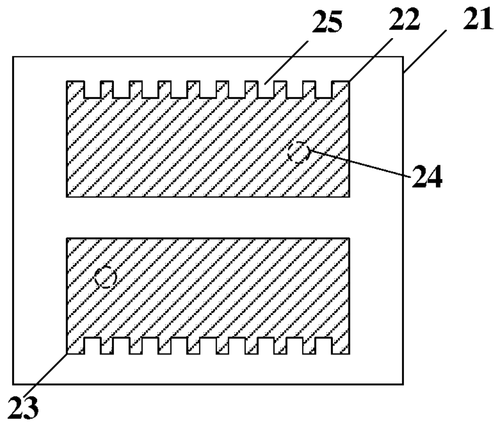
FIG. 7 is a schematic structural diagram I of an LED bracket according to Embodiment II of the present application.

It should be understood that the LED bracket in this embodiment may adopt the LED bracket shown in the foregoing embodiments, or may adopt LED brackets with other structures, which is not limited in this embodiment. In this embodiment, the LED bracket comprises a substrate, and as shown in FIG. 7, the substrate comprises a substrate main body 21, and a first conductive layer 22 and a second conductive layer 23 arranged on a first surface of the substrate main body 21, wherein the first conductive layer 22 and the second conductive layer 23 are isolated by an insulating area to form two conductive areas. The LED bracket in this embodiment may comprise a package arranged on the substrate main body 21, and the package may adopt, but is not limited to, various packaging adhesives.

In this embodiment, a plurality of first grooves 25 are formed in the edge of at least one of the first conductive layer 22 and the second conductive layer 23, such that the conductive layer in contact with the packaging adhesive on the substrate main body has a larger side area, and a plurality of first grooves 25 are formed in the edge (i.e., the side wall) of the conductive layer, such that the substrate main body and the packaging adhesive can have a larger bonding area; namely the packaging adhesive can have a better adhesion on the substrate main body in this embodiment, thereby improving the bonding strength and reducing the occurrence of loosening or separating between the packaging adhesive and the substrate main body.

Referring to FIG. 7, in this example, a plurality of first grooves 25 are formed in edges of the first conductive layer 22 and the second conductive layer 23, and it should be understood that the first grooves 25 may be formed in one of edges (i.e., one of side surfaces) of the first conductive layer 22 and the second conductive layer 23, or the first grooves 25 may be formed in a plurality of edges thereof, respectively, so as to further improve the bonding area and the bonding strength with the packaging adhesive.

Figure 9:
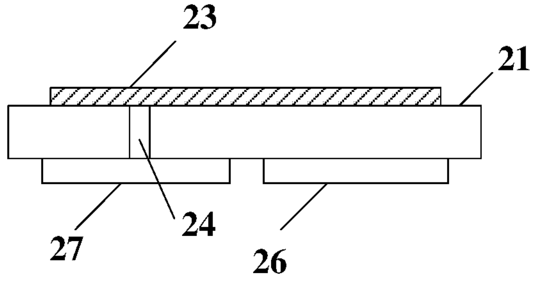
FIG. 9 is a schematic structural diagram III of an LED bracket according to Embodiment II of the present application.

In this example, at least two conductive through holes 24 are formed on the substrate main body 21, and the first conductive layer 22 and the second conductive layer 23 are electrically connected to different conductive through holes 24, respectively; referring to FIG. 9, the substrate in this example further comprises a third conductive layer 26 and a fourth conductive layer 27 covering the second surface of the substrate main body, wherein the third conductive layer 26 is electrically connected to the first conductive layer 22 through the corresponding conductive through hole 24, and the fourth conductive layer 27 is electrically connected to the second conductive layer 23 through the other corresponding conductive through hole 24; the first surface and the second surface of the substrate main body in this example are two opposite surfaces, for example, but not limited to, a front surface and a back surface of the substrate main body.

Figure 8:
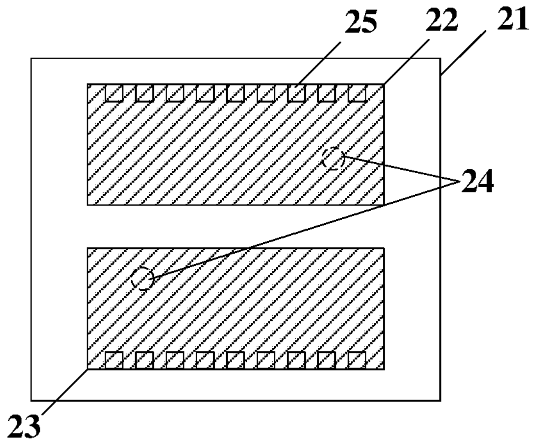
FIG. 8 is a schematic structural diagram II of an LED bracket according to Embodiment II of the present application.

The thickness of the plurality of first grooves 25 at the edge of the first conductive layer 22 and/or the second conductive layer 23 in the height direction of the conductive layer may be the same as or smaller than the height of the conductive layer. For example, FIG. 7 illustrates a case where the thickness of the first grooves 25 in the height direction of the conductive layer is the same as the height of the conductive layer. Referring to FIG. 8 as another example, the thickness of the first grooves 25 in the height direction of the conductive layer is smaller than that of the conductive layer.

It can be understood that, since the plurality of first grooves are additionally formed in the edge of the first conductive layer 22 and/or the second conductive layer 23, the side area thereof is larger than that of a conventional conductive layer having a rectangular or other shape, and the roughness of the side wall of the first conductive layer 22 and/or the second conductive layer 23 is generally high, so that the first conductive layer 22 and/or the second conductive layer 23 can be more strongly bonded to the packaging adhesive when the packaging adhesive is disposed on the side provided with the two layers. In addition, in some implementation processes, the air tightness of the finally-formed LED light-emitting device can be improved accordingly. The conductive layers of this embodiment include, but are not limited to, solder pads and pins. For example, in some embodiments, the first conductive layer 22 and the second conductive layer 23 described above may be solder pads for arranging LED chips, and the third conductive layer 26 and the fourth conductive layer 27 may be used as pins. It should be noted that, in some conventional substrates, for example, a first groove or the like may be formed on a conductive layer as a positive-electrode solder pad or a negative-electrode solder pad, but in practice, such an arrangement is only used for distinguishing the positive electrode and the negative electrode of the solder pad, and is not used for purposely enhancing the adhesion of the packaging adhesive, and in some substrates, the positive electrode and the negative electrode are distinguished by printing marks. For the substrate of this embodiment, a plurality of first grooves 25 are formed in the first conductive layer 22 and/or the second conductive layer 23, and the positions of these first grooves 25 may be continuously and regularly disposed along the edge of the conductive layer according to a certain period, or may be disposed according to the actual shape of the substrate and/or the layout of electronic devices such as LED chips to be mounted subsequently.

As shown in FIG. 9, in this embodiment, the conductive through hole 24 penetrates from the first surface to the second surface of the substrate main body 21, the positions and the number of the conductive through holes 24 may be selected according to actual situations, and the conductive through holes 24 corresponding to the first conductive layer 22 and the second conductive layer 23 are separated by a certain distance, so as to prevent the first conductive layer 22 and the second conductive layer 23 from being too close. Alternatively, the connection of the two surfaces of the substrate main body may be achieved by arranging conductive metal layers in the conductive through holes 24, and the conductive metal layers are used for being in contact with the corresponding conductive layers on the first surface and the second surface of the substrate main body, so as to form electrical connection between the corresponding conductive layers. The conductive metal layers may be made of any conductive metal, including, but not limited to, gold, silver, copper, platinum, and the like. The conductive metal layers may be arranged in the conductive through holes by a film-forming process, such as vacuum sputtering, or may be manufactured by other film-forming processes. In this example, the conductive metal layers may not fill the conductive through holes 24, and illustratively, the conductive through holes 24 are set to have an aperture of 50-200 μm, and the conductive metal layers are formed on the inner walls of the conductive through holes, where the thickness thereof may be set to be not more than 15 μm. In other examples, the conductive through hole 24 may be filled with a conductive metal material or filled with a conductive metal rod, which may also achieve the effect of electrically connecting the corresponding conductive layers on the two surfaces of the substrate.

In some examples, the first conductive layer 22, the second conductive layer 23, the third conductive layer 26, and the fourth conductive layer 27 each comprise a copper layer which may be formed in a manner similar to, but not limited to, the formation of the conductive metal layer in the conductive through hole 24, which is not described in detail herein. The thickness of the copper layer in this example may be set according to the actual size or specification of the device, and as an example, the copper layer has a thickness of about 20-100 μm, and the first conductive layer 22, the second conductive layer 23, the third conductive layer 26, and the fourth conductive layer 27 may have the same thickness or different thicknesses; or the first conductive layer 22 and the second conductive layer 23 may be set to have the same thickness, and the third conductive layer 26 and the fourth conductive layer 27 may be set to have the same thickness, but the first conductive layer 22 and the third conductive layer 26 may have different thicknesses.

In some examples, at least one of the first conductive layer 22, the second conductive layer 23, the third conductive layer 26 and the fourth conductive layer 27 further comprises a metal coating layer, and it should be noted that the metal coating layer herein may comprise any conductive metal that is chemically more stable than copper, such as gold coating, silver coating, platinum coating, or some alloys. By means of the metal coating layer, the conductive layer may have some corresponding metallic surface properties, and is also more stable than the conductive layer comprising bare copper.

The above first grooves 25 on the substrate in this embodiment may be manufactured by means of, but not limited to, etching, cutting, and the like. Illustratively, a full-surface copper layer may be manufactured on the substrate main body 21 by, for example, vacuum sputtering, and then the copper layer is manufactured into a desired shape by etching, cutting, and the like, and in this process, the first grooves 25 may also be manufactured. The manufacturing of the metal coating layer described above may be achieved after the first grooves 25 are manufactured, so that the side wall of the first conductive layer 22 and/or the second conductive layer 23 can be coated with the desired metal. In the process of manufacturing the substrate of this embodiment, before coating the conductive layer with metal, the surface of the conductive layer may be ground and polished to be flat.

The substrate main body in this embodiment may comprise a ceramic plate; namely the substrate in this embodiment may be a ceramic substrate, for example, an ALN, $AL_2O_3$, or other ceramic substrate. In other embodiments, the substrate main body may be made of other insulating materials.

Figure 10:
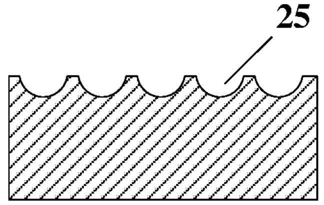
FIG. 10 is a schematic structural diagram I of a first groove according to Embodiment II of the present application.
Figure 11:
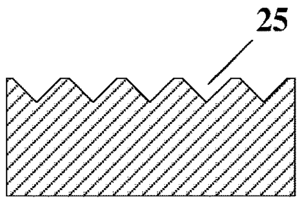
FIG. 11 is a schematic structural diagram II of the first groove according to Embodiment II of the present application.
Figure 12:
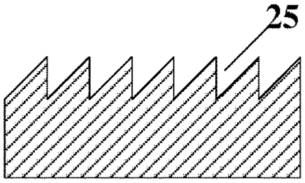
FIG. 12 is a schematic structural diagram III of the first groove according to Embodiment II of the present application.

It should be understood that the first grooves 25 of the first conductive layer 22 and the second conductive layer 23 on the substrate main body in this embodiment may be in various shapes, and in some embodiments, the shape of the first grooves 25 may include at least one of an arc shape, a rectangular shape and a sawtooth shape. For example, as shown in FIG. 7, rectangular first grooves 25 are periodically disposed in the edges of the first conductive layer 22 and the second conductive layer 23 (i.e., the intervals between the first grooves 25 are fixed); arc-shaped first grooves 25 are periodically disposed in the edge of the conductive layer shown in FIG. 10; saw-toothed first grooves 25 are periodically disposed in the edge of the conductive layer shown in FIG. 11; FIG. 12 shows another form of saw-toothed first grooves 25. It can be understood that the shape of the first grooves can be of other shapes, and the size and the arrangement mode thereof can be set, as long as a plurality of first grooves are formed. Thus, the side areas of the first conductive layer and the second conductive layer which may be in contact with the packaging adhesive can increase, thereby achieving the effect of increasing the adhesion of the packaging adhesive.

It should be understood that in some embodiments, one or more LED chips can be arranged in areas corresponding to a first conductive layer 22, a second conductive layer 23, a third conductive layer 26, and a fourth conductive layer 27. And more than one such area may be disposed on the substrate.

For the substrate of this embodiment, a plurality of first grooves are formed in the edge of the first conductive layer and/or the second conductive layer, such that the surface area of the rough side surface of the first conductive layer and/or the second conductive layer increases. After packaging of the packaging adhesive is carried out, the packaging adhesive can be in contact with the side wall of the first conductive layer and/or the second conductive layer in a larger area, so that the substrate can be in stronger bonding with the packaging adhesive, the condition that the packaging adhesive falls off from the finally-fabricated LED light-emitting device is reduced, and the quality of the finally-fabricated LED light-emitting device is improved.

Figure 13:
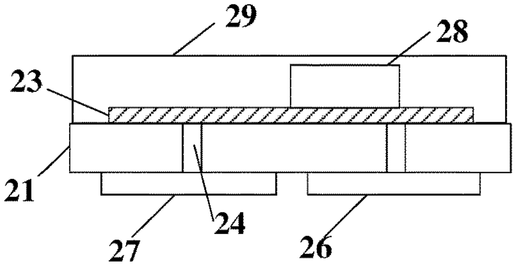
FIG. 13 is a schematic structural diagram IV of an LED bracket according to Embodiment II of the present application.

This embodiment further provides a light-emitting unit, which may also be referred to as an LED light-emitting device, as shown in FIG. 13, comprising a substrate main body 21, an LED chip 28 and a packaging layer 29. The LED chip 28 is arranged on the first surface of the substrate main body 21, the positive electrode of the LED chip 28 is welded to the first conductive layer 22, and the negative electrode of the LED chip 28 is welded to the second conductive layer 23; the packaging layer 29 is arranged on the first surface of the substrate main body 21 and wraps the first conductive layer 22, the second conductive layer 23 and the LED chip 28, and the packaging layer 29 enters the first grooves 25 at the edge of the first conductive layer 22 and/or the second conductive layer 23.

In the above light-emitting unit, the packaging layer 29 may be, but is not limited to, a packaging adhesive layer, and the packaging layer 29 enters the first grooves 25 at the edge of the first conductive layer 22 and/or the second conductive layer 23, so that the contact area between the packaging layer and the relatively rough side wall of the first conductive layer 22 and/or the second conductive layer 23 on the substrate increases, and the bonding strength between the packaging layer and the substrate is effectively improved.

In an example of this embodiment, the light-emitting unit may further comprise a Zener diode as needed, wherein the Zener diode is arranged on the first surface of the substrate main body 21; that is, arranged on the same surface of the LED chip 28, a positive pole of the Zener diode is welded to the second conductive layer 23, a negative pole of the Zener diode is welded to the first conductive layer 22, and the Zener diode is also wrapped with the packaging layer. As a reverse Zener diode can protect the LED chip, the reverse Zener diode is arranged on the same surface of the LED chip, such that the Zener diode can be wrapped with the packaging adhesive layer to be protected. It can be understood that the LED light-emitting device may further comprise other components, and can be arranged on the same surface of the LED chip if the circuit structure allows.

In an example of this embodiment, a plurality of first grooves 25 at the edges of the first conductive layer 22 and the second conductive layer 23 are located outside the area covered with the LED chip 28; the light-emitting unit further comprises a Zener diode, and the plurality of first grooves 25 are also located outside the area covered with the Zener diode. After the components are mounted on the substrate, a part of the area of the components can be in contact with the first conductive layer 22 or the second conductive layer 23, heat can be led out through the first conductive layer 22 or the second conductive layer 23 with a large area, the first grooves 25 are prevented from being arranged at the position of the components, and heat of the components led out through the first conductive layer 22 or the second conductive layer 23 is ensured.

Figure 14:
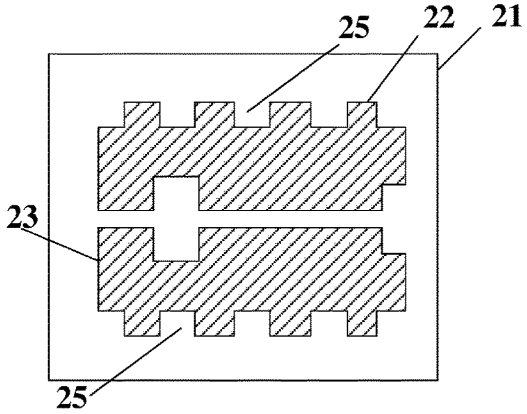
FIG. 14 is a schematic structural diagram V of an LED bracket according to Embodiment II of the present application.

As shown in FIG. 14, for the substrate used in the light-emitting unit shown in FIG. 13, the first grooves 25 on the first conductive layer 22 and the second conductive layer 23 are respectively formed along the edges of the first conductive layer 22 and the second conductive layer 23, and a greater number of first grooves 25 are formed on one sides of the first conductive layer 22 and the second conductive layer 23 in the length direction and away from the center of the substrate. In fact, these portions of first grooves 25 may be periodically disposed; first grooves 25 are also formed in several corners of the first conductive layer 22 and the second conductive layer 23; and a few number of first grooves 25 are also formed on one side of the first conductive layer or the second conductive layer in the length direction and close to the center of the substrate. It can be seen that in this example, the first grooves on the first conductive layer 22 and the second conductive layer 23 are not formed in the positions covered with the LED chip 28 and the Zener diode, and a great number of first grooves 25 are formed in the positions of the first conductive layer 22 and the second conductive layer 23 covered with the above components as much as possible, such that the substrate and the packaging adhesive layer (not shown in the figure) have a good adhesion. It can be seen that, in practical application, the first grooves 25 on the substrate may be selected according to the final layout of the components, while avoiding the area covered with the components and ensuring that the first conductive layer 22 and the second conductive layer 23 have a certain surface area, the first grooves 25 are formed along the edges of the first conductive layer 22 and the second conductive layer 23 as much as possible, so that the bonding strength between the substrate and the packaging adhesive layer is enhanced, and in some implementation processes, the air tightness can be improved accordingly, which is beneficial to ensuring the final quality of the LED light-emitting device.

In this embodiment, a manufacturing process of the substrate and the LED light-emitting chip of this embodiment is further described, which comprises the following steps:

- S101: selecting a proper substrate main body to punch; wherein for example, a hole is punched in each of the lower left and upper right areas of the substrate main body 21, and illustratively, the aperture may be 50-200 μm. In the step, the punched holes are holes to form conductive through holes subsequently;
- S102: sputtering metal layers on the front surface, the back surface and the holes of the substrate main body; wherein for example, a thin metal layer is sputtered onto the substrate main body 21, with a thickness being selected to be less than 15 μm. The metal layer may be a conductive metal layer, such as a copper layer;
- S103: performing pad printing of a circuit on the surface of the substrate main body, and coating the metal layers with thick copper layers;
- S104: manufacturing the thick copper layers into a desired shape of the conductive layers, followed by etching or cutting, to obtain the substrate profile as illustrated in FIG. 14;
- S105: grinding and polishing the conductive layers to enable the surfaces of the conducting layers to be flat;
- S106: electrocoating the surfaces of the conductive layers to obtain a finished product of the substrate; wherein for example, metal coating layers are formed on the surfaces of the copper layers by electrocoating; and
- S107: arranging components on the substrate, and packaging same through the packaging adhesive.

Illustratively, the components are arranged on the substrate by a method including, but not limited to, eutectic soldering, etc., the components include Zener diodes, LED chips, etc., and after the components are fixed onto the substrate, the manufacturing of the packaging adhesive layer may be performed by a method such as die pressing. In some specific examples, the thickness of the packaging adhesive layer may be 200-400 μm, and the packaging adhesive layer may be an insulating adhesive material, such as silicon gel. It can be understood that in some examples, the packaging adhesive layer is required to be higher than the highest surface of the components on the substrate to ensure that each component is wrapped for protection. After the die pressing of the packaging adhesive layer is completed, the packaging adhesive layer is placed into an oven for baking and curing, and illustratively, the silicone packaging adhesive layer may be baked and cured at the temperature of 120-170° C. It should be understood that when the substrate comprises more than one area for arranging the LED chip, the cured LED light-emitting device may be cut to obtain a single LED light-emitting device.

Figure 15:
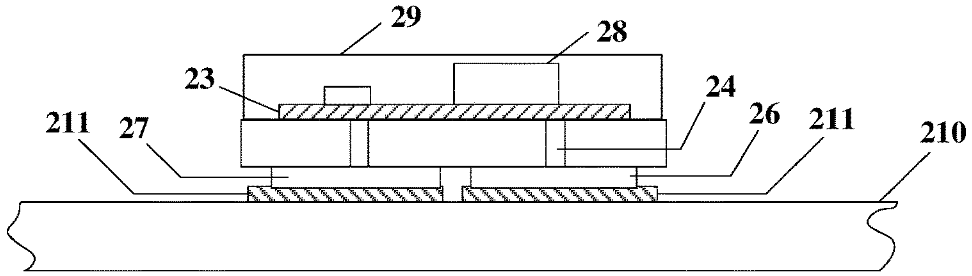
FIG. 15 is a schematic structural diagram of a light-emitting assembly according to Embodiment II of the present application.

This embodiment further provides a light-emitting assembly, as shown in FIG. 15, comprising a circuit board 210 and a light-emitting unit, wherein the light-emitting unit may be an LED light-emitting device as shown in the above examples of this embodiment, the circuit board 210 comprises circuit layers 211, and the third conductive layer 26 and the fourth conductive layer 27 are welded to the circuit layers 211. It can be understood that the circuit board 210 of the light-emitting assembly may also be provided with corresponding circuit patterns and components for driving the LED light-emitting device to emit light. As the bonding force between the packaging adhesive layer of the LED light-emitting device in the light-emitting apparatus and the substrate in this embodiment is stronger, the LED light-emitting device is not easy to fall off from the substrate, and the quality of the light-emitting apparatus is high.

Embodiment III

In the existing LED packaging structure, the bonding performance between a package and a substrate is poor, so that the problems of poor air tightness, light attenuation and the like are easily caused. In view of the above problems, this embodiment provides a novel LED bracket, wherein a second groove is added in a contact area between a substrate of the LED bracket and a package; that is, an area of the substrate covered with the package, the package forms a step-like structure at the second groove, and a part of the package covering the substrate fills the second groove, so that a contact area between the package and the substrate increases by means of the second groove, and a bonding force and an air tightness between the substrate and the package are enhanced; in addition, when the bracket is applied to the LED package to manufacture the light-emitting unit, due to the arrangement of the second groove, the inner wall of the package may be allowed to increase the inclination degree compared with the existing solution, and the required bonding strength can still be ensured, so that the light-emitting angle of the light-emitting unit can be improved. It should be understood that the LED bracket in this embodiment may adopt the LED bracket shown in the embodiments described above (for example, Embodiment I), or may adopt LED brackets with other structures, which is not limited in this embodiment.

For ease of understanding, the following description is made in conjunction with several examples illustrated in the accompanying drawings.

Figure 16:
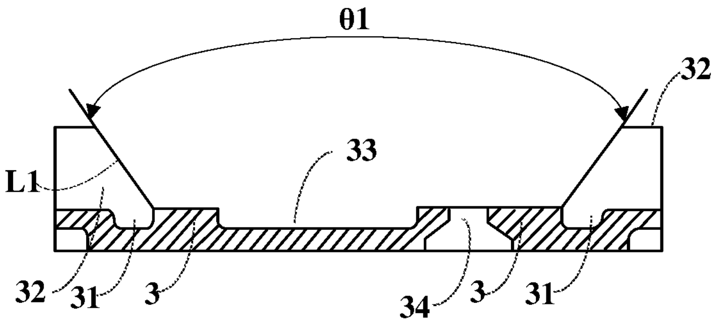
FIG. 16 is a schematic structural diagram I of an LED bracket according to Embodiment III of the present application.

As shown in FIG. 16, the LED bracket comprises a substrate 3 and a package 32 arranged on the substrate 3, a second groove 31 is formed on one side of the substrate 3 connected to the package 32, and the package 32 covers a part of the surface of the substrate 3 and fills the second groove 31. In some examples of this embodiment, the substrate 3 may be used as an electrically and thermally conductive layer, and the material may be, but is not limited to, copper alloy, aluminum, gold, silver, copper, and the like. The package 32 is a protective structure formed by filling a material around the periphery of the substrate, and the material of the protective structure may be, but is not limited to, a thermosetting resin or a thermoplastic resin.

In one example of this embodiment, the depth of the second groove 31 formed in the LED bracket may be, but is not limited to, 0.05 mm to 0.3 mm, and the width thereof may be, but is not limited to, 0.05 mm to 0.5 mm. Specifically, the particle size of the filler material used as the package 32 needs to be considered, and the width and the depth need to be 2 times or more of the maximum particle size, so as to avoid underfill.

In some examples of this embodiment, the substrate 3 has two conductive areas isolated by an insulating area 34. In this example, the insulating area 34 is a strip-shaped hole-groove structure, and the insulating area 34 may be filled with a filler of an insulating material, so as to achieve electrical isolation between the two conductive areas.

In one example of this embodiment, as shown in FIG. 16, the inner wall of the package 32 is funnel-shaped, and the opening of the inner wall gradually increases in size in a direction far away from the substrate 3; namely, the opening of the bowl portion enclosed by the package 32 gradually increases in size from the bottom of the bowl portion in a direction far away from the substrate 3. The inner wall of the package 32 is connected to one side of a notch of the second groove 31 close to the center of the bowl portion (i.e., one side of the notch of the second groove 31 far away from the edge of the substrate 3), and the projection shape of the inner wall of the package 32 in a section cutting plane of the substrate 3 is a straight line L1; namely the inner wall of the package 32 is shaped as a side surface of a circular truncated cone or a truncated pyramid structure, wherein the section cutting plane of the substrate 3 in this example is perpendicular to the surface of the substrate 3. In this structure, as the second groove 31 is formed in a place where the substrate 3 and the package 32 are bonded, the interior of the package 32 may be made more inclined, while the required bonding strength may still be ensured; when the structure is applied to an LED package structure, the angle of the emergent light from the central axis of the LED is larger, so that the light-emitting angle θ1 of the LED package can be improved.

Figure 17:
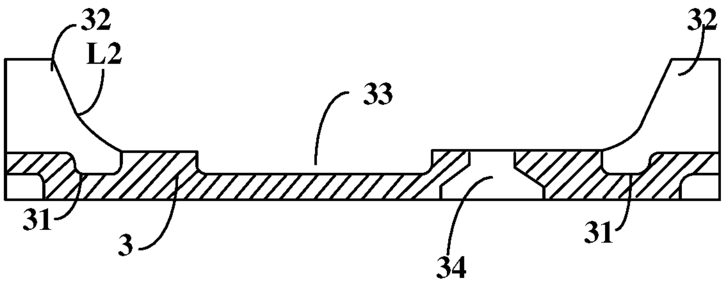
FIG. 17 is a schematic structural diagram II of an LED bracket according to Embodiment III of the present application.

In some embodiments, as shown in FIG. 17, the inner wall of the package 32 is funnel-shaped, and the opening gradually increases in size in a direction far away from the substrate 3, the inner wall of the package 32 is connected to one side of the notch of the second groove 31 close to the center of the bowl portion, and the shape of the inner wall of the package 32 in the section cutting plane of the substrate 3 is a curve L2, and the specific shape of the curve includes, but is not limited to, a circular arc, an elliptic are and a parabola. Similarly, in this structure, as the second groove 31 is formed in a place where the substrate 3 and the inner wall of the package 32 are bonded, the interior of the package 32 may be made more inclined, and the required bonding strength may still be ensured; when the structure is applied to an LED package structure, the angle of the emergent light from the central axis of the LED is larger, so that the light-emitting angle of the LED package can be improved.

Figure 18:
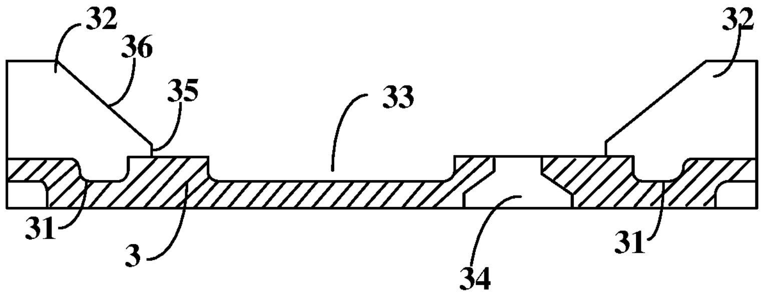
FIG. 18 is a schematic structural diagram III of an LED bracket according to Embodiment III of the present application.

In some embodiments, as shown in FIG. 18, the inner wall of the package 32 is funnel-shaped, the opening gradually increases in size in a direction far away from the substrate 3, and the package 32 covers the surface of the substrate 3 on both sides of the second groove 31. The shape of the inner wall of the package 32 in the section cutting plane of the substrate 3 includes a first section 35 connected perpendicularly to the surface of the substrate 3 and a second section 36 arranged obliquely relative to the surface of the substrate 3. The package 32 covers the surface of the substrate 3 on both sides of the second groove 31, such that the package 32 forms step-like structures on both sides of the second groove 31, thereby further increasing the bonding strength between the substrate 3 and the package 32 and further providing air tightness. The first section 35 of the inner wall of the package 32 is used for ensuring the thickness of the package 32, and the second section 36 is used for forming an open divergent opening, so as to increase the light-emitting angle.

In some embodiments, as shown in FIG. 16 to FIG. 18, a third groove 33 for fixing a chip (which may include, but is not limited to, an LED chip) is further formed on one side of the substrate 3 where the second groove 31 is formed, and the third groove 33 may be formed in any one of the conductive areas on the substrate 3. In one example, the third groove 33 is formed as a counter bore on the surface of the substrate 3, and has a depth of, but not limited to, 0.05 mm to 0.3 mm, and a width greater than a side length of a chip to be fixed, such that the chip can be placed inside the third groove 33. The third groove 33 may deepen the cup depth of the package 32, and those skilled in the art know that in the LED package, the packaging layer on the chip may have a certain thickness to ensure the air tightness of the packaged product, so that the reliability of the chip is not easily influenced by the external environment. In this embodiment, the third groove 33 is used for ensuring the thickness of the LED package through the depth of the third groove 33 even if the height of the LED package is not enough, so that the size of the LED package can be made as small as possible on the premise of ensuring that the height of the packaging layer is satisfied. The structure may also ensure that a bonding wire 310 between the chip and the substrate 3 is not easy to expose on the adhesive surface, thereby reducing the possibility of causing light attenuation and dead pixels.

It should be noted that other configurations and operations of the bracket for the LED package provided in this embodiment are known to those of ordinary skill in the art, and reference may be made to the structure of the related apparatus in the prior art, and details are not repeated here.

Figure 19:
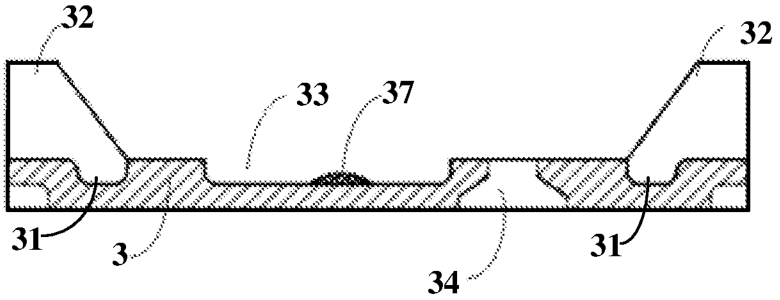
FIG. 19 is a schematic structural diagram IV of an LED bracket according to Embodiment III of the present application.
Figure 20:
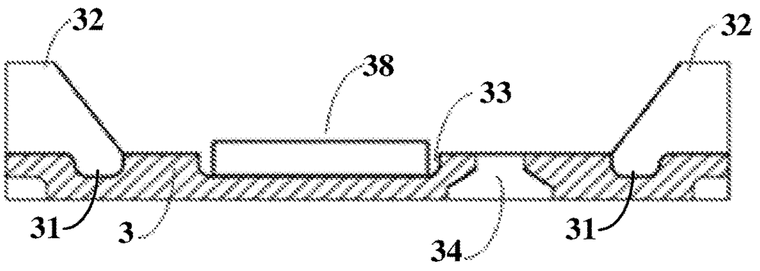
FIG. 20 is a schematic structural diagram V of an LED bracket according to Embodiment III of the present application.
Figure 21:
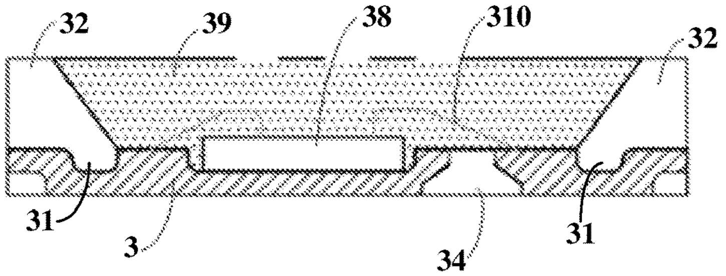
FIG. 21 is a schematic structural diagram of a light-emitting unit according to Embodiment III of the present application.

This embodiment further provides a light-emitting unit comprising the LED bracket provided in this embodiment, referring to FIG. 19 to FIG. 21, the light-emitting unit in this embodiment comprises an LED chip 38, the LED chip 38 is fixed onto the surface of the substrate 3 (i.e., in a bowl portion) inside the package 32 by a bonding adhesive 37, the LED chip 38 may be electrically connected to the substrate 3 by, but not limited to, a bonding wire 310, and a packaging layer 39 is arranged in the bowl portion formed by the package 32 for sealing the LED chip 38. When the substrate 3 is provided with the third groove 33, the third groove 33 is a bonding area of the LED package, the third groove 33 is located inside the bowl-shaped package 32, the LED chip 38 is fixed inside the third groove 33 by the bonding adhesive 37, and the LED chip 38 is electrically connected to the substrate 3 by the bonding wire 310.

For ease of understanding, this embodiment will be described below by taking as an example a manufacturing process of the LED bracket. The manufacturing process comprises, but is not limited to:

Manufacturing of a substrate 3: a third groove 33 is formed in the middle of the substrate 3, and second grooves 31 are formed around the third groove 33, wherein the second groove 31 has a depth of 0.05 mm to 0.3 mm and a width of 0.05 mm to 0.5 mm, and the third groove 33 has a depth of 0.05 mm to 0.3 mm, and a width larger than the side length of the LED chip 38.

Manufacturing of a bracket: under the action of the second grooves 31 and the die, the package 32 formed by the filler extends into the second grooves 31, and the substrate 3 and the package 32 form a bracket structure.

A bonding adhesive 37 is placed in a bonding area in the third groove 33 by using a bonding device and a clamping tool, then an LED chip 38 is placed on the bonding adhesive 37 by using the bonding device and the clamping tool, and curing treatment is performed, such that the LED chip 38 is fixed into the third groove 33.

The die-attach baked material is bonded by using a wire bonding device and a clamping tool, such that the LED chip 38 is electrically connected to the substrate 3 through a bonding wire 310. The bonding wire 310 used includes, but is not limited to, gold, silver, or alloy wires.

The wire-bonded material is dispensed with a fluorescent adhesive or a packaging adhesive by using an adhesive device, and then the material dispensed with the fluorescent adhesive or the packaging adhesive is baked and cured to form a packaging layer 39. The finally-obtained light-emitting unit product has good air tightness, high product reliability, large light-emitting angle and high brightness, and thus can be applied to products with high reliability requirements indoors and outdoors. It should be understood that the LED chip in this example is a normal LED chip, and may also be replaced with a flip-chip LED chip or a vertical LED chip as desired.

Since the light-emitting unit disclosed in this embodiment comprises the bracket provided in the above embodiments, the light-emitting unit having the bracket also has all the technical effects described above, which is not described in detail herein. Other constructions and operations of the light-emitting unit will be known to those of ordinary skill in the art, and details are not repeated here. Some embodiments in the specification are all described in a progressive or parallel manner, and each embodiment focuses on differences from other embodiments, and portions that are the same and similar between the embodiments may be referred to each other, which is not described in detail herein.

Embodiment IV

In a conventional LED bracket, a copper coating layer and a silver coating layer are generally sequentially arranged on a surface of a substrate main body to improve overall performance of the LED bracket. However, when the LED chip is connected to the surface of the substrate by soldering, a large number of copper ions in the copper coating layer migrate into the silver coating layer and combine with tin on the surface of the silver coating layer to form a tin-copper compound, thereby forming voids, resulting in a low production yield.

In view of the above problems, this embodiment provides a novel LED bracket, which comprises a substrate, wherein the substrate comprises a substrate main body (also referred to as a substrate main body), and two conductive areas insulated and isolated by an insulating area are arranged on a first surface of the substrate main body, wherein at least one of the conductive areas comprises a first copper coating layer, a nickel coating layer, a second copper coating layer and a silver coating layer which are sequentially stacked on the first surface of the substrate main body, and the thickness of the first copper coating layer is greater than that of the second copper coating layer, and the nickel coating layer is used for blocking copper ions in the first copper coating layer from migrating into the second copper coating layer. The first copper coating layer, the nickel coating layer, the second copper coating layer and the silver coating layer are sequentially stacked on the surface of the substrate main body, so that the overall performance of the LED bracket is effectively improved, wherein the second copper coating layer is relatively thin, and only a small number of copper ions in the second copper coating layer migrate into the silver coating layer, so that the problem that a large number of tin-copper compounds are formed by the copper ions and tin solders on the surface of the silver coating layer to cause voids is effectively avoided, and in addition, the copper ions in the first copper coating layer can be prevented from migrating into the second copper coating layer due to the existence of the nickel coating layer, so that the content of the migrating copper ions in the second copper coating layer is effectively prevented from being increased, the tin-copper compounds cannot be further formed in a large number, and the production yield is improved. It should be understood that other structures of the LED bracket in this embodiment may adopt the structure of the LED bracket shown in the above-described embodiments, or may adopt other structures suitable for the LED bracket in this embodiment, which is not limited in this embodiment. For ease of understanding, this embodiment is described below in conjunction with examples illustrated in the accompanying drawings.

Figure 22:
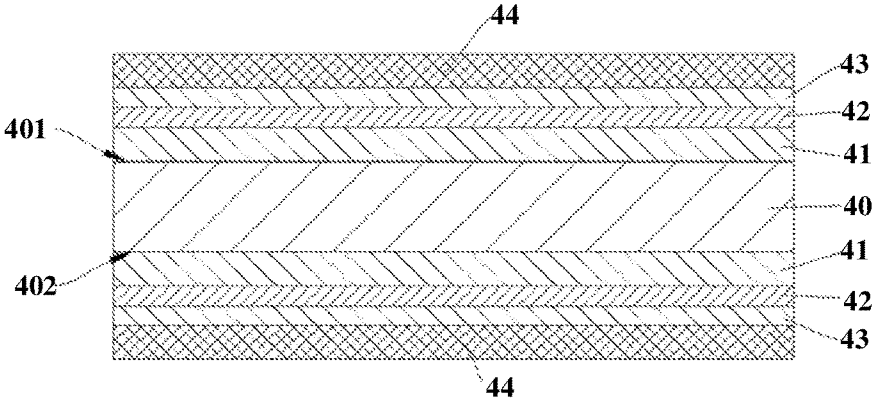
FIG. 22 is a schematic structural diagram I of a substrate of an LED bracket according to Embodiment IV of the present application.

The substrate of the LED bracket, referring to FIG. 22, comprises a substrate main body 40, and a first copper coating layer 41, a nickel coating layer 42, a second copper coating layer 43 and a silver coating layer 44 sequentially stacked on the surface of the substrate main body 40, wherein the substrate main body 40 has a certain structural strength to play a load-bearing role. In addition, the substrate main body 40 should be made of a material with high thermal conductivity, so that when the LED chip generates heat during operation, the generated heat can be conducted through the LED bracket, thereby achieving effective heat dissipation. In a specific embodiment, the material of which the substrate main body 40 is made may be a conductive material, such as a metal material. It should be understood that the substrate main body 40 is made of a material including, but not limited to, a conductive material, or may be made of any other material with high thermal conductivity and certain structural strength, and the material of the substrate main body 40 is not particularly limited herein.

In an example of this embodiment, the substrate main body 40 comprises a first surface 401 and a second surface 402 opposite to each other, and a first copper coating layer 41, a nickel coating layer 42, a second copper coating layer 43 and a silver coating layer 44 are stacked on each of the first surface 401 and the second surface 402. The metal coating layer on the first surface 401 is used for connecting to the LED chip, and the metal coating layer on the second surface 402 is used for connecting to the circuit board. It should be understood that the above metal coating layer may be formed on the surface of the substrate main body 40 by, but not limited to, electrocoating, and in the electrocoating process, if the metal coating layer is formed on only one surface of the substrate main body 40, the difficulty is high, and the operation is more complicated, so that the above metal coating layer may be formed on both the first surface 401 and the second surface 402, so as to reduce the difficulty of the process and improve the processing efficiency. It should be noted that the first copper coating layer 41, the nickel coating layer 42, the second copper coating layer 43 and the silver coating layer 44 are processed and formed on the surface of the substrate main body 40 by methods, including but not limited to, electrocoating, and metal evaporation, chemical coating, or any other methods that satisfy the functional requirements, and the processing and forming method of the above metal coating layer is not particularly limited herein.

The first copper coating layer 41 is arranged on the surface of the substrate main body 40. It should be understood that in the conventional manufacturing process, the surface of the substrate main body 40 usually has a poor flatness, and if the substrate main body 40 is directly mounted on the circuit board, a gap or a void exists between the substrate main body 40 and the circuit board, thereby resulting in a low production yield. Similarly, if the LED chip is directly mounted on the uneven surface of the substrate main body 40, the working effect of the LED chip is affected to some extent. The first copper coating layer 41 is arranged on each of the first surface 401 and the second surface 402 of the substrate main body 40, such that the surface flatness of the LED bracket is improved, and a gap or a void between the LED bracket and the circuit board is effectively avoided, and in addition, the LED chip is mounted on the relatively flat first copper coating layer 41, so that the working effect of the LED chip can also be effectively improved.

In an example of this embodiment, the first copper coating layer 41 has a thickness ranging from 0.5 μm to 5 μm. It should be understood that when the thickness of the first copper coating layer 41 is less than 0.5 μm, the first copper coating layer 41 is too thin to compensate for the depression on the surface of the substrate main body 40, so that the planarization effect cannot be achieved, a gap or a void still exists between the corresponding LED bracket and the circuit board, and the working effect of the LED chip mounted on the corresponding LED bracket is still affected to a certain extent; when the thickness of the first copper coating layer 41 is more than 5 μm, the first copper coating layer 41 is relatively thick, thus increasing the manufacturing cost to some extent. Based on this, when the thickness of the first copper coating layer 41 is greater than or equal to 0.5 μm and less than or equal to 5 μm, the manufacturing cost can be effectively reduced while ensuring the surface flatness of the LED bracket.

The nickel coating layer 42 is arranged between the first copper coating layer 41 and the second copper coating layer 43. It should be understood that in the conventional process, the LED bracket and the circuit board, as well as the LED chip and the LED bracket, are generally fixedly connected by soldering, a tin solder layer exists on the surface of the silver coating layer 44, after a period of operation, copper ions in the first copper coating layer 41 easily migrate into the second copper coating layer 43, such that copper ions in the second copper coating layer 43 increase, a large number of copper ions will migrate from the second copper coating layer 43 into the silver coating layer 44 and combine with tin on the surface of the silver coating layer 44 to form tin-copper compounds, and the generation of a large number of tin-copper compounds easily causes formation of voids between the LED bracket and the circuit board and between the LED bracket and the LED chip, thereby reducing the production yield. The nickel coating layer 42 can effectively prevent the copper ions in the first copper coating layer 41 from migrating into the second copper coating layer 43, thereby effectively preventing a large number of copper ions from migrating into the silver coating layer 44 and forming a large number of tin-copper compounds with tin solders on the surface of the silver coating layer.

It should also be understood that the silver coating layer 44 connected to the LED chip may also reflect light emitted from the LED chip to increase the brightness. The nickel coating layer 42 can effectively prevent a large number of copper ions from migrating into the silver coating layer 44 to reduce the reflectivity of the silver coating layer 44, thereby ensuring the corresponding reflection function of the silver coating layer 44 to be normal.

In an example of this embodiment, the nickel coating layer 42 has a thickness ranging from 0.125 μm to 2.5 μm. It should be understood that when the thickness of the nickel coating layer 42 is less than 0.125 μm, the nickel coating layer 42 is too thin, and thus the nickel coating layer 42 is difficult to effectively block the migration of copper ions, so that the generation of a large number of tin-copper compounds cannot be avoided, and the reflectivity of the silver coating layer 44 cannot be ensured to meet the corresponding requirements; when the thickness of the nickel coating layer 42 is more than 2.5 μm, the nickel coating layer 42 is relatively thick, thus increasing the manufacturing cost to some extent. Based on this, when the thickness of the nickel coating layer 42 is greater than or equal to 0.125 μm and less than or equal to 2.5 μm, the manufacturing cost can be effectively reduced while the migration of copper ions is blocked.

The second copper coating layer 43 is arranged between the nickel coating layer 42 and the silver coating layer 44, and the thickness of the second copper coating layer 43 is smaller than that of the first copper coating layer 41. It should be understood that when the silver coating layer 44 is directly arranged on the surface of the nickel coating layer 42, the bonding degree between the silver coating layer 44 and the nickel coating layer 42 is relatively poor, and the silver coating layer 44 is easily separated from the surface of the nickel coating layer 42, thereby resulting in poor stability of the LED bracket. And by arrangement of the second copper coating layer 43 between the nickel coating layer 42 and the silver coating layer 44, the bonding degree between the second copper coating layer 43 and the silver coating layer 44 is better, which can effectively improve the structural stability of the LED bracket. It should also be understood that the thickness of the second copper coating layer 43 should be smaller than that of the first copper coating layer 41; that is, the thickness of the second copper coating layer 43 should be relatively thin, so that the content of copper ions in the second copper coating layer 43 is relatively small, thereby effectively avoiding a large number of copper ions from migrating from the second copper coating layer 43 into the silver coating layer 44, reducing the number of voids formed by the tin-copper compounds to a certain extent, effectively increasing the production yield, and meanwhile ensuring that the reflectivity of the silver coating layer 44 meets the corresponding requirements.

In an example of this embodiment, the second copper coating layer 43 has a thickness ranging from 0.0625 μm to 1 μm. It should be understood that when the thickness of the second copper coating layer 43 is less than 0.0625 μm, the second copper coating layer 43 is too thin, the second copper coating layer 43 cannot play a bonding role, and the silver coating layer 44 still has a problem of easy detachment, so that the structural stability of the LED bracket cannot be effectively ensured; when the thickness of the second copper coating layer 43 is greater than 1 μm, the second copper coating layer 43 is too thick, and the content of copper ions in the second copper coating layer 43 is high, so that the copper ions easily migrate from the second copper coating layer 43 to the silver coating layer 44 connected to the circuit board in a large number, and then a large number of tin-copper compounds are formed with tin on the surface of the silver coating layer 44, thereby forming voids, and reducing the production yield. Meanwhile, a large number of copper ions also easily migrate into the silver coating layer 44 connected to the LED chip, thereby causing a decrease in the reflectivity of the silver coating layer 44 and failing to meet the corresponding functional requirements. Based on this, when the thickness of the second copper coating layer 43 is greater than or equal to 0.0625 μm and less than or equal to 1 μm, it is possible to avoid a large number of copper ions from migrating into the silver coating layer 44 while effectively bonding with the silver coating layer 44.

The silver coating layer 44 is arranged on one side of the second copper coating layer 43 facing away from the nickel coating layer 42. It should be understood that on the side close to the first surface 401 of the substrate main body 40, the LED chip is arranged on the surface of the silver coating 44, and because the reflectivity of the silver coating layer 44 is relatively high, the light emitted by the LED chip can be reflected by the silver coating layer 44, thereby effectively improving the brightness effect thereof; on the side close to the second surface 402 of the substrate main body 40, the circuit board is connected to the surface of the silver coating layer 44, and normally, the circuit board and the LED bracket are fixedly connected by soldering, and the bonding degree between the silver coating layer 44 and the tin solder layer is better than that between the nickel coating layer 42 and the tin solder layer, and the silver coating layer 44 can effectively fix the circuit board and the LED bracket without falling off, thereby improving the structural stability. It should be noted that, the connection modes between the LED bracket and the circuit board include, but are not limited to, connection by tin soldering, and also any other connection modes that satisfy the corresponding functional requirements may be adopted, and the connection modes between the LED bracket and the circuit board are not particularly limited herein.

In an example of this embodiment, the silver coating layer 44 has a thickness ranging from 0.25 μm to 5 μm. It should be understood that when the thickness of the silver coating layer 44 is less than 0.25 μm, the silver coating layer 44 is too thin, the silver coating layer 44 close to the first surface 401 of the substrate main body 40 is difficult to function to reflect light, and the silver coating layer 44 close to the second surface 402 of the substrate main body 40 is difficult to function in combination with a tin solder layer; when the thickness of the silver coating layer 44 is more than 5 μm, the silver coating layer 44 is excessively thick, and the manufacturing cost is greatly increased due to the expensive price of silver. Based on this, when the thickness of the silver coating layer 44 is greater than or equal to 0.25 μm and less than or equal to 5 μm, it is possible to satisfy both the reflection of light and the bonding with the solder layer, and to effectively reduce the manufacturing cost.

According to the LED bracket provided in this embodiment, the first copper coating layer 41, the nickel coating layer 42, the second copper coating layer 43 and the silver coating layer 44 are sequentially stacked on the surface of the substrate main body 40, so that the overall performance of the LED bracket is effectively improved, wherein the second copper coating layer 43 is relatively thin, and only a small number of copper ions in the second copper coating layer 43 migrate into the silver coating layer 44, so that the problem that a large number of tin-copper compounds are formed by the copper ions and tin solders on the surface of the silver coating layer 44 to cause voids is effectively avoided, and in addition, the copper ions in the first copper coating layer 41 can be prevented from migrating into the second copper coating layer 43 due to the existence of the nickel coating layer 42, so that the content of the migrating copper ions in the second copper coating layer 43 is effectively prevented from being increased, the tin-copper compounds cannot be further formed in a large number, and the production yield is improved.

Figure 23:
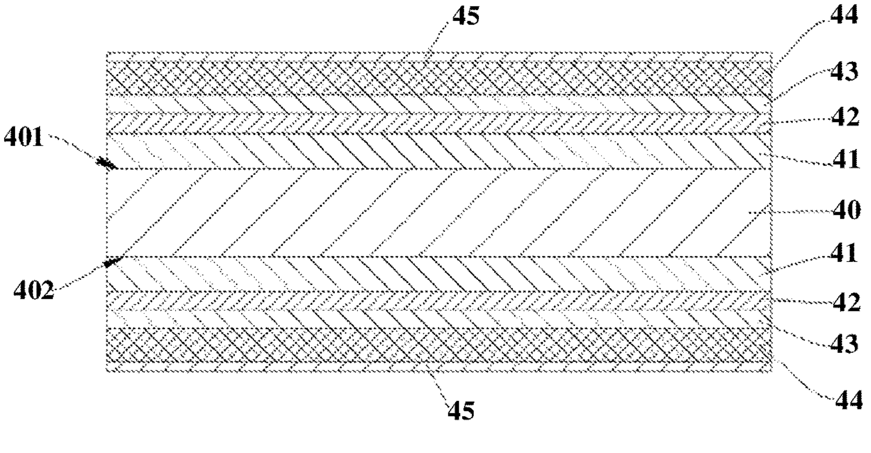
FIG. 23 is a schematic structural diagram II of a substrate of an LED bracket according to Embodiment IV of the present application.
Figure 24:
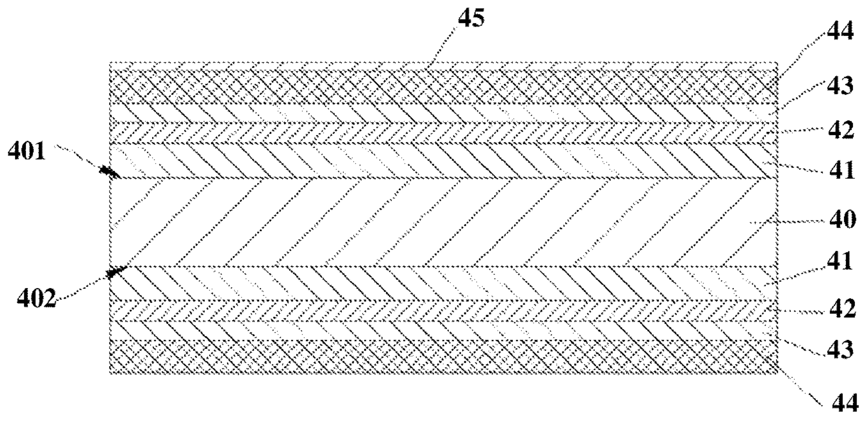
FIG. 24 is a schematic structural diagram III of a substrate of an LED bracket according to Embodiment IV of the present application.

Referring to FIG. 23 and FIG. 24, FIG. 23 is a schematic structural diagram of an LED bracket in another example of this embodiment; FIG. 24 is a schematic structural diagram of an LED bracket in another example of this embodiment. In an example of this embodiment, the LED bracket further comprises a palladium coating layer 45, wherein the palladium coating layer 45 is arranged on one side of the silver coating layer 44 far away from the second copper coating layer 43, and the palladium coating layer 45 is used for protecting the silver coating layer 44. It should be understood that since the structure of the palladium coating layer 45 is relatively stable, the palladium coating layer 45 covers the surface of the silver coating layer 44, so that the oxidation resistance, the sulfuration resistance and the corrosion resistance of the silver coating layer 44 can be improved, and the performance of the LED bracket is improved to a certain extent. The palladium coating layer 45 in this example has a thickness ranging from 0.0025 μm to 0.25 μm. It should be understood that when the thickness of the palladium coating layer 45 is less than 0.0025 μm, the palladium coating layer 45 is too thin, and the palladium coating layer 45 cannot sufficiently protect the silver coating layer 44, and thus the silver coating layer 44 is easily oxidized, sulfurized, and even corroded; when the thickness of the palladium coating layer 45 is greater than 0.25 μm, the palladium coating layer 45 is excessively thick, and the manufacturing cost is greatly increased due to the expensive price of palladium. Based on this, when the thickness of the palladium coating layer 45 is greater than or equal to 0.0025 μm and less than or equal to 0.25 μm, the silver coating layer 44 can be effectively protected, and the manufacturing cost can be reduced.

In an example of this embodiment, after the metal coating layer is formed on the surface of the substrate main body 40, the substrate main body may be soaked in an antioxidant, and then cleaned and air-dried, so as to further improve the oxidation resistance of the LED bracket.

As shown in FIG. 24, in another example of this embodiment, in order to further reduce the manufacturing cost, the palladium coating layer 45 may be arranged only on the surface of the silver coating layer 44 connected to the LED chip. It should be noted that the silver coating layer 44 connected to the circuit board is usually covered with a tin solder layer, and the tin solder layer can protect the silver coating layer 44 to a certain extent. Since the silver coating layer 44 connected to the LED chip is mostly exposed to the air, the palladium coating layer 45 may be arranged only on the surface of the silver coating layer 44 connected to the LED chip to protect the silver coating layer 44.

Figure 25:
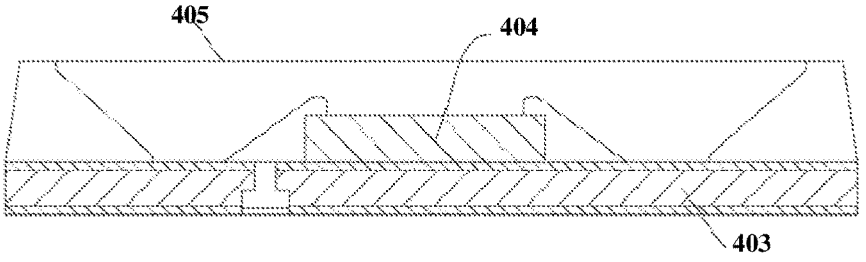
FIG. 25 is a schematic structural diagram of a light-emitting unit according to Embodiment IV of the present application.

Referring to FIG. 25, a schematic structural diagram of a light-emitting unit (i.e., an LED module) is shown. The light-emitting unit comprises an LED chip 404, a packaging layer 405 and the LED bracket provided in this embodiment, wherein the packaging layer 405 and the LED chip 404 are both arranged on the surface of the substrate 403, and the LED chip 404 is located at the bottom of the bowl portion. It should be understood that a tin solder layer may be arranged between the LED bracket and the packaging layer 405; namely, the LED bracket and the packaging layer 405 may be fixed by soldering, or may be fixed by a conductive adhesive. The LED bracket provided in any embodiment of the present application is mounted on the light-emitting unit provided in this embodiment, so that the good overall performance of the light-emitting unit is ensured, and meanwhile, the production yield of the light-emitting unit can be effectively improved. This embodiment further provides an LED packaging device comprising a package and the above light-emitting unit, wherein the package accommodates the light-emitting unit to implement package protection. The light-emitting unit provided in this embodiment is mounted on the LED packaging device provided in this embodiment, so that good overall performance of the LED packaging device can be ensured, and meanwhile, the production yield of the display device is effectively improved.

This embodiment further provides a light-emitting assembly comprising the light-emitting unit or the LED packaging device provided in this embodiment. The light-emitting unit or the LED packaging device provided in this embodiment is mounted on the light-emitting assembly provided in this embodiment, so that good overall performance of the light-emitting assembly can be ensured, and meanwhile, the production yield of the display device is effectively improved.

Embodiment V

With the development of the application of device technology, the requirements of industrial equipment indicators such as instrument panels, switches, symbols, telephones and faxes, backlight lamps, small-sized devices, as well as intelligent wearable devices and nixie tubes of limited-size having backlight indication on the ultra-thin and small-sized LED packages are higher and higher. Products such as nixie tubes and intelligent wearable devices have a trend to be developed for lightness and thinness.

In the conventional LED chip package, an insulating adhesive is usually used to fix the normal chip onto the substrate, then bonding wires are used to connect the positive and negative electrodes of the chip to the positive and negative electrodes of the substrate, and finally, the fluorescent adhesive cake is die pressed and injected onto the substrate. Due to the structure, the product is difficult to thin, and thus the application requirement of an ultra-thin LED product cannot be met.

In view of the above problems, in this embodiment, a fourth groove recessed downwards from the first surface to the second surface and not penetrating through the second surface is formed in an area of the substrate main body located in the bowl portion, and the second surface is far away from the bowl portion; the substrate comprises a first solder pad and a second solder pad both arranged in the fourth groove and insulated and isolated from each other by the insulating area, wherein the first solder pad and the second solder pad both extend from a bottom wall of the fourth groove to the second surface of the substrate main body, and parts of the first solder pad and the second solder pad located in the fourth groove form the two conductive areas, respectively. The groove is formed in the substrate and at least part of the chip is accommodated in the groove for packaging, so that the height of the chip extending out of the first surface is reduced, and the LED product is integrally thinned, and the application requirement of the ultra-thin LED product is met. For ease of understanding, this embodiment is described below in conjunction with examples illustrated in the accompanying drawings.

Figure 26:
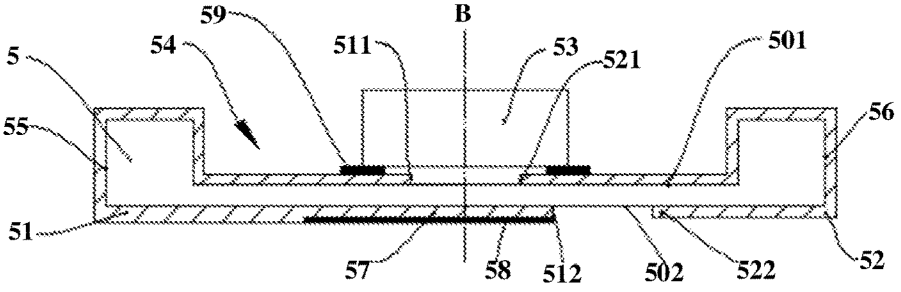
FIG. 26 is a schematic structural diagram I of an LED bracket according to Embodiment V of the present application.
Figure 27:
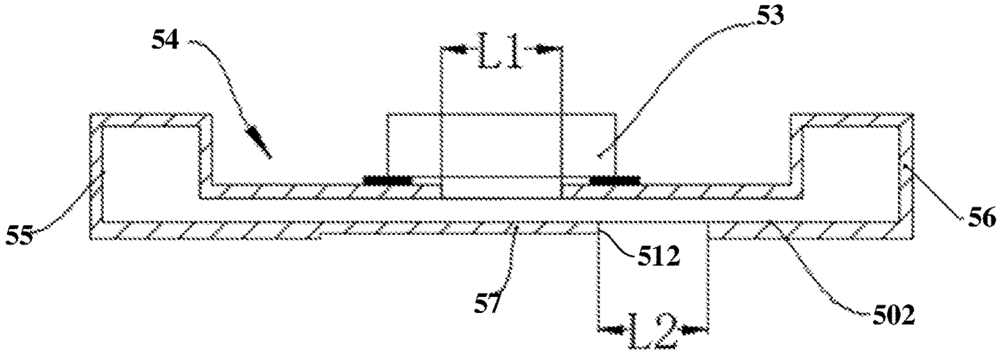
FIG. 27 is a schematic structural diagram II of an LED bracket according to Embodiment V of the present application.
Figure 28:
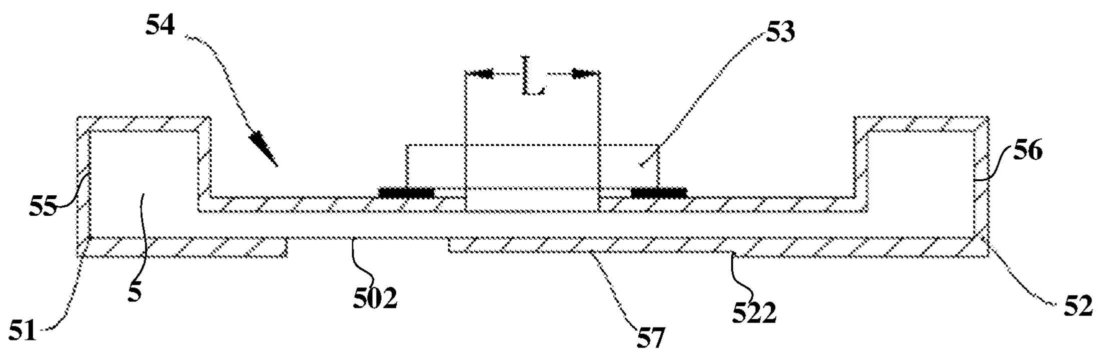
FIG. 28 is a schematic structural diagram III of an LED bracket according to Embodiment V of the present application.

Referring to FIG. 26 to FIG. 28, this embodiment provides an LED bracket which may adopt the LED bracket shown in the above embodiments, or adopt LED brackets with other structures, which is not limited in this embodiment. The LED bracket provided in this embodiment comprises a substrate, a first solder pad 51, a second solder pad 52, and an LED chip 53. The substrate 1 comprises a substrate main body 5, wherein the substrate main body 5 comprises a first surface 501 and a second surface 502 opposite to each other, a fourth groove 54 is formed in the first surface 501 of the substrate main body 5, and the fourth groove 54 does not penetrate through the second surface 502. The first solder pad 51 and the second solder pad 52 are arranged on the substrate main body 5 at intervals and isolated by an insulating area, and the first solder pad 51 and the second solder pad 52 each extend from the bottom wall of the fourth groove 54 to the second surface 502. The LED chip 53 is at least partially accommodated in the fourth groove 54, a first electrode of the LED chip 53 is connected to the first solder pad 51, and a second electrode of the LED chip 53 is connected to the second solder pad 52.

In this embodiment, the substrate main body 5 may be, but is not limited to, a PCB board, on which a fourth groove 54 is formed, the fourth groove 54 is recessed from the first surface 501 to the second surface 502 and does not penetrate through the second surface 502, the fourth groove 54 is used for accommodating the LED chip 53, and a circuit matching the LED chip 53 is printed on the bottom wall of the fourth groove 54. The number of the LED chips 53 may be set to be more than 1 according to actual requirements, and the installation positions thereof are determined according to actual requirements, which is not limited too much in this embodiment. When the thickness of the substrate main body 5 is smaller than that of the LED chip 53 or the light-emitting surface of the LED chip 53 is required to be higher than the first surface 501 of the substrate main body 5, the depth of the fourth groove 54 is smaller than the thickness of the LED chip 53, and the LED chip 53 is partially accommodated in the fourth groove 54; as shown in FIGS. 27 and 28, when the thickness of the substrate main body 5 is greater than that of the LED chip 53 and the LED chip 53 is required not to protrude from the first surface 501, the depth of the fourth groove 54 is greater than or equal to the thickness of the LED chip 53, and the LED chip 53 is completely accommodated in the fourth groove 54, so that the LED chip 53 can be better protected and prevented from being exposed outside the fourth groove 54 and damaged by collision and the like. Optionally, the LED chip 53 is a flip-chip LED chip, so as to make the structure of the LED module more compact. In other embodiments, structures such as a normal LED chip and a vertical LED chip may also be used.

The first solder pad 51 and the second solder pad 52 are made of a metal material which is conductive or is provided with a conductive metal layer on the outer surface thereof, and a spacing distance is formed between the first solder pad 51 and the second solder pad 52. Optionally, the first solder pad 51 comprises a first end 511 and a second end 512, and the first solder pad 51 extends from the first end 511 to the second end 512. The first end 511 is accommodated in the fourth groove 54, and the second end 512 is connected to the second surface 502 of the substrate main body 5. Similarly, the second solder pad 52 comprises a third end 521 and a fourth end 522, and the second solder pad 52 extends from the third end 521 to the fourth end 522, the third end 521 is accommodated in the fourth groove 54, and the fourth end 522 is connected to the second surface 502. The positive electrode of the LED chip 53 is connected to the first end 511 of the first solder pad 51, and the negative electrode of the LED chip 53 is connected to the third end 521 of the second solder pad 52. It can be understood that the positions of the first solder pad 51 and the second solder pad 52 can be interchanged; namely, when one of the solder pads is the first solder pad 51, the other solder pad is the second solder pad 52.

The fourth groove 54 is formed in the substrate main body 5, and at least part of the LED chip 53 is accommodated in the fourth groove 54 for packaging, so that the height of the LED chip 53 extending out of the first surface 501 is reduced, the LED product is integrally thinned, and the application requirement of the ultra-thin LED product is met.

Figure 29:
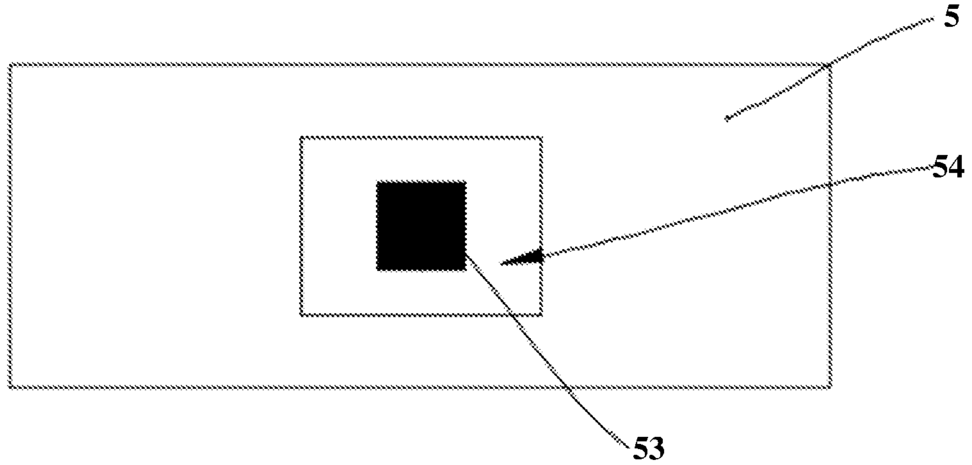
FIG. 29 is a top view I of an LED bracket according to Embodiment V of the present application.
Figure 30:
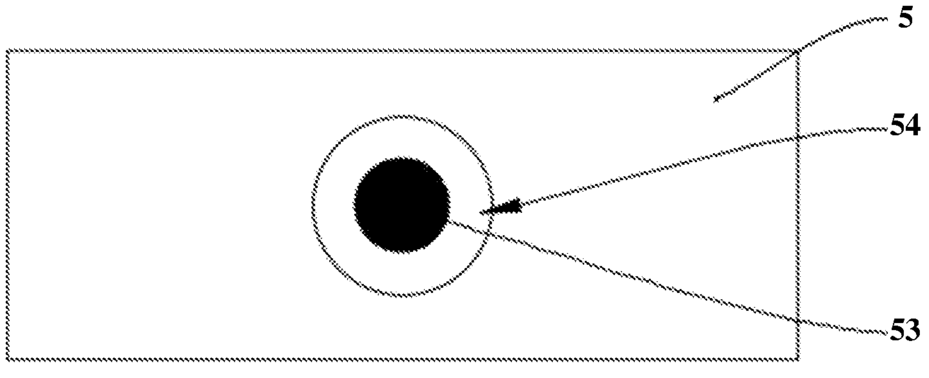
FIG. 30 is a top view II of an LED bracket according to Embodiment V of the present application.
Figure 31:
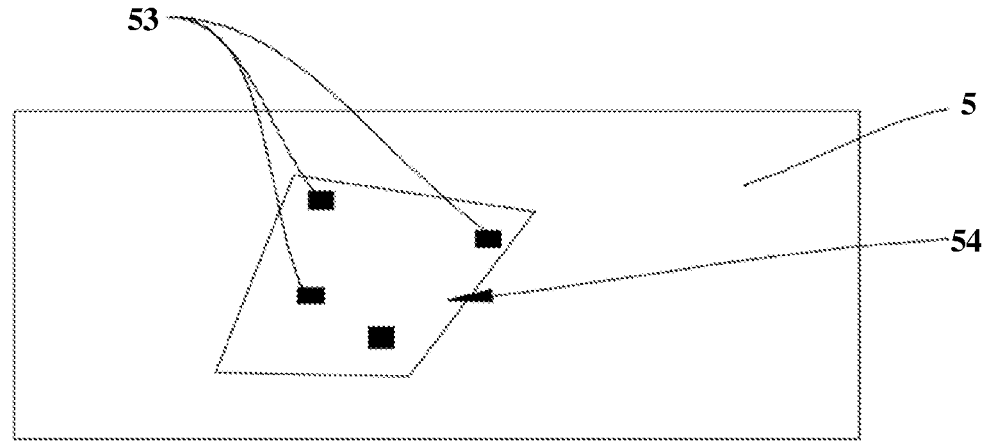
FIG. 31 is a top view III of an LED bracket according to Embodiment V of the present application.

In one embodiment, referring to FIG. 29 to FIG. 31, the shape of the fourth groove 54 corresponds to the shape of the LED chip 53. Optionally, as shown in FIG. 29, when the number of the LED chip 53 is 1 and the LED chip 53 is rectangular, a square fourth groove 54 may be formed; as shown in FIG. 30, when the number of the LED chip 53 is 1 and the LED chip 53 is circular, a circular fourth groove 54 may be formed; as shown in FIG. 31, when the number of the LED chips 53 is plural and the LED chips are irregularly arranged, correspondingly, the shape of the fourth groove 54 may be irregularly shaped. It can be understood that the area of the bottom wall of the fourth groove 54 remains larger than the area of the orthographic projection of the LED chip 53 on the first surface 501, such that the fourth groove 54 can accommodate the LED chip 53. By setting of the shape of the fourth groove 54 to mate with the LED chip 53, the shape and size of the fourth groove 54 may be flexibly adjusted, which is not only beneficial to processing the fourth groove 54, but also beneficial to adjusting the shape and size of the fourth groove 54 in real time according to the area of the substrate main body 5 and the shape and layout of the LED chips 53, so as to adapt to various requirements.

In one embodiment, referring to FIG. 26, FIG. 29 and FIG. 31, the number of the fourth grooves 54 is more than one, and the number of the LED chips 53 in each fourth groove 54 is more than one. Optionally, as shown in FIG. 29, a fourth groove 54 is formed on the substrate main body 5, and the number of the LED chip 53 in the fourth groove 54 is one; as shown in FIG. 31, a fourth groove 54 is formed on the substrate main body 5, and a plurality of LED chips 53 are arranged in the fourth groove 54. By flexible adjustment of the number of the fourth grooves 54, a plurality of LED chips 53 may be arranged in one groove as required, thereby avoiding multiple processing of the fourth grooves 54; the cutting area of the substrate main body 5 may be reduced by increasing the number of the fourth grooves 54, thereby improving the structural strength.

In one embodiment, referring to FIG. 26, the substrate main body 5 comprises a first side surface 55 and a second side surface 56 opposite to each other, a first end 511 of the first solder pad 51 extends from the bottom wall of the fourth groove 54 to the second surface 502 through the first surface 501 and the first side surface 55 to form a second end 512, a third end 521 of the second solder pad 52 extends from the bottom wall of the fourth groove 54 to the second surface 502 through the first surface 501 and the second side surface 56 to form a fourth end 522, the first end 511 of the first solder pad 51 and the third end 521 of the second solder pad 52 are symmetrically disposed in the fourth groove 54 relative to a perpendicular bisector B of the bottom wall of the fourth groove 54, and the first end 511 and the third end 521 are disposed at an interval. Optionally, an insulating substance may be disposed between the first end 511 and the third end 521, and the insulating substance may be in contact with the first end 511 and the third end 521, respectively, such that the insulating substance may be in contact with the first solder pad 51 and the second solder pad 52, respectively, while electrically isolating the first solder pad 51 from the second solder pad 52, thereby facilitating uniform heat conduction.

In one embodiment, referring to FIGS. 26 and 27, the LED chip packaging structure further comprises a reinforcing piece 57. For example, as shown in FIG. 27, on the bottom wall of the fourth groove 54, a first gap L1 is formed between the first solder pad 51 and the second solder pad 52, the first gap L1 is used for separating the first solder pad 51 from the second solder pad 52 to form a positive-electrode solder pad and a negative-electrode solder pad, the size of the first gap L1 is set according to the positive-negative spacing distance of the LED chip 53, when the positive-negative spacing distance of the LED chip 53 is large, the first gap L1 is large, and when the positive-negative spacing distance of the LED chip 53 is small, the first gap L1 is small. The reinforcing piece 57 is arranged on the second surface 502, and an orthogonal projection of the reinforcing piece 57 on the second surface 502 completely covers an orthogonal projection of the first gap L1 on the second surface 502. The reinforcing piece 57 is provided to compensate for the disadvantage that the substrate main body 5 is too thin and flexible between the first solder pad 51 and the second solder pad 52, such that the thickness of the LED packaging structure at the first gap L1 increases, thereby improving the structural strength.

In one embodiment, referring to FIGS. 26 and 27, a second gap L2 is formed between the first solder pad 51 and the second solder pad 52 on the second surface 502. Optionally, a second gap L2 is formed between the second end 512 of the first solder pad 51 and the fourth end 522 of the second solder pad 52 so as to separate the first solder pad 51 from the second solder pad 52. By electrical isolation of the first solder pad 51 from the second solder pad 52, the first solder pad 51 and the second solder pad 52 form a positive-electrode solder pad and a negative-electrode solder pad, respectively. Optionally, an insulating substance is disposed in the second gap L2, such that the first solder pad 51 and the second solder pad 52 are electrically isolated from each other by the insulating substance, and meanwhile the first solder pad 51 and the second solder pad 52 are connected into a whole by the insulating substance, thereby facilitating uniform heat conduction.

In one embodiment, referring to FIG. 26 to FIG. 28, the reinforcing piece 57 and the first solder pad 51 or the second solder pad 52 are of a one-piece structure. Optionally, as shown in FIG. 27, the reinforcing piece 57 and the first solder pad 51 are of a one-piece structure, the reinforcing piece 57 extends from the side where the first side surface 55 is located to the side where the second side surface 56 is located from the second end 512 of the first solder pad 51, and an orthographic projection of the reinforcing piece 57 on the second surface 502 completely covers an orthographic projection of the first gap L1 on the second surface 502; as shown in FIG. 28, the reinforcing piece 57 and the second solder pad 52 are of a one-piece structure, the reinforcing piece 57 extends from the side where the second side surface 56 is located to the side where the first side surface 55 is located from the fourth end 522 of the second solder pad 52, and an area of an orthographic projection of the reinforcing piece 57 on the second surface 502 is larger than an area of an orthographic projection of the first gap L1 on the first surface 501. By means of the one-piece structure of the reinforcing piece 57 and the first solder pad 51 or the second solder pad 52, the structural strength of the LED packaging structure is improved, and meanwhile, the contact area between the first solder pad 51 or the second solder pad 52 and the substrate main body 5 is larger. Thus, it is convenient to dissipate the heat of the structure and to mount and fix the structure.

Figure 32:
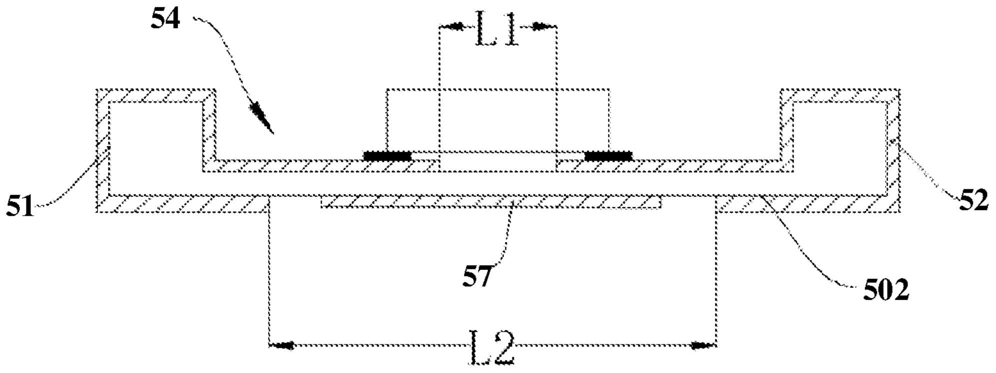
FIG. 32 is a schematic structural diagram IV of an LED bracket according to Embodiment V of the present application.

In one embodiment, referring to FIG. 32, the reinforcing piece 57 is arranged in the second gap L2, and the width of the reinforcing piece 57 is smaller than the second gap L2 to form a spacing distance with the first solder pad 51 and the second solder pad 52. The reinforcing piece 57 is attached to the second surface 502, and the area of the orthographic projection of the reinforcing piece on the second surface 502 is larger than the area of the orthographic projection of the first gap L1 on the first surface 501. The reinforcing piece 57 may be made of a metal material such as copper or a non-metal material having a certain structural strength such as ceramic, etc. Optionally, the reinforcing piece 57 is detachably connected to the second surface 502. The reinforcing piece 57 is arranged in the second gap L2, such that the problem that the substrate main body 5 is easy to bend and break at the first gap L1 due to a small thickness can be avoided, and the reinforcing piece 57 is independent from the first solder pad 51 and the second solder pad 52, and thus can be flexibly mounted as needed.

In one embodiment, referring to FIG. 26, a solder mask layer 58 is arranged on a surface of the reinforcing piece 57 facing away from the substrate main body 5. The reinforcing piece 58 and the first solder pad 51 or the second solder pad 52 are of a one-piece structure, and since the surface of the reinforcing piece 57 facing away from the substrate main body 5 is made of a conductive metal material, the solder mask layer 58 is made of a material having acid resistance, solvent resistance, and an insulating property, such as an ink layer. Therefore, the surface of the reinforcing piece 57 facing away from the substrate main body 5 is coated with the solder mask layer 58 to form a protective layer, which is beneficial to preventing the reinforcing piece 57 from corrosion due to external factors such as moisture, and the high insulation property of the solder mask layer can prevent the short circuit problem caused by the inclination of the components and the theoretical position during surface mount.

This embodiment provides a light-emitting assembly comprising a light-emitting unit manufactured by the LED bracket according to any one of the above embodiments. The light-emitting assembly may be a general lighting apparatus, such as an LED (light-emitting diode), and a high-power ceramic LED light source, and may be used in high-end markets such as road lighting, building lighting, landscape lighting, and indoor lighting. The light-emitting assembly may also be a backlight light source of display devices such as LED backlight liquid crystal televisions, and intelligent wearable devices. The LED chip packaging structure provided in this embodiment is adopted such that the thickness of the light source is relatively small, so that the thickness of the display device is reduced, and the application requirement of the ultra-thin display device is met.

This embodiment further provides a method for packaging an LED chip, which comprises manufacturing the LED chip packaging structure described in the above embodiments and packaging the LED chip with the LED chip packaging structure, which includes, but is not limited to:

forming a fourth groove 54 in the substrate main body 5. Optionally, the substrate main body 5 comprises a first surface 501 and a second surface 502 opposite to each other. Optionally, a fourth groove 54 is formed in the first surface 501 of the substrate main body 5 by laser cutting, the fourth groove 54 is recessed from the first surface 501 to the second surface 502 and does not penetrate through the second surface 502, and the fourth groove 54 divides the substrate main body 5 into two areas, namely a positive-electrode area and a negative-electrode area. Optionally, the fourth groove 54 may also be processed on the substrate main body 5 by using a depth control routing machine, or by a method of double-sided core plate pressing, or other methods.

The first solder pad 51 and the second solder pad 52 are arranged on the substrate main body 5 at an interval. Optionally, the first solder pad 51 and the second solder pad 52 are made of a metal material which is conductive or has an outer surface coated with a conductive metal coating layer. The first solder pad 51 comprises a first end 511 and a second end 512, the first end 511 is accommodated in the fourth groove 54 and connected to the bottom wall of the fourth groove 54, the second end 512 is connected to the second surface 502 of the substrate main body 5, and the first solder pad 51 extends from the first end 511 to the second end 512. Similarly, the second solder pad 52 comprises a third end 521 and a fourth end 522, the third end 521 is accommodated in the fourth groove 54, the fourth end 522 is connected to the second surface 502, and the second solder pad 52 extends from the third end 521 to the fourth end 522. Two spacing distances are formed between the first end 511 and the third end 521, and between the second end 512 and the fourth end 522, respectively.

The LED chip 53 is connected to the first solder pad 51 and the second solder pad 52. Optionally, a solder 59 may be printed in the fourth groove 54 of the substrate main body through a 3D steel mesh, the conventional solders 59 include silver paste, tin paste, soldering flux, and the like, and the opening pattern of the 3D steel mesh is designed according to the electrodes of the LED chip 53; the LED chip 53 is then placed on the solder 59. When the selected solder 59 is silver paste, the baking operation is performed, and the conditions are generally as follows: keeping the temperature at 170° C. for 1 h. When the selected solder 59 is tin paste or soldering flux, a reflow soldering operation is performed, and the conditions are generally as follows: the maximum furnace temperature is 290° C., the time is 30 s, and the process is required to be performed in a nitrogen environment to avoid the metal particles in the solder 59 from being oxidized. This step is used to connect the first electrode of the LED chip 53 to the first solder pad 51, and connect the second electrode of the LED chip 53 to the second solder pad 52 through the solder 59.

The fourth groove 54 is formed in the substrate main body 5 by laser cutting, so that the processing precision and the processing efficiency are higher, and the yield of finished products is improved. One ends of the first solder pad 51 and the second solder pad 52 are accommodated in the bottom wall of the fourth groove 54, and the first electrode and the second electrode of the LED chip 53 are respectively connected to the first solder pad 51 and the second solder pad 52 in the fourth groove 54, so that the height of the LED chip protruding out of the substrate main body 5 is reduced, and the thickness of an LED product is reduced.

Furthermore, referring to FIGS. 32 and 33, a first solder pad 51 and a second solder pad 52 are arranged on the substrate main body 5 at an interval, which is specifically as follows:

the first solder pad 51 and the second solder pad 52 are arranged symmetrically relative to the perpendicular bisector B of the bottom wall of the fourth groove 54. Optionally, the first end 511 of the first solder pad 51 and the third end 521 of the second solder pad 52 are respectively arranged on two sides of the perpendicular bisector B of the fourth groove 54, and the distance between the first end 511 and the perpendicular bisector B is equal to the distance between the third end 521 and the perpendicular bisector B, so as to achieve structural symmetry and avoid bending damage to the LED packaging structure due to uneven thickness.

A reinforcing piece 57 is arranged on the second surface 502. Optionally, two independent metal blocks or metal plates are used as the first solder pad 51 and the second solder pad 52, one ends of the first solder pad 51 and the second solder pad 52 are accommodated in the bottom wall of the fourth groove 54, a first gap L1 is formed between the first solder pad 51 and the second solder pad 52, and the other ends of the first solder pad 51 and the second solder pad 52 extend to the second surface 502. The reinforcing piece 57 is also of a metal structure, and is arranged on the second surface 502, and an orthogonal projection of the reinforcing piece on the second surface 502 completely covers an orthogonal projection of the first gap L1 on the second surface 502. The reinforcing piece 57 is provided to compensate for the disadvantage that the substrate main body 5 is too thin and flexible between the first solder pad 51 and the second solder pad 52, resulting in damage, such that the thickness of the LED packaging structure at the first gap L1 increases, thereby improving the structural strength.

Furthermore, referring to FIG. 26 to FIG. 28, a reinforcing piece 57 is arranged on the second surface 502, which includes: arranging the reinforcing piece 57 and the first solder pad 51 or the second solder pad 52 into a one-piece structure. Optionally, the substrate main body 5 comprises a first side surface 55 and a second side surface 56 opposite to each other, and when the reinforcing piece 57 and the first solder pad 51 are of a one-piece structure, the reinforcing piece 57 extends from the second end 512 of the first solder pad 51 to the fourth end 522 of the second solder pad 52 until the distance from the second end 512 to the first side surface 55 is greater than the distance from the third end 521 to the first side surface 55. When the reinforcing piece 57 and the second solder pad 52 are of a one-piece structure, the reinforcing piece 57 extends from the fourth end 522 of the second solder pad 52 to the second end 512 of the first solder pad 51 until the distance from the fourth end 522 to the second side surface 56 is greater than the distance from the first end 511 to the second side surface 56.

Optionally, in other embodiments, the reinforcing piece 57 is a structure made of a single metal block or other materials having a certain structural strength, and the reinforcing piece 57 is glued or welded to the first solder pad 51 or the second solder pad 52.

Optionally, the reinforcing piece 57 is arranged at a distance from each of the first solder pad 51 and the second solder pad 52, and an orthographic projection of the reinforcing piece 57 on the second surface 502 completely covers an orthographic projection of the first gap L1 on the second surface 502.

The arrangement of the reinforcing piece 57 on the second surface 502 may avoid the problem that the substrate main body 5 is easily damaged due to an excessively thin thickness at the first gap L1.

Figure 33:
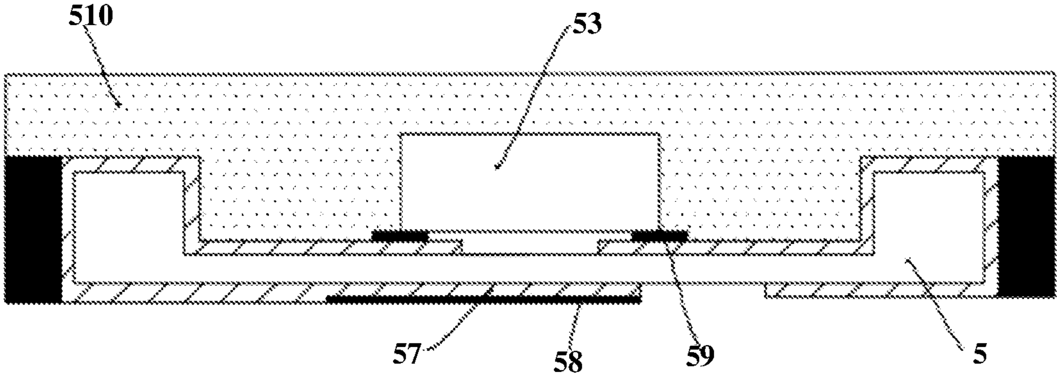
FIG. 33 is a schematic structural diagram of a light-emitting unit according to Embodiment V of the present application.

In some examples, referring to FIG. 26 and FIG. 33, after a reinforcing piece 57 is arranged on the second surface 502, the method may further include: a solder mask layer 58 is arranged on the surface of the reinforcing piece 57 facing away from the substrate main body 5. Optionally, when the reinforcing piece 57 and the negative-electrode solder pad of the LED packaging structure are of a one-piece structure, the surface of the reinforcing piece 57 facing away from the substrate main body 5 is coated with a liquid photo-solder mask, the liquid photo-solder mask may be solder mask ink of any color such as green, red and white, the solder mask ink is in a viscous state before use, and the solder mask layer 58 is formed after printing, pre-baking, aligning, exposing, developing, and curing, so as to completely cover the surface of the reinforcing piece 57 facing away from the substrate main body 5. The solder mask layer 58 has the advantages of corrosion resistance, high temperature resistance and high insulation, so that the LED packaging structure is well protected, and the problem that short circuits of components are prone to occurring is avoided due to the high insulation thereof.

In some examples, referring to FIG. 33, after arranging a solder mask layer 58 on the surface of the reinforcing piece 57 facing away from the substrate main body 5, the method may further include: performing packaging and cutting. Optionally, the prepared epoxy resin fluorescent adhesive cake 510 is first placed in a die pressing machine, corresponding parameters are adjusted, and the preheated and cleaned semi-finished product is subjected to a packaging process. After the plastic package is completed and the baking operation is performed, the cutting machine uses blades having a corresponding thickness to perform corresponding cutting treatment on the whole substrate main body 5, and finally the required product is obtained.

Embodiment VI

Figure 34:
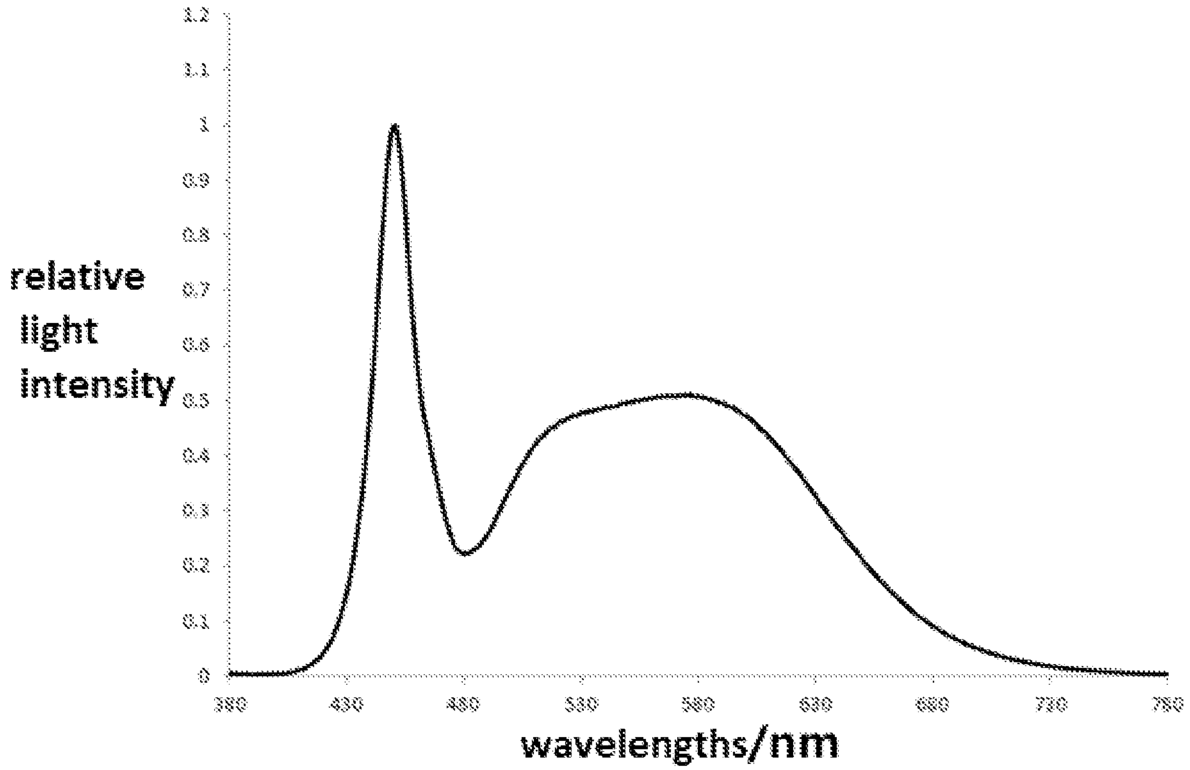
FIG. 34 is a schematic diagram I of an existing normalized spectrogram according to Embodiment VI of the present application.
Figure 35:
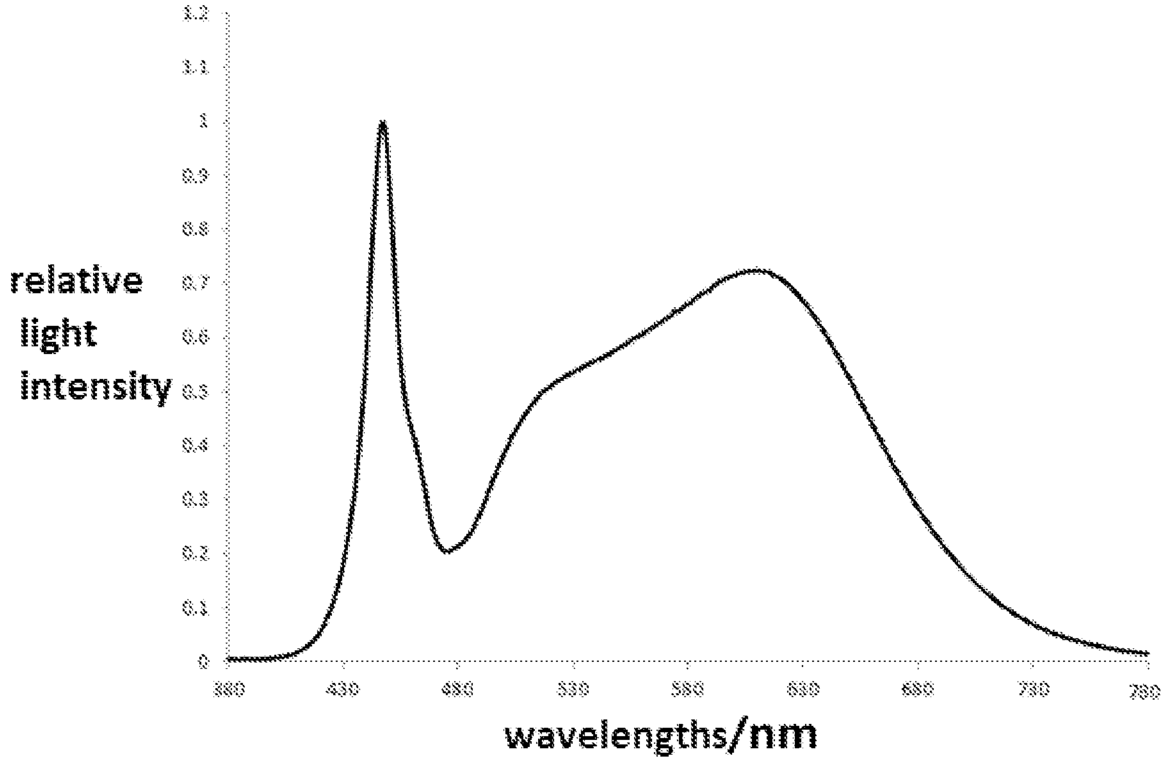
FIG. 35 is a schematic diagram II of an existing normalized spectrogram according to Embodiment VI of the present application.

The fresh lighting lamp is a new generation special lighting specially designed for fresh food, and can highlight the color characteristics of the fresh food, thereby stimulating the purchase desire of people. The spectrum of the fresh lighting lamp in the current market mainly adopts common white light or monochromatic light mixing, and does not consider refined color management and differential special scientific adjustment corresponding to the color reducing capability of different illuminated objects. The common fresh lighting lamps in the market generally adopt the solution of white lamp beads+red lamp beads, and thus the light mixing effect thereof is relatively poor. The solution of blue light chip+green fluorescent powder+red fluorescent powder is also adopted, the normalized spectra of the excited white light for the fresh food are shown in FIG. 34 or FIG. 35, the wavelengths corresponding to the wave crests of the red wavebands in the two normalized spectrograms are both lower than 600 nm, the penetrability of red light is insufficient, the fresh lighting color is distorted, and the reduction degree of the color of the fresh meat is low. Moreover, the relative optical power (i.e., relative light intensity) of the red waveband crests in the two normalized spectrograms is lower than 0.75, and the red development effect for the fresh food is relatively poor. Moreover, the red waveband is connected with the green waveband, so that yellow light is easily generated. The yellow light may influence the requirement of the fresh meat on the red saturation, and then the dark brown will be presented to consumers and mislead the consumers, which is a common problem that the existing fresh lighting lamps generally have.

For the above problems, this embodiment provides two kinds of light-emitting units that are applicable, but are not limited to, the fresh lighting lamps. The light-emitting units have a better color reduction for fresh food, can reduce the formation of yellow light to a certain extent, and thus avoids the yellow light to influence the requirement of the fresh meat on red saturation, so as to further improve the color reduction degree of fresh lighting and to avoid presenting the dark brown that influences the purchase desire of people. Also, the light-emitting units have the advantages of being able to present the red color matching fresh meat, etc. The light-emitting unit provided in this embodiment can be applied to various fresh lighting devices, for example, but not limited to, lighting of fresh meat such as fresh pork and fresh beef. The fresh lighting device may be selected as a fresh lighting lamp or an electronic device such as a refrigerator, a freezer and the like having the fresh lighting function. For ease of understanding, this embodiment exemplifies two kinds of light-emitting units.

Figure 36:
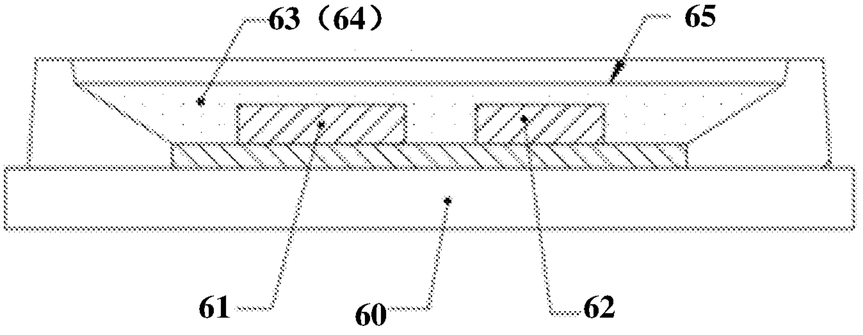
FIG. 36 is a schematic structural diagram I of a light-emitting unit according to Embodiment VI of the present application.
Figure 37:
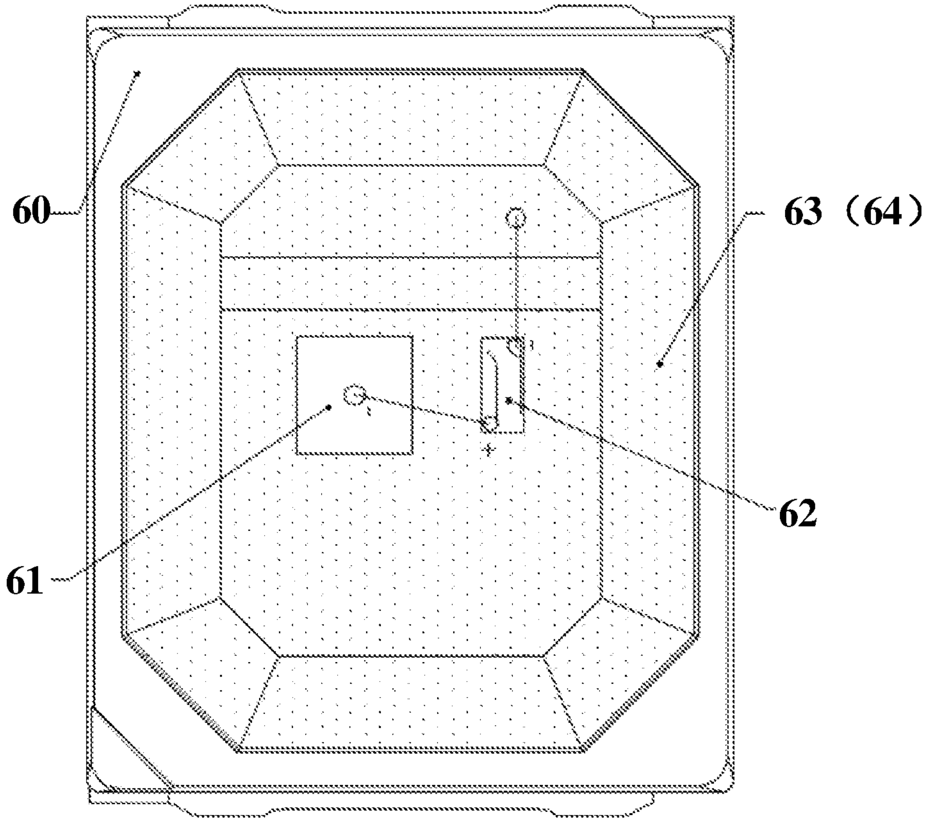
FIG. 37 is a top view of the light-emitting unit of FIG. 36.

An exemplary light-emitting unit is shown in FIGS. 36 and 37, comprising an LED bracket 60 (the LED bracket shown in the above embodiments may be selected, or other structures may be selected, and this embodiment is not limited thereto), a red LED chip 61, a blue LED chip 62, and a packaging layer, wherein the packaging layer comprises a green medium 63. The LED bracket 60 has a substrate, the red LED chip 61 and the blue LED chip 62 are both arranged on the substrate, and the green medium 63 covers the red LED chip 61 and the blue LED chip 62. The red LED chip 61 and the blue LED chip 62 excite the green medium 63 to emit white light. In addition, the normalized spectrogram of the emitted white light satisfies the following conditions: the normalized spectrogram comprises a first red waveband and a green waveband, wherein a half-wave width of the first red waveband is 15 nm-30 nm, a wave crest of the first red waveband is a first wave crest, a relative optical power corresponding to the first wave crest is 0.9-1, and a wavelength corresponding to the first wave crest is 645 nm-665 nm.

Optionally, the red LED chip 61 may be selected in a vertical structure or a horizontal structure, and likewise, the blue LED chip 62 may be selected in a vertical structure or a horizontal structure. The red LED chip 61 and the blue LED chip 62 are fixed onto the bottom of the LED bracket 60 through a bonding adhesive, and are baked for 1-2 h at 150° C., such that the bonding adhesive is completely cured. If the chip is a chip with a horizontal structure, the transparent silicon resin bonding adhesive is adopted; if the chip is a chip with a vertical structure, the silicon resin silver-doped bonding adhesive is adopted. Bonding wires are needed to be arranged between the red LED chip 61 and the LED bracket 60 and between the blue LED chip 62 and the LED bracket 60, the bonding wires are generally 0.9 mil 80% Au, and an M or S wire arc process may be selected. The arrangement and connection mode of the bonding wires are determined according to the structure of the LED bracket 60, and the structural matching of the red LED chip 61 and the blue LED chip 62, and it is only necessary to complete the conduction of the circuit. Preferably, the red LED chip 61 with a vertical structure and the blue LED chip 62 with a horizontal structure are adopted, and the bracket, the blue LED chip 62 and the red LED chip 61 are sequentially connected via bonding wires.

Figure 38:
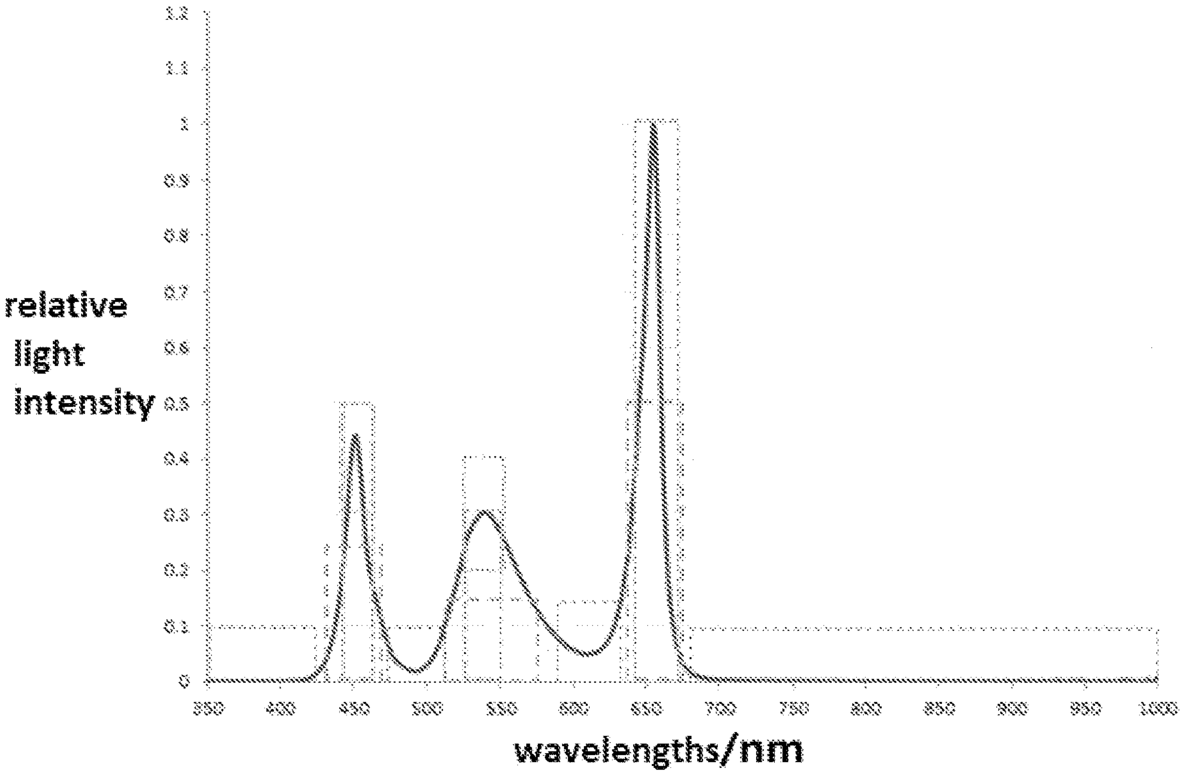
FIG. 38 is a schematic diagram I of a modified normalized spectrogram according to Embodiment VI of the present application.

Referring to FIG. 38, the normalized spectrogram of white light satisfies the following conditions:

The normalized spectrogram comprises a first red waveband, and the half-wave width of the first red waveband is 15 nm-30 nm. Specifically, the half-wave width of the first red waveband may be selected from 15 nm, 18 nm, 24 nm, 27 nm, 30 nm and the like, preferably 30 nm, and the half-wave range is 640 nm to 670 nm.

The wave crest of the first red waveband is a first wave crest, the relative optical power corresponding to the first wave crest is 0.9-1, and the wavelength corresponding to the first wave crest is 645 nm-665 nm. Specifically, the relative optical power (i.e., relative light intensity) corresponding to the first wave crest is 0.9, 0.92, 0.95, 0.99, 1, etc., preferably 1. The wavelength corresponding to the first wave crest may be selected from 645 nm, 651 nm, 654 nm, 659 nm, 665 nm, etc., preferably 660 nm.

By means of the solution that the red LED chip 61 and the blue LED chip 62 excite the green medium 63, the half-wave width of the first red waveband excited is 15 nm-30 nm, such that the energy is comparatively concentrated, and red light saturation is relatively high; in addition, the wavelength of the first wave crest of the first red waveband is 650 nm-670 nm, such that red light penetrating power is relatively strong, and the color reduction of the fresh meat is relatively good, and meanwhile, the relative optical power corresponding to the first wave crest of the first red waveband is 0.9-1, such that the red development effect for the fresh food is relatively good. Moreover, the first red waveband of the above parameters can reduce the formation of yellow light to a certain extent, thus avoids the yellow light to influence the requirement of the fresh meat on red saturation, so as to further improve the color reduction degree of fresh lighting and to avoid presenting the dark brown that influences the purchase desire of people, and can also present the red color matching fresh meat.

In one embodiment, referring to FIG. 38, the normalized spectrogram further comprises a green waveband. The half-wave width of the green waveband is 35 nm-60 nm. Specifically, the half-wave width of the green waveband may be selected from 35 nm, 41 nm, 48 nm, 53 nm, 57 nm, 60 nm, etc., preferably 60 nm, and the half-wave range is 510 nm-570 nm. By the setting of the half-wave width of the green waveband between 35 nm and 60 nm, the green waveband cannot influence the color development effect of the white fresh meat, and cannot influence the color development effect of the red fresh meat. It can be understood that if the half-wave width of the green waveband is below 35 nm, the process cost is high, the color is easy to be out of order, the white color is easy to distort, and the color reduction of the white part of the fresh meat is not facilitated, and if the half-wave width of the green waveband is more than 60 nm, the proportion of white light occupied by the green waveband is too large, red light is easily influenced, red color is easily distorted, and the color development of red parts of fresh meat is not facilitated.

The wave crest of the green waveband is a second wave crest, a relative optical power corresponding to the second wave crest is 0.2-0.4, and a wavelength corresponding to the second wave crest is 530 nm-550 nm. Specifically, the relative optical power corresponding to the second wave crest may be selected from 0.2, 0.24, 0.29, 0.34, 0.38, 0.4, etc. The wavelength corresponding to the second wave crest may be selected from 530 nm, 532 nm, 538 nm, 544 nm, 550 nm, etc., preferably 540 nm. By the setting of the relative optical power of the second wave crest between 0.2 and 0.4, the white color development is not influenced, and also the red color development is relatively good, which is beneficial to avoiding fresh lighting color distortion. The wavelength corresponding to the second wave crest is 530 nm-550 nm, and the distance between the second wave crest and the first wave crest of the first red waveband is relatively large, so that the red light color development is not easily influenced.

In one embodiment, referring to FIG. 38, the normalized spectrogram further comprises a yellow waveband, wherein the wavelength corresponding to the yellow waveband ranges from 585 nm to 630 nm, and the relative optical power of the yellow waveband is lower than 0.15. Specifically, the left side of the yellow waveband is connected with the green waveband, and the right side thereof is connected with the red waveband. The yellow waveband is concave, i.e., the relative optical power corresponding to the left side and the right side of the yellow waveband is higher than the relative optical power corresponding to the middle part. By setting of the relative optical power of the yellow waveband of lower than 0.15, the generation of yellow light is further reduced, the yellow light cannot influence the requirement of the fresh meat on the red saturation, such that the appearance of the dark brown is avoided, which is beneficial to presenting the red color matching fresh meat.

In one embodiment, referring to FIG. 38, the normalized spectrogram further comprises a blue waveband, and the half-wave width of the blue waveband is 15 nm-30 nm. Specifically, the half-wave width of the blue waveband may be selected from 15 nm, 17 nm, 19 nm, 22 nm, 26 nm, 29 nm, 30 nm, etc., preferably 15 nm, and the half-wave range is 435 nm-465 nm. By meeting the requirement that the half-wave width of the blue waveband is 15 nm-30 nm, the blue waveband can produce white light meeting the requirements of the fresh food and can also not influence the red color development of the fresh food. It can be understood that when the half-wave width of the blue waveband is below 15 nm, the processing is difficult and the requirement for the wafer substrate is high. When the half-wave width of the blue waveband is more than 30 nm, the overall brightness of the wafer is greatly reduced, and white light is easily out of order to present a miserable white color, which is not beneficial to presenting the freshness effect of the white part.

The wave crest of the blue waveband is a third wave crest, the relative optical power corresponding to the third wave crest is 0.3-0.5, and the wavelength corresponding to the third wave crest is 445 nm-455 nm. Specifically, the relative optical power of the third wave crest may be selected from 0.3, 0.34, 0.39, 0.44, 0.5, etc. The wavelength corresponding to the third wave crest may be selected from 445 nm, 447 nm, 449 nm, 451 nm, 452 nm, 454 nm, 455 nm, etc., preferably 450 nm. By the setting of the relative optical power of the third wave crest of 0.3-0.5, the white color development is not influenced, and also the red color development is relatively good, which is beneficial to avoiding fresh lighting color distortion. The wavelength corresponding to the second wave crest is 445 nm-455 nm, so that white light meeting the freshness requirement of the white part can be produced well.

It can be understood that the relative optical power corresponding to the first wave crest of the red waveband is 0.9-1, the relative optical power corresponding to the green waveband is 0.2-0.4, and the relative optical power corresponding to the third wave crest of the blue waveband is 0.3-5, which is convenient to define the spectral radiance distribution accurately.

In one embodiment, referring to FIG. 38, the normalized spectrogram further comprises a cyan waveband, the wavelength of the cyan waveband ranges from 465 nm to 515 nm, and the relative optical power of the cyan waveband is lower than 0.1. Specifically, the left side of the cyan waveband is connected with the blue waveband, and the right side thereof is connected with the green waveband. The cyan waveband is concave, i.e., the relative optical power corresponding to the left side and the right side of the cyan waveband is higher than the relative optical power corresponding to the middle part. By the setting of the relative optical power of the cyan waveband of lower than 0.1, the generation of cyan light is reduced, and the cyan light cannot influence the presentation of the freshness of the red color and the white color, which is beneficial to improving the freshness effect of the fresh meat.

In one embodiment, referring to FIG. 38, the normalized spectrogram further comprises a purple waveband, wherein the wavelength corresponding to the purple waveband ranges from 350 nm to 420 nm, and the relative optical power of the purple waveband is lower than 0.1. Specifically, the purple waveband is connected with the left side of the blue waveband. The purple waveband decreases (substantially unchanged after decreasing to a certain degree) with a decrease in the corresponding wavelength. By meeting the requirement that the relative optical power of the purple waveband is lower than 0.1, the probability of presenting a miserable white color is reduced, and thus the freshness effect of the white part can be improved.

In one embodiment, referring to FIG. 38, the normalized spectrogram further comprises a second red waveband adjacent to the first red waveband, the wavelength corresponding to the second red waveband ranges from 680 nm to 780 nm, and the relative optical power of the second red waveband is lower than 0.1. Specifically, the left side of the second red waveband is connected with the first red waveband. The relative optical power of the second red waveband is lower than 0.1, so that the red light saturation is improved, and then the freshness effect of the red part is improved.

In one embodiment, referring to FIGS. 36 and 37, the green medium 63 is made of a material comprising P-Sialon, the blue LED chip 62 is made of a material comprising gallium nitride (GaN), and the red LED chip 61 is made of a material comprising aluminum gallium indium phosphide (AlGaInP). It can be understood that the above materials can determine the half-wave widths and the wavelength positions corresponding to the wave crests of the red waveband, the blue waveband and the green waveband, which is beneficial to obtaining the white light in accordance with the normalized spectrogram provided in the embodiments of the present invention.

In one embodiment, the light-emitting unit further comprises a packaging colloid 64 filling the bowl portion 65, and a mixing ratio of the green medium 63 to the packaging colloid 64 ranges from 1:12 to 1:2. Specifically, the mixing ratio of the green medium 63 to the packaging colloid 64 may be selected from 1:12, 1:11, 1:10.5, 1:8, 1:6.5, 1:4.5, 1:3, 1:2, etc. The packaging colloid 64 and the green medium 63 are oscillated by a stirrer to be uniformly mixed, the stirring condition may be 200 s-400 s, and the speed is 1000 n/min-2000 n/min. Through the setting, uniform mixing of the packaging colloid 64 and the green medium 63 is facilitated. In addition, after the mixture of the packaging colloid 64 and the green medium 63 is encapsulated in the bowl portion 65 of the LED bracket 60, the mixture is cured by baking for 3-4 h at 150° C. to complete packaging. It can be understood that by meeting the mixing ratio of the green medium 63 to the packaging colloid 64 of 1:12-1:2, it is advantageous to adjust the heights (relative optical powers) of the first wave crest, the second wave crest and the third wave crest to further define the spectral radiance distribution accurately.

In one embodiment, in a CIE1931 (also called CIE1931 color space) chromaticity diagram, a distribution range of the white light on an X axis is 0.31-0.39, a distribution range of the white light on a Y axis is 0.3-0.4, and a color temperature of the white light ranges from 4000 K to 7000 K. Specifically, the color temperature may be selected from 4000 K, 4300 K, 4500 K, 4900 K, 5120 K, 5870 K, 6370 K, 700 K, etc. By meeting the requirement that the color temperature of the white light is 4000 K-7000 K, the freshness effect of the light-emitting unit provided in the embodiment of the present invention is fully embodied, and meanwhile, light rays are relatively easy to adapt to human eyes, so that the problem of dazzling or over-darkness is avoided. Moreover, the CIE1931 distribution of the white light is reasonable, and thus the freshness effect is favorably improved.

Figure 39:
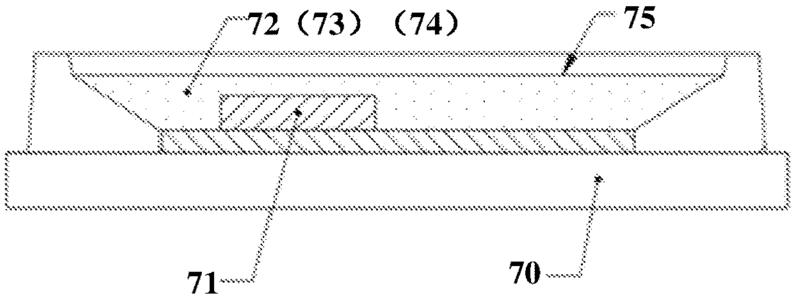
FIG. 39 is a schematic structural diagram II of a light-emitting unit according to Embodiment VI of the present application.
Figure 40:
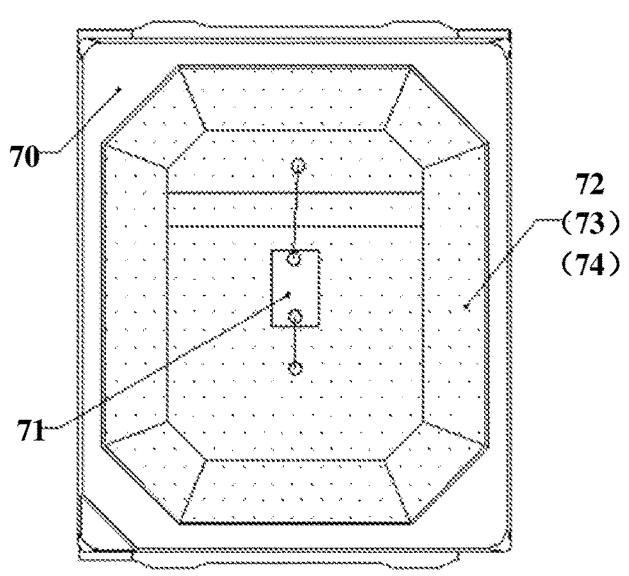
FIG. 40 is a top view of the light-emitting unit of FIG. 39.

Another exemplary light-emitting unit is shown in FIGS. 39 and 40, which comprises an LED bracket 70, a blue LED chip 71, a red medium 72, and a green medium 73. The LED bracket 70 is provided with a bowl portion 75, the blue LED chip 71 is arranged in the bowl portion 75, and the red medium 72 and the green medium 73 are mixed and fill the bowl portion 75 and cover the blue LED chip 71. The blue LED chip 71 excites the red medium 72 and the green medium 73 to emit white light.

Optionally, the blue LED chip 71 in this example may be selected from a normal structure and a flip-chip structure. For example, if it is of a normal structure, the blue LED chip 71 may be fixed onto the LED bracket 70 by a bonding adhesive, and baked at 150° C. for 1-2 h to completely cure the bonding adhesive. If it is of a flip-chip structure, the blue LED chip 71 may be fixed onto the LED bracket 70 by high-temperature tin paste, and is subjected to reflow soldering at a maximum furnace temperature of 290° C. with a time of about 30 s under a nitrogen environment, such that the solder is completely melted and completely attached to the blue LED chip 71 and the LED bracket 70. Moreover, if the blue LED chip 71 is of a normal structure, a wire bonding process is also required, where the bonding wire is usually 0.9 mil 80% Au, and an S or M wire arc process is adopted. The arrangement and connection mode of the bonding wires are determined according to the structure of the LED bracket 70 and the structural matching of the blue LED chip 71, and it is only necessary to complete the conduction of the circuit.

Figure 41:
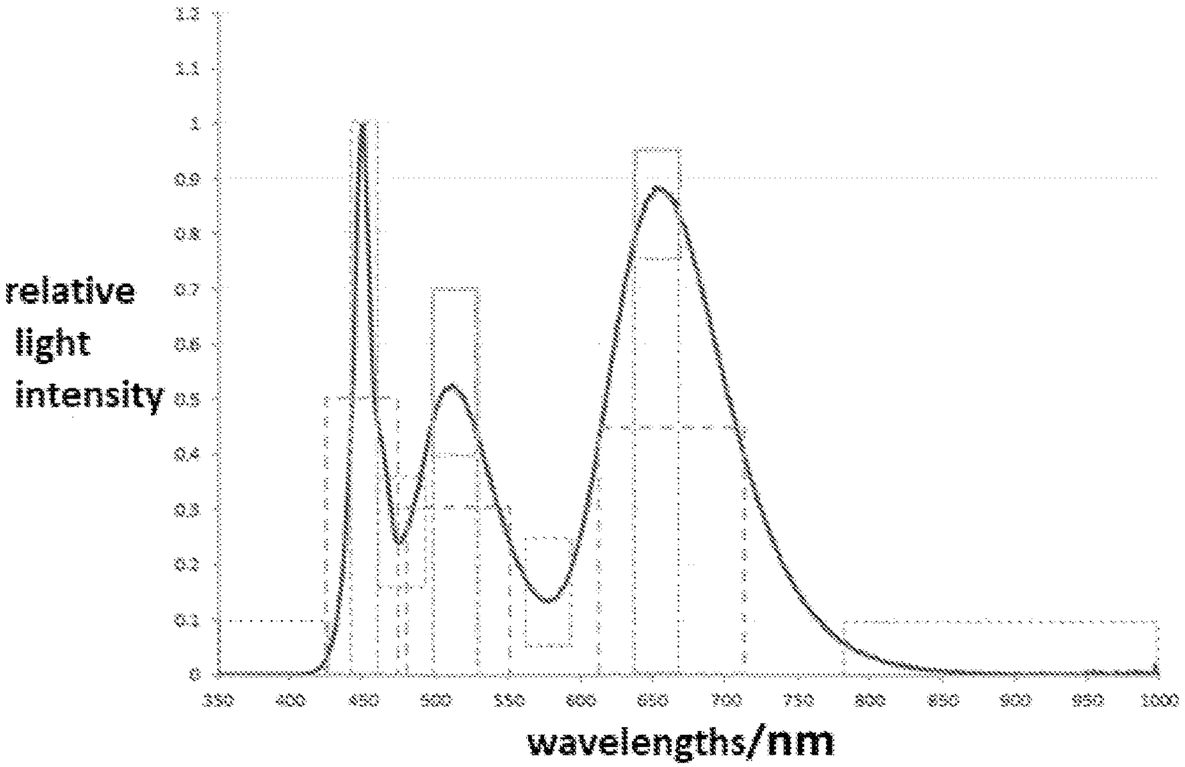
FIG. 41 is a schematic diagram II of a modified normalized spectrogram according to Embodiment VI of the present application.

Referring to FIG. 41, the normalized spectrogram of white light in this example satisfies the following conditions:

the spectrogram comprises a red waveband and a green waveband, wherein a half-wave width of the red waveband is 80 nm-100 nm, a wave crest of the red waveband is a first wave crest, a relative optical power corresponding to the first wave crest is 0.75-0.95, a wavelength corresponding to the first wave crest is 645 nm-665 nm, a half-wave width of the green waveband is 45 nm-70 nm, a wave crest of the green waveband is a second wave crest, and a wavelength corresponding to the second wave crest is 500 nm-520 nm. Specifically, the half-wave width of the red waveband may be selected from 80 nm, 84 nm, 86 nm, 89 nm, 94 nm, 96 nm, 100 nm, etc., preferably 100 nm, and the half-wave range is 610 nm-710 nm. The relative optical power corresponding to the first wave crest may be selected from 0.75, 0.79, 0.84, 0.89, 0.93, 0.95, etc. The wavelength corresponding to the first wave crest may be selected from 645 nm, 646 nm, 649 nm, 653 nm, 659 nm, 663 nm, 665 nm, etc., preferably 660 nm. The half-wave width of the green waveband may be selected from 45 nm, 46 nm, 49 nm, 53 nm, 55 nm, 61 nm, 67 nm, 69 nm, 70 nm, etc., preferably 70 nm, and the half-wave range is 480 nm-550 nm. The wavelength corresponding to the second wave crest may be selected from 500 nm, 503 nm, 509 nm, 511 nm, 516 nm, 519 nm, 520 nm, etc.

It can be understood that if the half-wave width of the green waveband is below 45 nm, the process cost is high, the color is easy to be out of order, and the white color is easy to distort, so that the color reduction of the white part of the fresh meat is not facilitated; if the half-wave width of the green waveband is above 70 nm, the proportion of white light occupied by the green waveband is too large, interference with red light is generated, and the red color is easy to distort, so that the color development of the red part of the fresh meat is not facilitated. By means of the solution that the blue LED chip 71 excites the red medium 72 and the green medium 73, the wavelength corresponding to the first wave crest of the excited red waveband is 645 nm-665 nm, such that the red light penetrating power is relatively strong, and the color reduction of the fresh food is relatively good; the relative optical power corresponding to the first wave crest is 0.75-0.95, such that the red development effect is relatively good. Meanwhile, the wavelength corresponding to the second wave crest of the green waveband is 500 nm-520 nm, the half-wave width of the green waveband is 45 nm-70 nm, the green waveband is not easy to interfere with the red waveband and is not easy to generate yellow light, the yellow light is prevented from influencing the requirement of fresh meat on red saturation, so as to further improve the color reduction degree of fresh lighting and to avoid presenting the dark brown that influences the purchase desire of people, and can also present the red color matching fresh meat.

In one embodiment, referring to FIG. 41, the relative optical power corresponding to the second wave crest is 0.4-0.7. Specifically, the relative optical power corresponding to the second wave crest may be selected from 0.4, 0.5, 0.6, 0.7, etc. By the setting of the relative optical power of the second wave crest of 0.4-0.7, the red color is prevented from distortion due to too high green light saturation, and the white color is prevented from distortion due to too low green light saturation.

In one embodiment, referring to FIG. 41, the normalized spectrogram further comprises a yellow waveband, wherein the wavelength corresponding to the yellow waveband ranges from 560 nm to 590 nm, and the relative optical power of the yellow waveband is 0.05-0.25. Specifically, the left side of the yellow waveband is connected with the green waveband, and the right side thereof is connected with the red waveband. The yellow waveband is concave, i.e., the relative optical power corresponding to the left side and the right side of the yellow waveband is higher than the relative optical power corresponding to the middle part. By setting of the relative optical power of the yellow waveband of 0.05-0.25, the generation of yellow light is further reduced, the yellow light cannot influence the requirement of the fresh meat on the red saturation, such that the appearance of the dark brown is avoided, which is beneficial to presenting the red color matching fresh meat.

In one embodiment, referring to FIG. 41, the normalized spectrogram further comprises a blue waveband, and the half-wave width of the blue waveband is 15 nm-30 nm. Specifically, the half-wave width of the blue waveband may be selected from 15 nm, 17 nm, 19 nm, 22 nm, 26 nm, 29 nm, 30 nm, etc., preferably 15 nm, and the half-wave range is 435 nm-465 nm. By meeting the requirement that the half-wave width of the blue waveband is 15 nm-30 nm, the blue waveband can produce white light meeting the requirements of the fresh food and can also not influence the red color development of the fresh food. It can be understood that when the half-wave width of the blue waveband is below 15 nm, the processing is difficult and the requirement for the wafer substrate is high. When the half-wave width of the blue waveband is more than 30 nm, the overall brightness of the wafer is greatly reduced, and white light is easily out of order to present a miserable white color, which is not beneficial to presenting the freshness effect of the white part.

The wave crest of the blue waveband is a third wave crest, the relative optical power corresponding to the third wave crest is 0.9-1, and the wavelength corresponding to the third wave crest is 445 nm-455 nm. Specifically, the relative optical power of the third wave crest may be selected from 0.9, 0.91, 0.93, 0.96, 0.98, 1, etc., preferably 1. The wavelength corresponding to the third wave crest may be selected from 445 nm, 447 nm, 449 nm, 451 nm, 452 nm, 454 nm, 455 nm, etc., preferably 450 nm. By the setting of the relative optical power of the third wave crest of 0.9-1, the white color development is not influenced, and also the red color development is relatively good, which is beneficial to avoiding fresh lighting color distortion. The wavelength corresponding to the third wave crest is 445 nm-455 nm, so that white light meeting the freshness requirement of the white part can be produced well.

It can be understood that the relative optical power corresponding to the first wave crest of the red waveband is 0.75-0.95, the relative optical power corresponding to the green waveband is 0.4-0.7, and the relative optical power corresponding to the third wave crest of the blue waveband is 0.9-1, which is convenient to define the spectral radiance distribution accurately.

In one embodiment, referring to FIG. 41, the normalized spectrogram further comprises a cyan waveband, the wavelength of the cyan waveband ranges from 460 nm to 490 nm, and the relative optical power of the cyan waveband is 0.15-0.35. Specifically, the left side of the cyan waveband is connected with the blue waveband, and the right side thereof is connected with the green waveband. The cyan waveband is concave, i.e., the relative optical power corresponding to the left side and the right side of the cyan waveband is higher than the relative optical power corresponding to the middle part. By the setting of the relative optical power of the cyan waveband of 0.15-0.35, the generation of cyan light is reduced, and the cyan light cannot influence the presentation of the freshness of the red color and the white color, which is beneficial to improving the freshness effect of the fresh meat.

In one embodiment, referring to FIG. 41, the normalized spectrogram further comprises a purple waveband, wherein the wavelength corresponding to the purple waveband ranges from 350 nm to 420 nm, and the relative optical power of the purple waveband is lower than 0.1. Specifically, the purple waveband is connected with the left side of the blue waveband. The purple waveband decreases (substantially unchanged after decreasing to a certain degree) with a decrease in the corresponding wavelength. By meeting the requirement that the relative optical power of the purple waveband is lower than 0.1, the probability of presenting a miserable white color is reduced, and thus the freshness effect of the white part can be improved.

In one embodiment, referring to FIG. 41, the normalized spectrogram further comprises an infrared waveband adjacent to the red waveband, the wavelength corresponding to the infrared waveband is greater than 780 nm, and the relative optical power of the infrared waveband is lower than 0.1. Specifically, the left side of the infrared waveband is connected with the red waveband. The relative optical power of the infrared waveband is lower than 0.1, so that the red light saturation is improved, and then the freshness effect of the red part is improved.

In one embodiment, referring to FIG. 41, the red medium 72 is made of a material comprising nitride, the green medium 73 is made of a material comprising P-Sialon and/or silicate, and the blue LED chip 71 is made of a material comprising gallium nitride (GaN). Specifically, the green medium 73 may comprise only one of P-Sialon and silicate, or both of P-Sialon and silicate. It can be understood that the above materials can determine the half-wave widths and the wavelength positions corresponding to the wave crests of the red waveband, the blue waveband and the green waveband, which is beneficial to obtaining the white light in accordance with the normalized spectrogram provided in the embodiments of the present invention.

In one embodiment, referring to FIG. 41, the ratio of the red medium 72 to the green medium 73 ranges from 1:13 to 1:4. Specifically, the ratio of the red medium 72 to the green medium 73 may be selected from 1:13, 1:12, 1:9, 1:7, 1:6, 1:5, 1:4.5, 1:4, etc. By adapting the mixing ratio of the red medium 72 to the green medium 73, it is advantageous to adjust the heights (relative optical powers) of the first wave crest, the second wave crest and the third wave crest, which is convenient to define the spectral radiance distribution accurately.

In one embodiment, referring to FIG. 41, the light-emitting unit further comprises a packaging colloid 50 filling the bowl portion 75. The mixing ratio of the mixture of the red medium 72 and the green medium 73 to the packaging colloid 50 ranges from 1:8 to 1:1.8. Specifically, the ratio of the mixture of the red medium 72 and the green medium 73 to the packaging colloid 50 may be selected from 1:8, 1:7, 1:6, 1:5.5, 1:5, 1:4.5, 1:3, 1:2, 1:1.8, etc. The mixture of the red medium 72 and the green medium 73 as well as the packaging colloid are oscillated by a stirrer to be uniformly mixed, the stirring condition may be 200 s-400 s, and the speed is 1000 n/min-2000 n/min. Through the setting, uniform mixing of the packaging colloid 50 and the green medium 73 is facilitated. In addition, after the mixture of the packaging colloid 50 and the green medium 73 is encapsulated in the bowl portion 75 of the LED bracket 70, the mixture is cured by baking for 3-4 h at 150° C. to complete packaging. It can be understood that by meeting the mixing ratio of the green medium 73 to the packaging colloid 50 of 1:12-1:2, it is advantageous to adjust the heights of the first wave crest, the second wave crest and the third wave crest, which is beneficial to further defining the spectral radiance distribution accurately.

In one embodiment, in the CIE1931 chromaticity diagram, the distribution range of the white light on an X axis is 0.32-0.38, the distribution range of the white light on a Y axis is 0.275-0.34, and the color temperature of the white light ranges from 4000 K to 6200 K. Specifically, the color temperature may be selected from 4000 K, 4230 K, 4500 K, 4900 K, 5120 K, 5530 K, 5870 K, 6200 K, etc. By meeting the requirement that the color temperature of the white light is 4500K-8000 K, the freshness effect of the light-emitting unit provided in the embodiment of the present invention is fully embodied, and meanwhile, light rays are relatively easy to adapt to human eyes, so that the problem of dazzling or over-darkness is avoided. Moreover, the CIE1931 chromaticity range of the white light is reasonable, and thus the freshness effect can be ensured.

Embodiment VII

Currently, the backlight module is one of the key components of a display unit, and is used for providing a light source for the display unit. The backlight module is required to be light, thin and power-saving, and have HDR (High-Dynamic Range), and all the factors require the LED light-emitting unit in the backlight module to be small in size, high in brightness, and large in light-emitting angle. In the present LED light-emitting unit, the light-emitting angle of the LED chip is limited by the LED bracket. The LED bracket limits the light-emitting angle of the LED chip, and further the overall light-emitting brightness and the light-emitting angle of the LED light-emitting unit are affected. If the light-mixing distance from the light-emitting surface of the LED chip to the light-emitting surface of the backlight module increases or the number of LEDs increases, the light-emitting brightness and the light-emitting angle are increased, and thus a light and thin display device with power saving cannot be provided. Therefore, how to increase the light-emitting angle of the LED light-emitting unit becomes the problem to be solved urgently.

In view of the above problems, this embodiment provides a light-emitting unit capable of improving the light-emitting angle, which comprises an LED chip and an LED bracket. The LED bracket in this embodiment may adopt the LED bracket shown in the above embodiments, and may also adopt other LED brackets having a bowl portion structure, which is not limited in this embodiment. The LED chip is arranged at the bottom of the bowl portion of the LED bracket, and the positive electrode and the negative electrode of the LED chip are respectively and electrically connected to the two conductive areas. The light-emitting unit further comprises a packaging layer arranged in the bowl portion, wherein the packaging layer comprises a first packaging adhesive layer and a second packaging adhesive layer sequentially filled, the first packaging adhesive layer wraps the LED chip, and one surface of the second packaging adhesive layer far away from the LED chip is in a raised spherical shape; the light emitted from the surface of the LED chip is refracted to the outside of the LED device through the first packaging adhesive layer and the second packaging adhesive layer which is in a raised spherical shape. The surface of the second packaging adhesive layer far away from the LED chip is in a raised spherical shape, such that the light-emitting angle of LED device is increased, and then the whole light-emitting angle is improved, and meanwhile, the light-emitting brightness of the LED device is also increased. For ease of understanding, this embodiment is described below in conjunction with several examples illustrated in the accompanying drawings.

Figure 42:
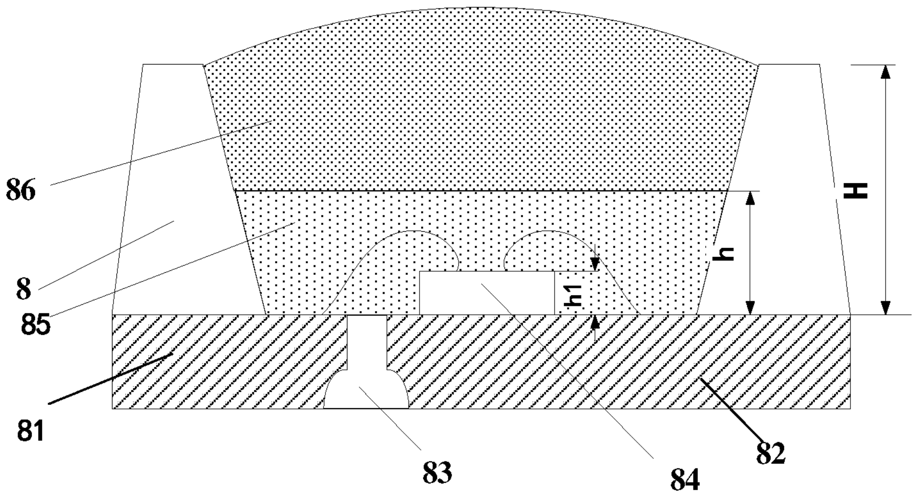
FIG. 42 is a schematic structural diagram I of a light-emitting unit according to Embodiment VII of the present application.

Referring to FIG. 42, an example of this embodiment provides a light-emitting unit, which comprises: an LED bracket 8, wherein the LED bracket 8 comprises an anode substrate 81 (namely one conductive area), a cathode substrate 82 (namely the other conductive area), an isolating area 83 for insulating and isolating the anode substrate 81 from the cathode substrate 82, and an LED chip 84; a package of the LED bracket 8 is arranged on surfaces of the anode substrate 81 and the cathode substrate 82 and encloses to form a bowl portion, and the LED chip 84 is arranged on at least one of the anode substrate 81 and the cathode substrate 82; the bowl-shaped structure formed by LED bracket 8 and the anode substrate 81 and the cathode substrate 82 is sequentially filled with a first packaging adhesive layer 85 and a second packaging adhesive layer 86, wherein the first packaging adhesive layer 85 wraps the LED chip 84, and one surface of the second packaging adhesive layer 86 far away from the LED chip 84 is in a raised spherical shape. Water vapor can be isolated through the first packaging adhesive layer and the second packaging adhesive layer 86 to protect the LED chip 84, and meanwhile, the light emitted from the LED chip 84 is refracted, reflected and diffused through the first packaging adhesive layer 85 and the second packaging adhesive layer 86, and then the light emitted from the surface of the LED chip 84 is refracted to the periphery, so that the light-emitting angle of the light-emitting unit is increased.

In this example, the second packaging adhesive layer 86 completely covers the first packaging adhesive layer 85, as shown in FIG. 42; the first packaging adhesive layer 85 and/or the second packaging adhesive layer 86 may be transparent adhesive layers formed after curing of the transparent adhesive, wherein the transparent adhesive includes, but is not limited to, epoxy resin, silica gel, silicone resin, and the like; the first packaging adhesive layer 85 and/or the second packaging adhesive layer 86 may also be a fluorescent adhesive layer formed by mixing the transparent adhesive and the fluorescent powder and then curing the mixture.

It should be understood that the anode substrate 81 and the cathode substrate 82 in this example are both conductive substrates, the conductive substrate in this embodiment may be a substrate made of various conductive materials, for example, various metal conductive substrates including, but not limited to, one of a copper substrate, an aluminum substrate, an iron substrate, a silver substrate, etc., or a conductive substrate made of a mixed material containing a conductive material, for example, conductive rubber, etc., and the LED chip 84 can be fixed onto at least one conductive substrate by using a bonding adhesive such as silver paste or insulating adhesive. The LED chip 84 may be a normal LED chip electrically connected to the substrate through a bonding wire, or a flip-chip LED chip electrically connected to the substrate by means of an eutectic technology. The light-emitting surface of the LED chip 84 is covered with reflective layers with different thicknesses, and according to different requirements, reflective layers with different materials and thicknesses may be adopted to increase the light-emitting half-power angle of the chip, so as to further increase the light-emitting angle of the light-emitting unit.

In this example, as shown in FIG. 42, the height h of the first packaging adhesive layer 85 in the bowl-shaped structure formed by the LED bracket 8 and the anode substrate 81 and the cathode substrate 82 does not exceed the height H of the package, and it should be understood that the first packaging adhesive layer 85 wraps the LED chip 84, so that the lowest height h of the first packaging adhesive layer 85 in the bowl-shaped structure exceeds the height h1 of the LED chip 84; in some application scenarios, the lowest height h of the first packaging adhesive layer 85 in the bowl-shaped structure is to cover the bonding wire, and it should be understood that it covers the LED chip 84 while covering the bonding wire; wherein the first packaging adhesive layer 85 completely covers the LED chip 84, and the light emitted from the surface of the LED chip 84 is refracted and diffused to the second packaging adhesive layer 86 and the LED bracket 8, so that the light-emitting angle of the LED chip 84 is increased.

Figure 43:
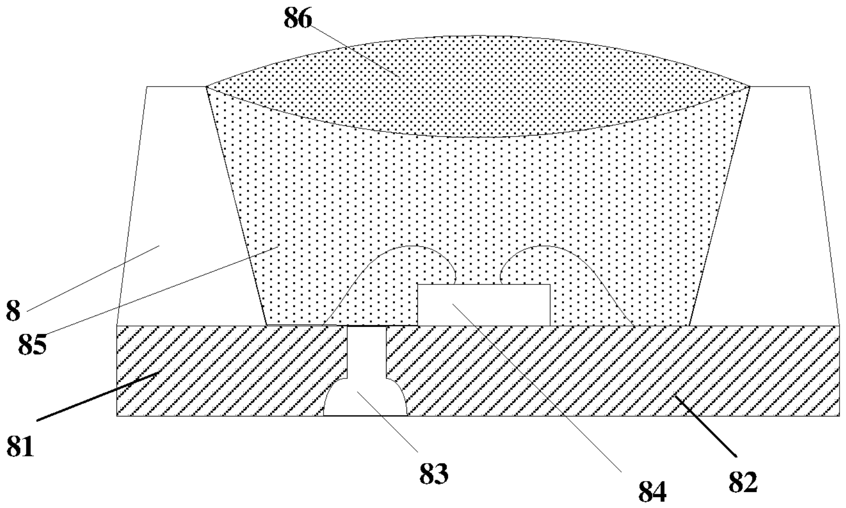
FIG. 43 is a schematic structural diagram II of a light-emitting unit according to Embodiment VII of the present application.

In another example of this embodiment, as shown in FIG. 43, the upper surface of the first packaging adhesive layer 85 is flush with the upper surface of the LED bracket.

Figure 44:
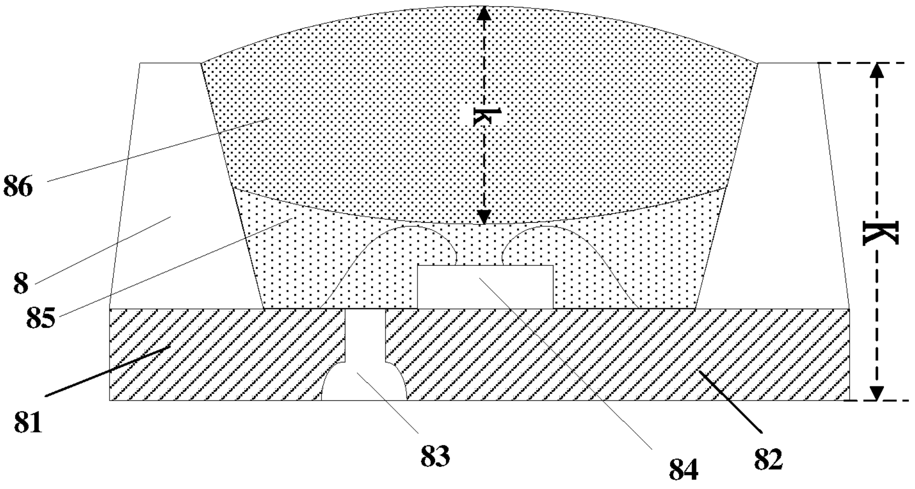
FIG. 44 is a schematic structural diagram III of a light-emitting unit according to Embodiment VII of the present application.

In some examples of this embodiment, the surface of the first packaging adhesive layer 85 far away from the LED chip 84 may be an arc surface recessed toward the LED chip 84, and the recessed arc surface of the first packaging adhesive layer 85 may change a reflection angle and a refraction angle of light, such that the light is easier to emit towards the LED bracket 8 and the second packaging adhesive layer 86, and thus the light emitted from the light-emitting unit is more uniform, as shown in FIGS. 43 and 44, and then the light-emitting angle of the light-emitting unit is increased, wherein the lowest height of the first packaging adhesive layer 85 after being recessed is flush with the LED chip 84; it should be understood that the first packaging adhesive layer 85 may be directly concave from the place where it is in contact with the LED bracket 8, or the first packaging adhesive layer 85 may be concave from the transparent bracket after keeping a horizontal shape; it should be understood that in some examples, the first packaging adhesive layer 85 is of a horizontal structure that is not recessed.

Figure 45:
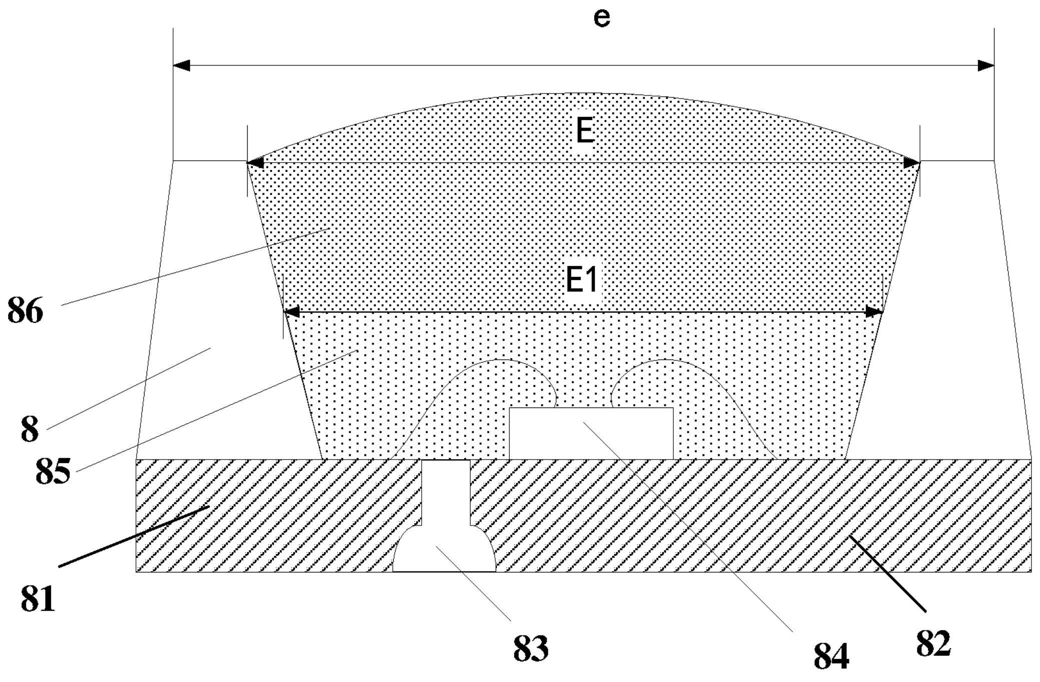
FIG. 45 is a schematic structural diagram IV of a light-emitting unit according to Embodiment VII of the present application.

In some examples of this embodiment, the width E of the second packaging adhesive layer 86 is not greater than the width e of the upper surface of the bowl-shaped structure, so that the second packaging adhesive layer 86 is limited on the bowl-shaped structure of the light-emitting unit to improve the bonding strength thereof, as shown in FIG. 45; it should be understood that the lowest width E of the second packaging adhesive layer 86 is the width E1 of the surface of the first packaging adhesive layer 85 far away from the LED chip 84, and then the second packaging adhesive layer completely covers the first packaging adhesive layer 85, wherein the first packaging adhesive layer 85 completely covers the LED chip 84, the light emitted from the surface of the LED chip 84 is refracted and diffused onto the second packaging adhesive layer 86 and the LED bracket 8, the light emitted from the LED chip 84 is refracted onto the second packaging adhesive layer 86 by the first packaging adhesive layer 85, and the light is further refracted and diffused by the second packaging adhesive layer 86, so that the light-emitting angle of the LED chip 84 is increased; it should be understood that when the first packaging adhesive layer 85 is concave, the surface of the second packaging adhesive layer 86 close to one side of the first packaging adhesive layer 85 protrudes towards the first packaging adhesive layer 85, and the protruding portion mates with the concave portion of the first packaging adhesive layer 85, as shown in FIGS. 43 and 44.

It should be understood that one surface of the second packaging adhesive layer 86 far away from the LED chip 84 is in a raised spherical shape, which forms a convex lens shape and can diffuse light, so as to increase the light-emitting angle of the light-emitting unit; wherein, the height of the second packaging adhesive layer 86 is not limited; namely the radian of the second packaging adhesive layer 86 protruding outward is not limited, and preferably, as shown in FIG. 44, the height k of the second packaging adhesive layer 86 does not exceed the height K of the LED bracket 8, so that the outward convex radian of the second packaging angle is within a reasonable range. In some examples of this embodiment, the refractive index of the first packaging adhesive layer 85 is higher than the refractive index of the second packaging adhesive layer 86, and the refractive index of the second packaging adhesive layer 86 is higher than the air refractive index, so that the light emitted from the LED chip 84 is refracted by the first packaging adhesive layer 85 and reaches the second packaging adhesive layer 86, and then the light is refracted by the second packaging adhesive layer 86 and reaches the outside, so that the light emitted from the front surface of the LED chip 84 is refracted to the periphery more, the light-emitting angle of the light-emitting unit is increased, and the maximum light-emitting angle of the light-emitting unit can reach 180°.

In some examples of this embodiment, the package of the LED bracket 8 forming a bowl portion may be, but is not limited to, a transparent bracket; that is, the LED bracket 8 may be made of a transparent material, such as transparent resin, transparent thermoplastic such as PPA (Polyphthalamide), and transparent thermosetting plastic such as EMC (Epoxy Molding Compound), so that the light emitted from the LED chip 84 directly passes through the LED bracket 8 to reach the outside, and then the light-emitting angle of the light-emitting unit is further increased; it should be understood that in some examples, the LED bracket 8 may be made of a material that is not transparent, for example, epoxy resins (EPs), high-temperature-resistant nylon (PPA plastic), polyphthalamide (PPA), poly(1,4-cyclohexylenedimethylene terephthalate) (PCT), liquid crystal polymer (LCP), sheet molding compound (SMC), epoxy molding compound (EMC), unsaturated polyester (UP) resins, polyethylene terephthalate resin (PET), polycarbonate (PC), polyhexamethylene adipamide (nylon 66), glass fiber, etc.

In some examples of this embodiment, DBRs (distributed bragg reflectors) are arranged on the LED chip 84; for example, the DBRs are plated on the front surface of the LED chip 84, so that the light emission from the front surface is reduced, and the light emission area of the side wall is increased, thereby further increasing the light-emitting angle, and then the transparent LED bracket 8 is adopted, thereby improving the light-emitting efficiency of the side wall of the light-emitting unit, and further improving the overall light-emitting efficiency.

Figure 46:
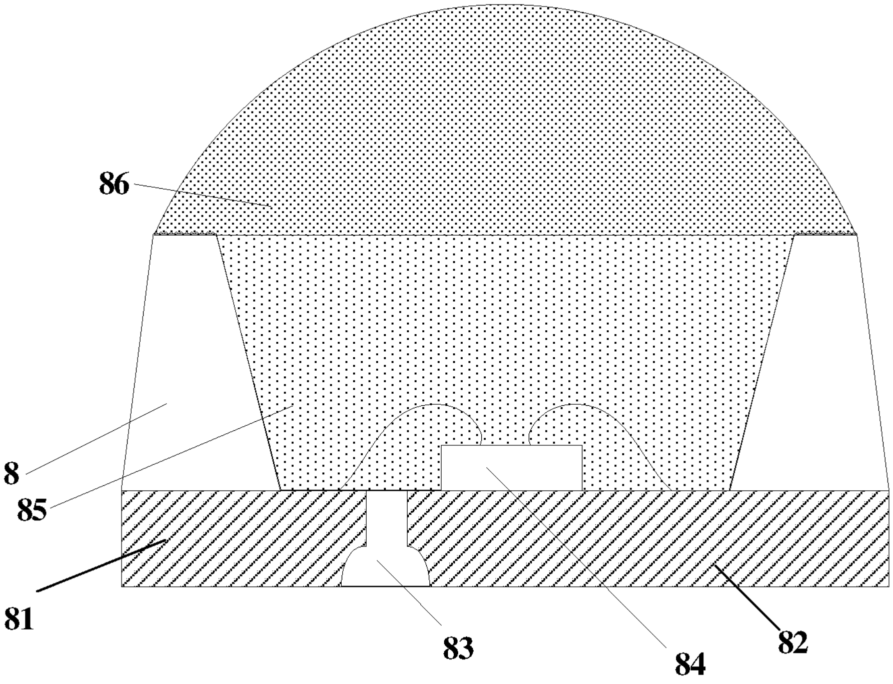
FIG. 46 is a schematic structural diagram V of a light-emitting unit according to Embodiment VII of the present application.
Figure 47:
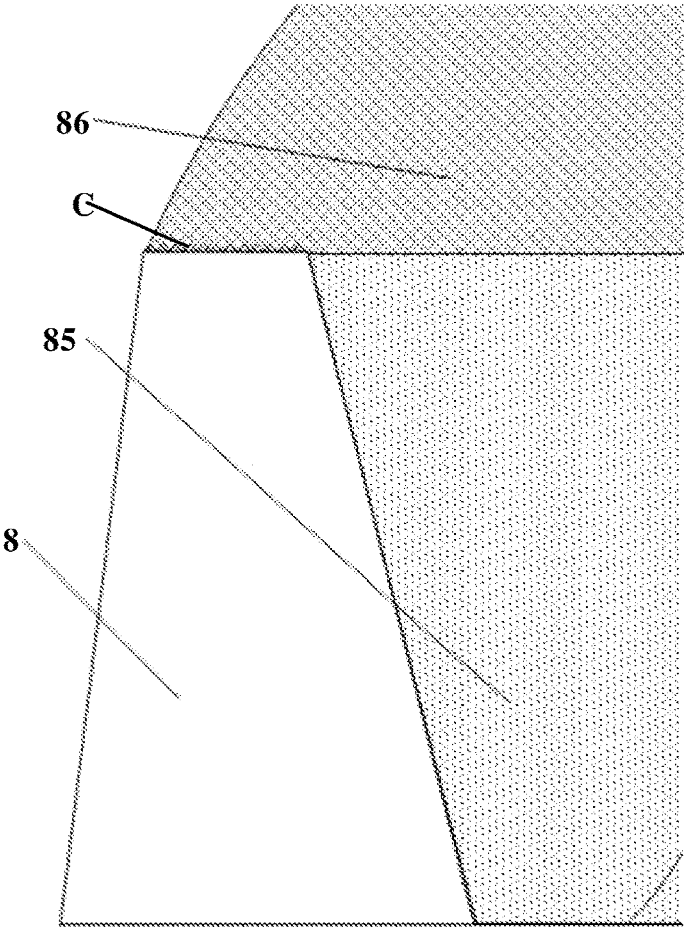
FIG. 47 is a schematic view of a saw-toothed structure on an upper surface of an LED bracket according to Embodiment VII of the present application.

In some examples of this embodiment, the upper surface of the LED bracket 8 is a sawtooth shape C, as shown in FIGS. 46 and 47, when the second packaging adhesive layer 86 is bonded to the LED bracket 8, the saw-toothed upper surface of the LED bracket 8 can enhance the bonding capacity of the second packaging adhesive layer 86 and the LED bracket 8; meanwhile, the saw-toothed upper surface of the LED bracket 8 can limit the fluidity of the second packaging adhesive layer 86, thereby achieving the purpose of controlling the formation of the second packaging adhesive layer 86.

In some examples of this embodiment, the LED chip 84 includes at least one of a red LED chip, a green LED chip, a blue LED chip, and a yellow LED chip. The configuration can be flexibly set according to application requirements, which is not described in detail herein.

In some examples of this embodiment, an insulating area 83 is further included and may be arranged as, but is not limited to, an insulating isolation strip, which is located between the anode substrate 81 and the cathode substrate 82 to isolate the anode substrate from the cathode substrate. It should be understood that the material of the insulating isolation strip may be the same as or different from that of the LED bracket 8.

Figure 48:
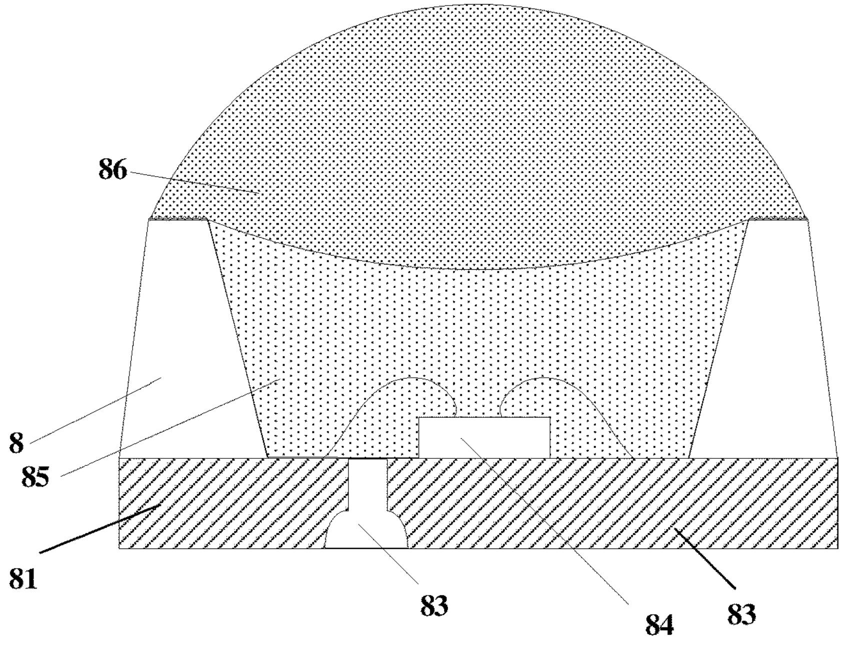
FIG. 48 is a schematic structural diagram VI of a light-emitting unit according to Embodiment VII of the present application.

To better understand, a more specific example is provided in this embodiment to explain the light-emitting unit, as shown in FIG. 48, the first packaging adhesive layer 85 wraps the LED chip 84, the upper surface of the first packaging adhesive layer 85 is flush with the upper surface of the LED bracket, the surface of the first packaging adhesive layer 85 far away from the LED chip 84 is an arc surface that is concave towards the LED chip 84, the second packaging adhesive layer 86 has a width same as the upper surface of the bowl-shaped structure and completely covers the first packaging adhesive layer 85, the surface of one side of the second packaging adhesive layer 6 close to the first packaging adhesive layer 85 protrudes towards the first packaging adhesive layer 85, and the protruding portion mates with the concave portion of the first packaging adhesive layer 85. The surface of the second packaging adhesive layer 86 far away from the LED chip 84 is in a raised spherical shape to form a convex lens shape, so that the light can be diffused to increase the light-emitting angle of the light-emitting unit.

This embodiment further provides a light-emitting assembly which may be, but is not limited to, a backlight module, including a driving circuit and the above light-emitting unit, wherein the driving circuit is connected to the light-emitting unit, and the backlight module has a larger light-emitting angle, so that the display effect of the backlight module can be improved, and fewer light-emitting units can be arranged in the same circuit board area to achieve the same or even better display effect, and the cost is lower. This embodiment further provides a display unit, which comprises the above backlight module and a back plate, wherein the driving circuit of the backlight module and the light-emitting unit are arranged on the back plate.

Embodiment VIII

This embodiment provides a light-emitting assembly, which may be, but is not limited to, a backlight module, a lighting module, etc., and comprises a circuit board and a light-emitting unit arranged on the circuit board and electrically connected to a corresponding circuit on the circuit board. The light-emitting unit in this embodiment may be the light-emitting unit shown in the above embodiments, or may be a light-emitting unit with other structures (for example, a bracket-free LED), which is not limited in this embodiment.

When the light-emitting assembly is a backlight module, the backlight module is widely applied to the foldable display screens. In the process of bending and bending recovery for multiple times of the foldable display screen of the backlight module in the prior art, a flexible printed circuit adopted by the backlight module is easy to generate relative displacement with the supporting plate on the back surface, such that a part of the backlight module cannot be effectively supported and protected. To solve the problem, an example of this embodiment provides a backlight module capable of solving the problem. A circuit board of the backlight module in this example is a flexible printed circuit, the backlight module further comprises a supporting plate and a magnetic sticker, the flexible printed circuit comprises a reinforcing plate and a substrate, the reinforcing plate is fixed onto the substrate, the supporting plate is provided with a supporting groove, and the supporting groove accommodates at least a part of the reinforcing plate; that is, the reinforcing plate can be integrally arranged in the supporting groove, or only a part of the reinforcing plate can be arranged in the supporting groove, and another part of the reinforcing plate is located outside the supporting groove. An opening end facing towards the substrate is arranged on the supporting groove, the opening end of the supporting groove is covered with the substrate, a groove bottom surface is further arranged on the supporting groove, the magnetic sticker is fixed to the groove bottom surface, the magnetic sticker is directly opposite to and parallel to the reinforcing plate, and the magnetic sticker is magnetically attracted to and mates with the reinforcing plate, which ensures that in the process of bending and bending recovery for multiple times of the backlight module, the flexible printed circuit and the supporting plate are ensured to return to the unbent state through two magnets which are magnetically attracted to each other, so that the structural stability of the backlight module is improved. For ease of understanding, this embodiment is described below in conjunction with examples illustrated in the accompanying drawings.

In one example, the thickness of the supporting plate may be set to be greater than the height of the supporting groove, after the supporting plate is arranged on the supporting groove, the top surface of the supporting plate may protrude out of the supporting groove and thus is located outside the supporting groove, such that a certain gap is formed between the flexible printed circuit and the supporting plate. The existence of the gap can provide a certain bending and deformation recovery space for the flexible printed circuit and the supporting plate in the bending process, and can also reduce the frictional force therebetween formed by contacting the same in the bending process.

Figure 49:
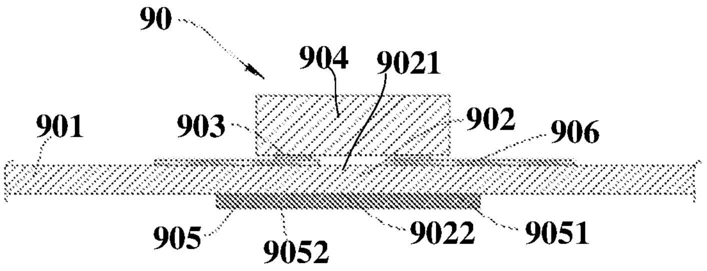
FIG. 49 is a schematic structural diagram I of a circuit board according to Embodiment VIII of the present application.
Figure 50:
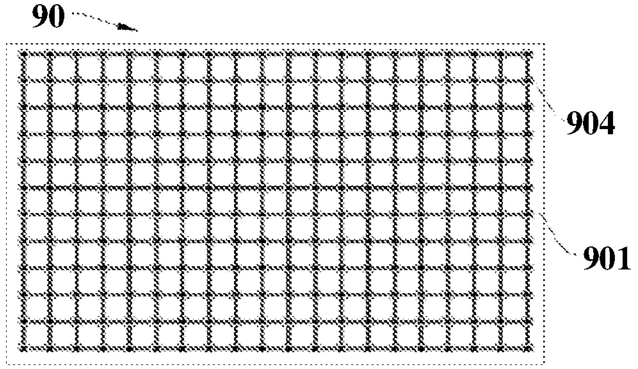
FIG. 50 is a top view of a circuit board according to Embodiment VIII of the present application.

Another example is shown in FIGS. 49 and 50, the flexible printed circuit 90 comprises a substrate 901, solder pads 903, light-emitting units 904, and a reinforcing plate 905, the substrate 901 comprises a welding part 902, the welding part 902 is provided with a first surface 9021 and a second surface 9022 opposite to the first surface 9021, the solder pads 903 are fixed to the first surface 9021, the light-emitting units 904 are fixed to the first surface 9021, pairs of pins of the light-emitting units 904 are stacked and welded to the corresponding solder pads 903, the reinforcing plate 905 is attached to and fixed to the second surface 9022 of the welding part 902, and the reinforcing plate 905 and the solder pads 903 are arranged in correspondence.

The flexible printed circuit 90 can achieve bending and conductive functions, in the prior art, the mode of fixing the light-emitting unit 904 to the flexible printed circuit 90 is that pins at two ends of a component are generally fixed to the flexible printed circuit 90, in the bending process of the flexible printed circuit 90, bending resistance of the light-emitting unit 904 is smaller than the bending force for bending the flexible printed circuit 90, and the flexible printed circuit 90 does not protect the bending resistance of the light-emitting unit 904, so that the light-emitting unit 904 is easily broken under the action of the bending force in the process of bending for multiple times. The reinforcing plate 905 in this embodiment is attached to and fixed to one side of the flexible printed circuit 90 far away from the light-emitting unit 904, the reinforcing plate 905 is made of a hard material, the reinforcing plate 905 is attached to the welding part 902, such that the bending force for bending the flexible printed circuit 90 is transmitted to the reinforcing plate 905, the internal stress of the reinforcing plate 905 is used to offset the bending force for bending the flexible printed circuit 90, the welding part 902 will not be bent, the light-emitting unit 904 is fixed to the first surface 9021, and the light-emitting unit 904 and the reinforcing plate 905 are arranged in correspondence, and then the light-emitting unit 904 located on the first surface 9021 will not be broken. The reinforcing plate 905 can reinforce the hardness of the welding part 902, such that the light-emitting unit 904 fixed to the welding part 902 is prevented from being subjected to the bending force, and then the light-emitting unit 904 is not damaged along with the bending of the flexible printed circuit 90.

The flexible printed circuit 90 comprises a conductive layer 906, the conductive layer 906 is arranged on the first surface 9021, and the conductive layer 906 is capable of conducting the light-emitting units 904 arranged in an array. The conductive layer 906 serves to lead out the electrodes of the light-emitting units 904, and in this embodiment, the conductive layer 906 may be made of tin, where tin can perform a good conductive function and can easily weld and fix the solder pads 903 and the substrate 901. However, the material may be replaced with other conductive materials such as silver, copper, aluminum, and gold.

In some examples of this embodiment, the reinforcing plate 905 may be made of a magnetic material, which is advantageous in that the external device is provided with a corresponding metal material, and when the flexible printed circuit 90 is mounted on the external device, the reinforcing plate 905 has a magnetic attraction force without using conventional screws or gluing mounting method, and the flexible printed circuit 90 can be directly mounted on the supporting plate 912. Compared with the traditional mounting mode, the reinforcing plate 905 has the advantages of convenient mounting, simple process, material saving, no need of adding other fixing accessories, and further reduction of the production cost.

When the flexible printed circuit 90 in this embodiment is applied to a foldable screen, the characteristics of the foldable screen require certain telescopic characteristics, and the flexible printed circuit 90 is guaranteed not to be damaged. By means of a conventional glue fixing mode, the flexible printed circuit 90 is fixed to the supporting plate, when the flexible printed circuit 90 is bent or folded, the welding part 902 may receive great tensile force, and then probably causes circuit breakage of the flexible printed circuit 90. However, in this embodiment, a magnetic material is used as the reinforcing plate 905, the reinforcing plate 905 is fixed to the supporting plate 912 by magnetic attraction, and a plurality of welding parts 902 are all fixed with the supporting plate 912 by magnetic attraction, and when the screen is bent or folded, because the reinforcing plate 905 is fixed by means of a magnetic attraction mode, compared with the glue fixing mode, the magnetic attraction mode has a good buffering effect, and can also protect the flexible printed circuit 90.

Figure 51:
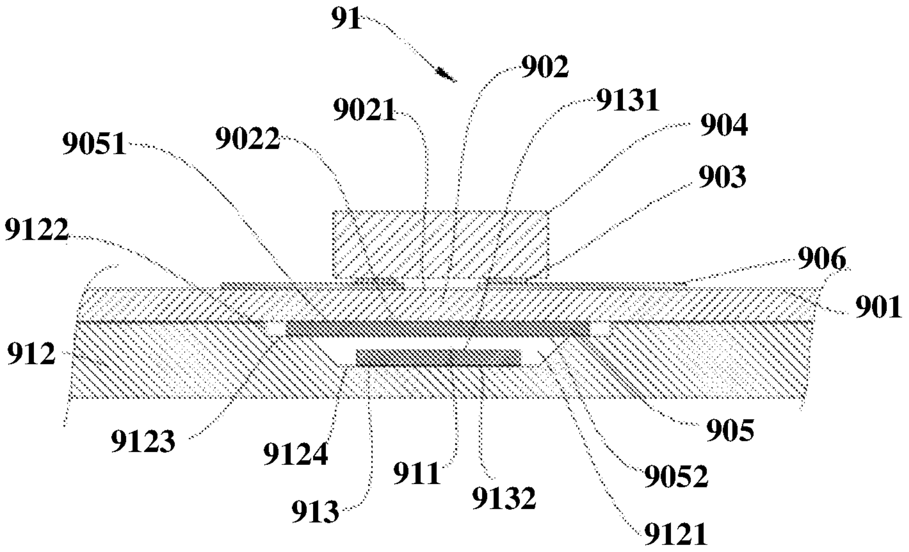
FIG. 51 is a schematic structural diagram of a light-emitting assembly according to Embodiment VIII of the present application.

Referring to FIG. 51, the present application further provides a light-emitting assembly, which may be a backlight module 91, the backlight module 91 comprises a flexible printed circuit 90, a supporting plate 912 and a magnetic sticker 913, wherein the flexible printed circuit 90 comprises a reinforcing plate 905 and a substrate 901, the reinforcing plate 905 is fixed to the substrate 901, the supporting plate 912 is provided with a supporting groove 9121, the supporting groove 9121 accommodates at least a part of the reinforcing plate 905, the supporting groove 9121 is provided with an opening end facing towards the substrate 901, the opening end of the supporting groove 9121 is covered with the substrate 901, the supporting groove 9121 is further provided with a groove bottom surface 9124, the magnetic sticker 913 is fixed to the groove bottom surface 9124, the magnetic sticker 913 is directly opposite to and parallel to the reinforcing plate 905, and the magnetic sticker 913 is magnetically attracted to and mates with the reinforcing plate 905. The supporting plate 912 is used for fixing the flexible printed circuit 90, and in the prior art, the supporting plate 912 is directly attached to and fixed to the flexible printed circuit 90, so that the supporting plate 912, when applied to a foldable screen or a curved screen, may easily cause the flexible printed circuit 90 to break, resulting in great hidden dangers to the quality of products. In this embodiment, the supporting plate 912 is provided with a plurality of supporting grooves 9121, the plurality of supporting grooves 9121 are arranged corresponding to a plurality of welding parts 902 of the flexible printed circuit 90, and the groove bottom surfaces 9124 of the supporting grooves 9121 are parallel to the second surface 9022. The flexible printed circuit 90 is correspondingly mounted on the supporting plate 912, the magnetic sticker 913 is made of a material with a magnetic substance, in this embodiment, the magnetic sticker 913 may adopt a magnet, one surface of the magnetic sticker 913 facing towards the reinforcing plate 905 is opposite to a magnetic pole of the reinforcing plate 905; namely, an N pole of the magnetic sticker 913 faces towards an S pole of the reinforcing plate 905, or an S pole of the magnetic sticker 913 faces towards an N pole of the reinforcing plate 905, one surface of the magnetic sticker 913 facing away from the reinforcing plate 905 is attached to and fixed to the groove bottom surface 9124, and attractive magnetic force exists between the magnetic sticker 913 and the reinforcing plate 905, so that the flexible printed circuit 90 is fixed to the supporting plate 912. In one embodiment, the magnetic sticker 913 is fixed to the supporting plate 912, the reinforcing plate 905 is fixed to the light-emitting unit 904, the reinforcing plate 905 and the magnetic sticker 913 are fixed by magnetic attraction, and the reinforcing plate 905 and the magnetic sticker 913 are attached to each other. The reinforcing plate 905 is fixed to the magnetic sticker 913, such that the fixing of relative position between the light-emitting unit 904 and the supporting plate 912 is achieved, and the structural stability of the product is improved.

Referring to FIG. 51, a distance exists between the magnetic sticker 913 and the reinforcing plate 905. The side walls of the supporting groove 9121 have groove side surfaces 9122 close to a notch thereof, and flitch surfaces 9123 connected to the groove side surfaces 9122 and located between the notch and the groove bottom surfaces of the supporting groove 9121, as shown in the figure, the flitch surfaces 9123 are formed into step surfaces in this example, a distance exists between each flitch surface 9123 and the groove bottom surface 9124, gaps exist between the reinforcing plate 905 and the groove side surfaces 9122, and the reinforcing plate 905 is attached to the flitch surfaces 9123. Mutual attraction exists between the supporting plate 912, the reinforcing plate 905 and the magnetic sticker 913, when the supporting plate 912 is bent, the flexible printed circuit 90 receives a deviating force, the flexible printed circuit 90 tends to move relative to the supporting plate 912, at this moment, magnetic attraction may produce partial magnetic attraction that is used for resisting the deviating force, along with the increase of the bending degree of the supporting plate 912, the deviating force that the flexible printed circuit 90 receives is also greater, and when the deviating force that the flexible printed circuit 90 receives is greater than the partial magnetic attraction between the flexible printed circuit 90 and the magnetic sticker 913, the flexible printed circuit 90 is staggered with the supporting plate 912.

When the bending action of the backlight module 91 ends and the backlight module 91 returns to flatness, partial magnetic attraction exists between the magnetic sticker 913 and the reinforcing plate 905, which guides the light-emitting unit 904 and the supporting plate 912 to return to be directly opposite to each other. Therefore, the magnetic attraction between the magnetic sticker 913 and the reinforcing plate 905 plays a positive role in guiding the light-emitting unit 904 and the supporting plate 912. Compared with the traditional technology, as the supporting plate 912 in this embodiment is provided with the supporting groove 9121 corresponding to the welding part 902, and additionally, the magnetic sticker 913 is accommodated in the supporting groove 9121, this embodiment is more environment-friendly, and this process of encapsulation process is no longer needed, which reduces the production cost. In addition, the flexible printed circuit 90 is fixed with the supporting plate 912 by magnetic attraction, and the flexible printed circuit 90 can be directly placed corresponding to the supporting plate 912 to complete the assembly, which simplifies the assembly process.

The function of arranging the groove side surfaces 9122 and the flitch surfaces 9123 is that when the flexible printed circuit 90 and the supporting plate 912 are staggered, the flexible printed circuit 90 can move along the plane parallel to the magnetic sticker 913, and the flitch surfaces 9123 are attached to the reinforcing plate 905; that is, the reinforcing plate 905 is located between the flexible printed circuit 90, the flitch surfaces 9123 and the groove side surfaces 9122. When the reinforcing plate 905 and the supporting plate 912 move relatively, the reinforcing plate 905 drives the flexible printed circuit 90 to move in a direction parallel to the second surface 9022, which ensures that the flexible printed circuit 90 is attached to the supporting plate 912, and thus the uneven display or the display spots of light of the foldable screen or the curved screen in the process is avoided.

In this embodiment, the reinforcing plate 905 is provided with a third surface 9051 and a fourth surface 9052, wherein the third surface 9051 is attached to the second surface 9022 of the flexible printed circuit 90, and the fourth surface 9052 directly faces towards the magnetic sticker 913; the magnetic sticker 913 is provided with a fifth surface 9131 and a sixth surface 9132, wherein the fifth surface 9131 faces towards the reinforcing plate 905, and the sixth surface 9132 is attached to the groove bottom surface 9124. In this embodiment, the area of the fifth surface 9131 is smaller than that of the fourth surface 9052, so that the magnetic range between the reinforcing plate 905 and the magnetic sticker 913 is larger, and the range in which the reinforcing plate 905 is attracted by the magnetic sticker 913 is wider. The range of relative movement between the flexible printed circuit 90 and the supporting plate 912 is also greater, thereby allowing the bending degree of the foldable screen or the curved screen to be greater.

In this embodiment, a part where the reinforcing plate 905 is attached to the flexible printed circuit 90 is a third surface 9051; that is, the area of the third surface 9051 is a protection area of the reinforcing plate 905 for the flexible printed circuit 90. Therefore, the protection of the flexible printed circuit 90 can be increased by increasing the area of the third surface 9051, but the folding of the backlight module 91 is not facilitated. In this embodiment, the protection area of the reinforcing plate 905 is directly opposite to the light-emitting unit 904; that is, the area of the third surface 9051 may correspond to the area of the solder pad 903. It is ensured that the backlight module 91 can have a good folding effect during use without affecting the protection of the light-emitting unit 904 by the reinforcing plate 905.

Figure 52:
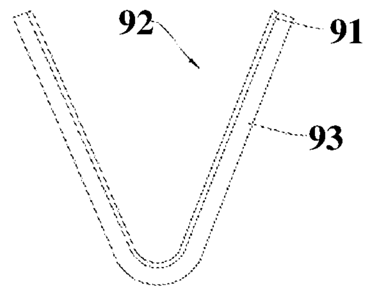
FIG. 52 is a schematic view of an electronic device in a bent state according Embodiment VIII of the present application.
Figure 53:
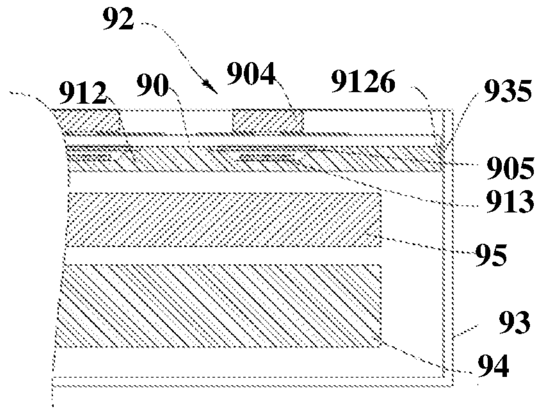
FIG. 53 is a schematic structural diagram of an electronic device according to Embodiment VIII of the present application.

This embodiment further provides an electronic device, as shown in FIGS. 52 and 53. The electronic device 92 comprises a control circuit board 95 and a housing 93, wherein the control circuit board 95 is accommodated in the housing 93, the control circuit board 95 is electrically connected to the backlight module 91, the control circuit board 95 is electrically connected to the flexible printed circuit 90, the housing 93 is provided with a first edge side 935, the supporting plate 912 is provided with a second edge side 9126 directly opposite to the first edge side 935, and the second edge side 9126 is fixed to the first edge side 935.

The electronic device 92 further comprises a driving member 94 located on one side of the control circuit board 95 far away from the flexible printed circuit 90, the driving member 94 being used for regulating a voltage applied to the electronic device 92.

In this embodiment, the electronic device 92 may be a television, a tablet computer, or a mobile phone. The backlight module 91 is mainly applied to an electronic device 92 having a foldable screen or a curved screen. For example, when the electronic device 92 is a mobile phone, the housing 93 is arranged corresponding to the folding area of the backlight module 91, and when the user uses the mobile phone, the backlight module 91 and the housing 93 are bent synchronously to unfold and fold the electronic device 92. Due to the reinforcing plate 905 in the backlight module 91, compared with the prior art, the backlight module 20 can achieve bending for multiple times and do not damage the light-emitting unit 904 on the flexible printed circuit 90, and then the service life of the backlight module 91 is increased, and the quality of the electronic device 92 is promoted.

Embodiment IX

In the process of using the light-emitting assembly, the light-emitting unit will generate a lot of heat, so that the heat dissipation of the light-emitting assembly has always been a key point in its design process. For example, in the prior art, a heat conductor is arranged on the surface of the LED chip, and a fan is used to force convection to conduct heat out of the heat conductor; or water-cooled heat exchange is implemented through a water pump, but additional power consumption will be generated in the heat dissipation process. In view of the problem, another example of this embodiment further provides a light-emitting assembly with good heat dissipation performance and energy saving, and the circuit board of the light-emitting assembly may be the flexible printed circuit in the above example, or may be a rigid circuit board, which is not limited in this example.

The light-emitting assembly in this example further comprises a driver chip and a pulsating heat pipe, wherein the circuit board comprises a lamp bead area and a driver chip area; the light-emitting unit and the driver chip are located in the lamp bead area and the driver chip area, respectively, an evaporation section of the pulsating heat pipe is arranged on the driver chip area, a working medium is arranged in the pulsating heat pipe, and the working medium in the evaporation section, when moving towards a direction far away from the driver chip, is close to a condensation section of the pulsating heat pipe; the heat in the driver chip area is taken out to the condensation section far away from the driver chip by the pulsating heat pipe for heat dissipation, and the heat exchange form of the pulsating heat pipe is passive heat exchange, so that work can be realized only by the heat generated by the driver chip area without external additional driving, so that power consumption can be saved, and the heat conduction effect is good. For ease of understanding, this embodiment is described below in conjunction with examples illustrated in the accompanying drawings.

Referring to FIG. 54 to FIG. 60, the light-emitting assembly of this embodiment comprises a circuit board 101 and a pulsating heat pipe 104.

Figure 54:
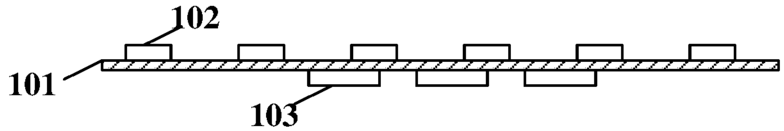
FIG. 54 is a schematic structural diagram II of a circuit board according to Embodiment IX of the present application.

The circuit board 101 comprises a lamp bead area and a driver chip area, wherein the lamp bead area is provided with a plurality of light-emitting units 102, the light-emitting units 102 may be the light-emitting units 102 shown in the above embodiments, or other light-emitting units 102 may also be adopted, for example, LED beads of LED chips or other structures may be directly adopted, these light-emitting units 102 may include, but are not limited to, light-emitting units of various colors, and the light-emitting units 102 may be arranged in an array to form an LED array, or other settings may also be adopted, which is not described in detail herein. The driver chip area may include, but is not limited to, a driver chip 103 for driving the light-emitting unit 102 to emit light, other chips may also be arranged in the driver chip area, and the driver chip 103 may include one or more chips. In some application examples, as shown in FIG. 54, the circuit board 101 is a double-sided circuit board, and comprises a lamp bead area provided with light-emitting units 102 arranged in an array, and a driver chip area, wherein the driver chip is arranged in the middle of one side of the circuit board 101, and the driver chip area and the light-emitting units 102 are arranged on two sides of the circuit board 101, respectively. The circuit board 101 is provided with a plurality of driver chips 103, and the driver chips 103 are connected to the light-emitting units 102 through circuit patterns on the circuit board 101 and drive the light-emitting units.

Figure 55:
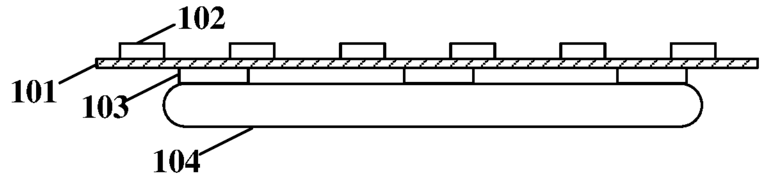
FIG. 55 is a schematic structural diagram I of a light-emitting assembly according to Embodiment IX of the present application.
Figure 56:
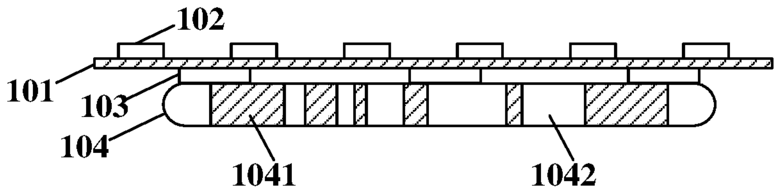
FIG. 56 is a schematic structural diagram II of a light-emitting assembly according to Embodiment IX of the present application.

As shown in FIG. 55, the light-emitting assembly of this embodiment further comprises a pulsating heat pipe 104, an evaporation section of the pulsating heat pipe 104 is arranged on the driver chip area, and the working medium in the evaporation section of the pulsating heat pipe 104 approaches the condensation section of the pulsating heat pipe 104 when moving in a direction away from the driver chip 103. The evaporation section of the pulsating heat pipe is arranged in the driver chip area, and is used for guiding out the heat emitted by devices such as the driver chip 103 on the driver chip area. It can be understood that the driver chip 103 generally generates a larger amount of heat, and the area of the light-emitting assembly where the devices such as the driver chip 103 are arranged is often an area of the light-emitting assembly having a high temperature. The condensation section of the pulsating heat pipe 104 is arranged at a position far away from the driver chip 103, so that the condensation section can be located in an area having a low temperature, and the heat conducted in the pulsating heat pipe 104 can be effectively dissipated. As shown in FIG. 56, working media composed of liquid plugs 1041 and gas plugs 1042 are randomly disposed at intervals in the pulsating heat pipe 104, and these working media are usually in a balanced static state under the condition of no heat transmission, and the stress of the working media in the static state mainly includes the pressure between the gas plugs 1042, the capillary force applied to the liquid plugs 1041, and the gravity applied to the working media. When there is external heating, the capillary force, the gravity, and the pressure generated by the heating expansion of bubbles in the gas plugs 1042 provide power for the flow of the working media. In this example, the fluid working media in the pulsating heat pipe flow to the condensation section after absorbing the redundant heat of the driver chip area in the evaporation section, and the condensation section releases the heat to the air, so that the heat dissipation effect on the driver chip area can be achieved. The application of the pulsating heat pipe enables the heat in the driver chip area to be rapidly led out, and the pulsating heat pipe does not need to receive external additional driving, so that work can be realized only by the heat generated by the driver chip area, so that power consumption can be saved, and the heat conduction effect is good.

In some application examples, the light-emitting unit 102 and the driver chip 103 are not arranged on the same surface of the circuit board 101 in a mixed manner; that is, the light-emitting unit 102 and the driver chip 103 may be located at different positions on the same surface of the circuit board 101, or at positions where the two correspond to each other or at positions where the two not correspond to each other on different surfaces of the circuit board 101; the pulsating heat pipe 104 may be directly arranged on the driver chip 103, and the size and the arrangement position thereof are adjusted without blocking the light emission of the light-emitting unit 102. In some implementation processes, the circuit board 101 with good heat conduction performance can be used, the light-emitting unit 102 and the driver chip 103 can also be arranged on the same surface of the circuit board in a mixed manner, the pulsating heat pipe can be arranged on the other surface of the circuit board, and the pulsating heat pipe can rapidly conduct and dissipate heat transferred from the driver chip to the circuit board.

Figure 57:
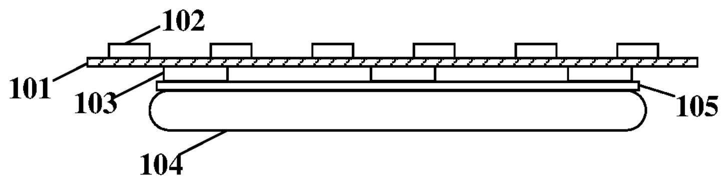
FIG. 57 is a schematic structural diagram III of a light-emitting assembly according to Embodiment IX of the present application.

In some application examples, as shown in FIG. 57, the light-emitting assembly further comprises a heat conducting sheet 105, and the heat conducting sheet 105 is arranged between the pulsating heat pipe 104 and the driver chip 103. The heat conducting sheet 105 can promote the heat of the driver chip 103 to be more uniformly conducted to the pulsating heat pipe 104, thereby improving the actual heat dissipation efficiency of the pulsating heat pipe 104. The heat conducting sheet may be a copper sheet or a heat conducting sheet made of other materials having good heat conductivity.

In some application examples, a silicone grease is arranged between the heat conducting sheet 105 and the pulsating heat pipe 104 and/or between the heat conducting sheet 105 and the driver chip 103. As an example, the silicone greases are arranged on both surfaces of the heat conducting sheet 105, one surface of the heat conducting sheet 105 is attached to the driver chip area, and is in contact with the driver chip 103 of the driver chip area, and the pulsating heat pipe 104 is attached to the other surface of the heat conducting sheet 105. In practical applications, a silicone grease may be arranged only in the area where the heat conducting sheet 105 is in contact with the driver chip 103 or the pulsating heat pipe 104, or a layer of silicone grease may be arranged on each of the two surfaces of the heat conducting sheet 105. The setting of the silicone grease cannot only assist the connection of the heat conducting sheet 105 and the pulsating heat pipe 104 and/or the driver chip 103, but also can enlarge the contact area of heat conduction through the silicone grease, thereby ensuring the efficiency of heat conduction.

In some application examples, the pulsating heat pipe 104 may comprise heat dissipation fins, the heat dissipation fins are in contact with a pipe body of the pulsating heat pipe 104, heat on the pipe body of the pulsating heat pipe 104 may be conducted to the heat dissipation fins, and the heat dissipation is performed through the heat dissipation fins. The added heat dissipation fins increase the effective area for heat dissipation of the pulsating heat pipe, such that the heat can be more efficiently dissipated into the air. The heat dissipation fins are specifically arranged on the condensation section and are in contact with the pipe body of the condensation section, such that the heat of the condensation section is quickly dissipated. This embodiment does not exclude that the heat dissipation fins may also be arranged at more positions of the pulsating heat pipe, for example, the heat dissipation fins may also be arranged from the condensation section to the heat insulation section of the pulsating heat pipe, and the heat insulation section is located between the evaporation section and the condensation section.

Figure 58:
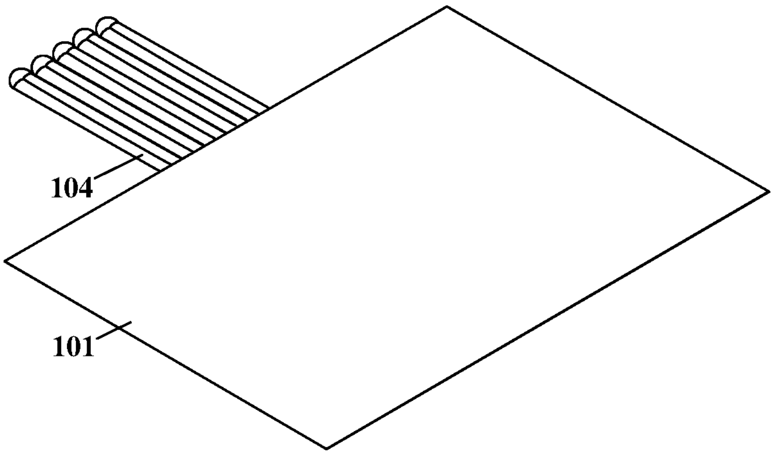
FIG. 58 is a schematic structural diagram IV of a light-emitting assembly according to Embodiment IX of the present application.
Figure 59:
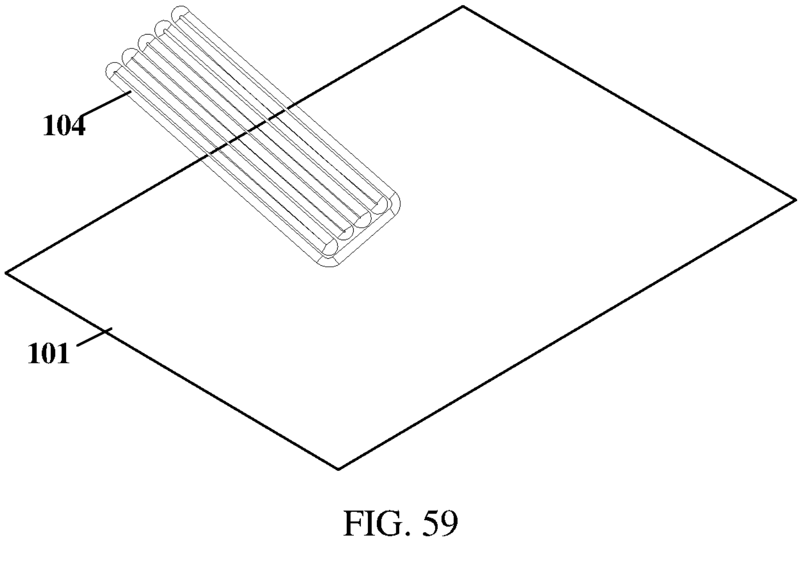
FIG. 59 is a schematic structural diagram V of a light-emitting assembly according to Embodiment IX of the present application.
Figure 60:
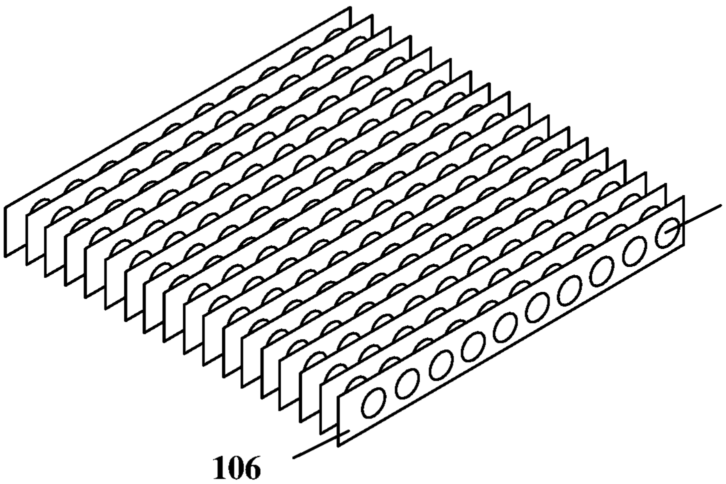
FIG. 60 is a schematic structural diagram of heat dissipation fins according to Embodiment IX of the present application.

In some application examples, the condensation section of the pulsating heat pipe may extend out of the circuit board, for example, referring to FIGS. 58 and 59, in which FIG. 58 shows one surface of the circuit board 101 where the light-emitting unit 102 is arranged, and FIG. 59 shows one surface of the circuit board 101 where the driver chip 103 is arranged (the light-emitting unit and the driver chip are not shown). The condensation section of the pulsating heat pipe 104 is arranged in an area outside the circuit board 101, and after the pulsating heat pipe 104 leads out the heat in the driver chip area of the circuit board 101, the heat is transferred to the outside of the circuit board 101 for heat dissipation, thus further ensuring the heat dissipation effect and avoiding a large amount of heat remaining on the circuit board 101. It should be noted that in practical application, although the condensation section of the pulsating heat pipe 104 extends out of the circuit board, it may still be inside the light-emitting apparatus in which the light-emitting assembly is used. Because the condensation section is outside the circuit board 101, there is also a large space around it. In these embodiments, the heat dissipation fins can be set as a structure nested in the condensation section, such as a specific structure of the heat dissipation fins 106 shown in FIG. 60. The heat dissipation fins 106 are a rectangular sheet provided with a plurality of through holes 1061, and the aperture of each through hole 1061 is consistent with the outer diameter of the pipe body of the pulsating heat pipe 104. The pipe body of the pulsating heat pipe 104 passes through these through holes 1061, such that the heat dissipation fins 106 are arranged on the pipe body of the pulsating heat pipe 104 and are in contact with the pipe body. A plurality of heat dissipation fins 106 can be arranged on the pulsating heat pipe 104, thereby improving the heat dissipation efficiency.

In some application examples, the driver chip area is provided with a plurality of driver chips 103, and each driver chip 103 is at least partially covered with the projection of the evaporation section of the pulsating heat pipe 104 on the circuit board 101. That is to say, the pulsating heat pipe 104 completely covers all the driver chips 103 in the driver chip area, and it is ensured that the heat of each driver chip 103 can be effectively conducted out. In some examples, a heat conducting sheet 105 is arranged between the pulsating heat pipe 104 and the driver chip 130, the size of the heat conducting sheet 105 may be set to be not smaller than the size of the driver chip area, the heat conducting sheet 105 also covers all the driver chips 103, and the pulsating heat pipe 104 is arranged on the other surface of the heat conducting sheet 105. Referring to FIG. 59, the pulsating heat pipe 104 of this embodiment may comprise a plurality of U-shaped pipe bodies, and the U-shaped pipe bodies communicate with one another through U-shaped elbows, such that an interior of the pulsating heat pipe 104 is circularly conducted, and the evaporation section and the condensation section are arranged at two ends of the U-shaped pipe bodies in a length direction, respectively. That is, if the fluid working medium in the pulsating heat pipe continuously flows in the same direction, it can return to the original position. These U-shaped pipe bodies are arranged in sequence, and the gaps among the U-shaped pipe bodies may be set to be small; that is, the U-shaped pipe bodies are closely arranged, such that more U-shaped pipe bodies can be set in the same area range to ensure the heat dissipation capacity. In other embodiments, the pulsating heat pipe may be replaced with other shapes, which is not described in detail herein.

The light-emitting assembly of this embodiment comprises the circuit board and the pulsation heat pipe, the evaporation section of the pulsating heat pipe is arranged in the driver chip area of the circuit board, and the condensation section is located far away from the driver chip area. The heat in the driver chip area is led out by the pulsating heat pipe and dissipated in the condensation section, so that no extra energy is needed for driving, and power is saved. The pulsating heat pipe is beneficial to manufacturing a miniaturized structure and uniform heat conduction, and can play a good role even if the arrangement space on the light-emitting assembly is small.

As can be seen from the descriptions of the above embodiments of the present application, the LED bracket, the light-emitting unit, and the light-emitting assembly provided in the above embodiments can be applied to various light-emitting fields, for example, a backlight module is manufactured to be applied to a display backlight field (which may be a backlight module of a terminal such as a television, a display, or a mobile phone), a key backlight field, a photographing field, a household lighting field, a medical lighting field, a decoration field, an automobile field, and a transportation field. When the backlight module is applied to the key backlight field, it can be used as a key backlight light source of mobile phones, calculators, keyboards and other devices with keys; when the backlight module is applied to the photographing field, it can be manufactured into a flash lamp of the camera; when the backlight module is applied to the household lighting field, it can be manufactured into a floor lamp, a table lamp, an illuminating lamp, a ceiling lamp, a down lamp, a projection lamp and the like; when the backlight module is applied to the medical lighting field, it can be manufactured into an operating lamp, a low-electromagnetic illuminating lamp and the like; when the backlight module is applied to the decoration field, it can be manufactured into various decorative lamps, such as various colored lamps, landscape illuminating lamps and advertising lamps; when the backlight module is applied to the automobile field, it can be manufactured into automobile lamps, automobile indicator lamps and the like; when the backlight module is applied to the transportation field, it can be manufactured into various traffic lamps and can also be manufactured into various street lamps. The above applications are just a few examples of this embodiment, and it should be understood that the application of the light-emitting apparatus in this embodiment is not limited to several fields in the above examples.

It should be understood that the application of the present application is not limited to the above examples, and that modifications or changes may be made by those of ordinary skill in the art based on the above description, and all such modifications and changes are intended to fall within the protection scope of the appended claims of the present application.

What is claimed is:

1. A light-emitting unit, comprising an LED chip and an LED bracket, wherein the LED bracket has a bowl portion, and the LED chip comprises a blue LED chip arranged at a bottom of the bowl portion;

the light-emitting unit further comprises a packaging layer arranged in the bowl portion, the packaging layer comprises a red medium and a green medium, the red medium and the green medium fill the bowl portion and cover the blue LED chip, the blue LED chip excites the red medium and the green medium to emit white light, and a normalized spectrogram of the white light satisfies the following conditions:

the spectrogram comprises a red waveband and a green waveband, wherein a half-wave width of the red waveband is 80 nm-100 nm, a wave crest of the red waveband is a first wave crest, a relative optical power corresponding to the first wave crest is 0.75-0.95, a wavelength corresponding to the first wave crest is 645 nm-665 nm, a half-wave width of the green waveband is 45 nm-70 nm, a wave crest of the green waveband is a second wave crest, and a wavelength corresponding to the second wave crest is 500 nm-520 nm;

wherein a relative optical power corresponding to the second wave crest is 0.4-0.7;

wherein the normalized spectrogram further comprises a blue waveband, wherein a half-wave width of the blue waveband is 15 nm-30 nm, a wave crest of the blue waveband is a third wave crest, a relative optical power corresponding to the third wave crest is 0.9-1, and a wavelength corresponding to the third wave crest is 445 nm-455 nm;

wherein the normalized spectrogram further comprises a yellow waveband, wherein a wavelength corresponding to the yellow waveband ranges from 560 nm to 590 nm, and a relative optical power of the yellow waveband is 0.05-0.25;

wherein the normalized spectrogram further comprises a cyan waveband, wherein a wavelength corresponding to the cyan waveband ranges from 460 nm to 490 nm, and a relative optical power of the cyan waveband is 0.15-0.35;

wherein the normalized spectrogram further comprises a purple waveband, wherein a wavelength corresponding to the purple waveband ranges from 350 nm to 420 nm, and a relative optical power of the purple waveband is lower than 0.1; and wherein the normalized spectrogram further comprises an infrared waveband adjacent to the red waveband, wherein a wavelength corresponding to the infrared waveband is greater than 780 nm, and a relative optical power of the infrared waveband is lower than 0.1.

2. The light-emitting unit according to claim 1, wherein the red medium is made of a material comprising nitride, the green medium is made of a material comprising β-Sialon and/or silicate, and the blue LED chip is made of a material comprising gallium nitride.

3. The light-emitting unit according to claim 1, wherein a ratio of the red medium to the green medium ranges from 1:13 to 1:4.

4. The light-emitting unit according to claim 3, wherein the packaging layer further comprises a packaging colloid filling the bowl portion, and a mixing ratio of a mixture of the red medium and the green medium to the packaging colloid ranges from 1:8 to 1:1.8.

5. The light-emitting unit according to claim 1, wherein in a CIE1931 chromaticity diagram, a distribution range of the white light on an X axis is 0.32-0.38, a distribution range of the white light on a Y axis is 0.275-0.34, and a color temperature of the white light ranges from 4000 K to 6200 K.

* * * * *